(12) United States Patent
Kim

(10) Patent No.: US 6,255,130 B1
(45) Date of Patent: Jul. 3, 2001

(54) THIN FILM TRANSISTOR ARRAY PANEL AND A METHOD FOR MANUFACTURING THE SAME

(75) Inventor: Dong-Gyu Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/391,661

(22) Filed: Sep. 7, 1999

(30) Foreign Application Priority Data

Nov. 19, 1998 (KR) .................................................. 98-49710
May 13, 1999 (KR) .................................................. 99-17189

(51) Int. Cl.[7] .................................................. H01L 21/00
(52) U.S. Cl. ........................ 438/30; 438/158; 438/159
(58) Field of Search .................... 257/72, 59; 438/30, 438/158, 159, 720, 162

(56) References Cited

U.S. PATENT DOCUMENTS

| | | | |
|---|---|---|---|
| 5,478,766 | 12/1995 | Park et al. .............................. | 437/40 |
| 5,686,976 | * 11/1997 | Nishikawa .............................. | 349/38 |
| 5,844,255 | * 12/1998 | Suzuki et al. .......................... | 257/59 |
| 5,852,488 | * 12/1998 | Takemura .............................. | 349/187 |
| 6,146,796 | * 11/2000 | Kim ........................................ | 430/30 |
| 6,156,583 | * 12/2000 | Hwang ................................... | 438/30 |
| 6,172,733 | * 1/2001 | Hong et al. ............................ | 349/152 |

* cited by examiner

Primary Examiner—Matthew Smith
Assistant Examiner—V. Yevsikov
(74) Attorney, Agent, or Firm—Howrey Simon Arnold & White

(57) ABSTRACT

Disclosed is a simplified method for manufacturing liquid crystal displays. A gate wire including a gate line, a gate pad, and a gate electrode is formed on the substrate. A gate insulating layer, a semiconductor layer, and an ohmic contact layer are sequentially deposited, and a photoresist layer is coated thereon. The photoresist layer is exposed to light through a mask and developed to form a photoresist pattern. At this time, the first portion of the photoresist pattern that is located between the source electrode and the drain electrode is thinner than the second portion that is located on the data wire, and the rest of the photoresist layer are wholly removed. The thin portion is made by controlling the exposure or by a reflow process to form a thin portion. And exposure is controlled by using a mask that has a slit, a small pattern smaller than the resolution of the exposure device, or a partially transparent layer. Next, the exposed portions of conductor layer are removed by wet etch or dry etch, thereby the ohmic contact layer thereunder is exposed. Then the exposed ohmic contact layer and the semiconductor layer thereunder are removed by dry etching along with the first portion of the photoresist layer. The residue of the photoresist layer is removed by ashing. Source/drain electrodes are separated by removing the portion of the conductor layer at the channel and the ohmic contact layer pattern thereunder. Then, the second portion of the photoresist layer is removed, and a passivation layer, a pixel electrode, a redundant gate pad, and a redundant data pad are formed.

30 Claims, 64 Drawing Sheets

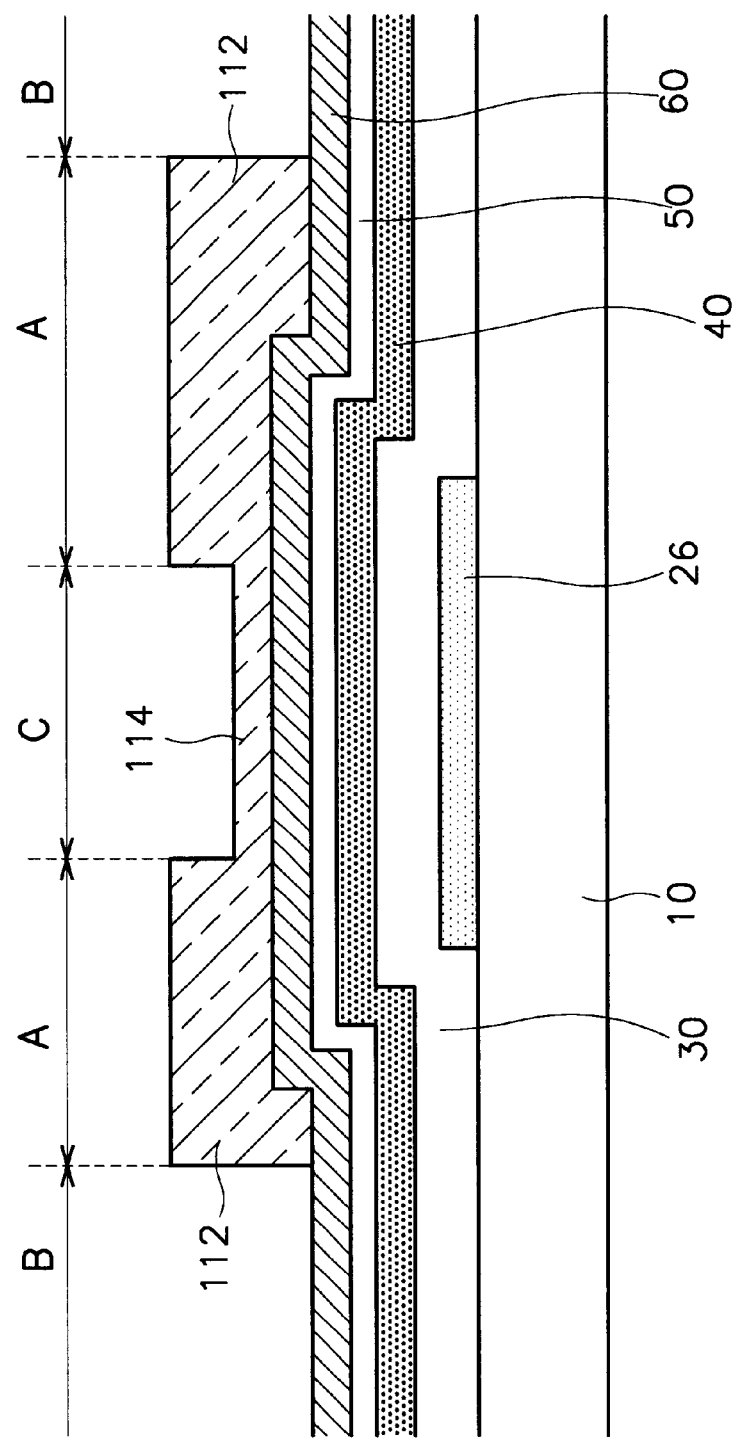

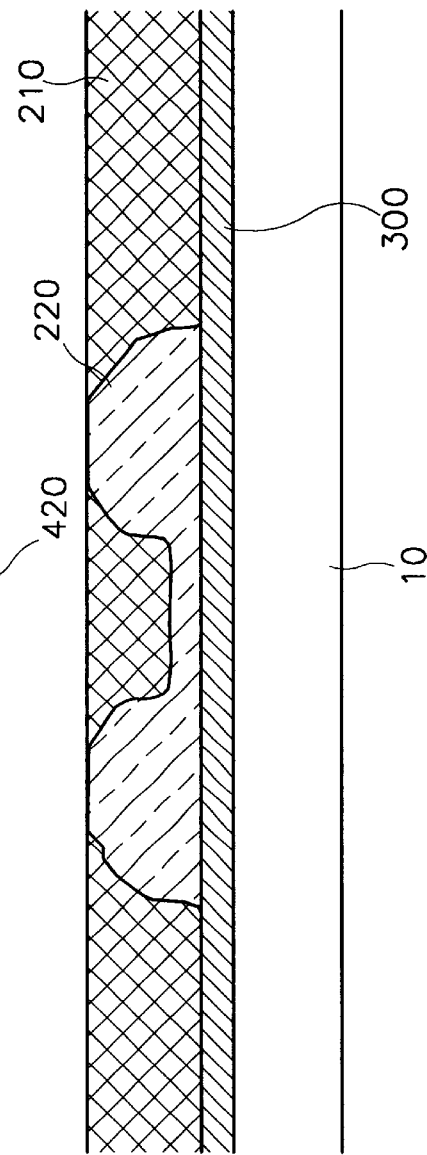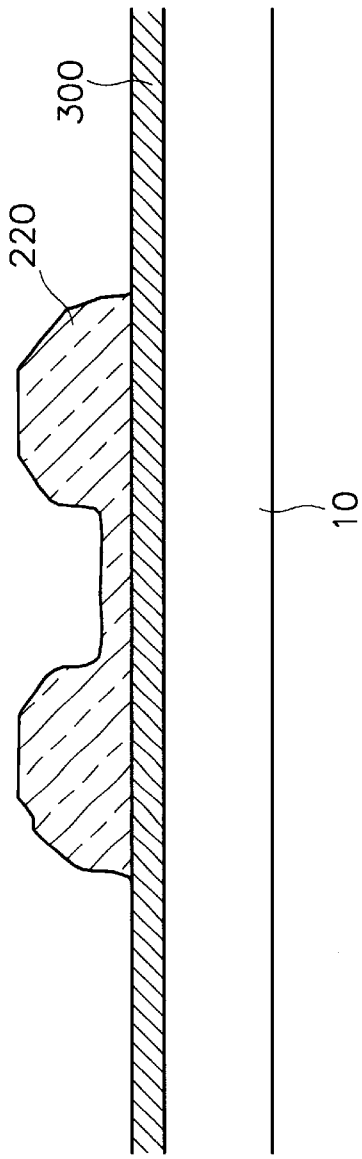

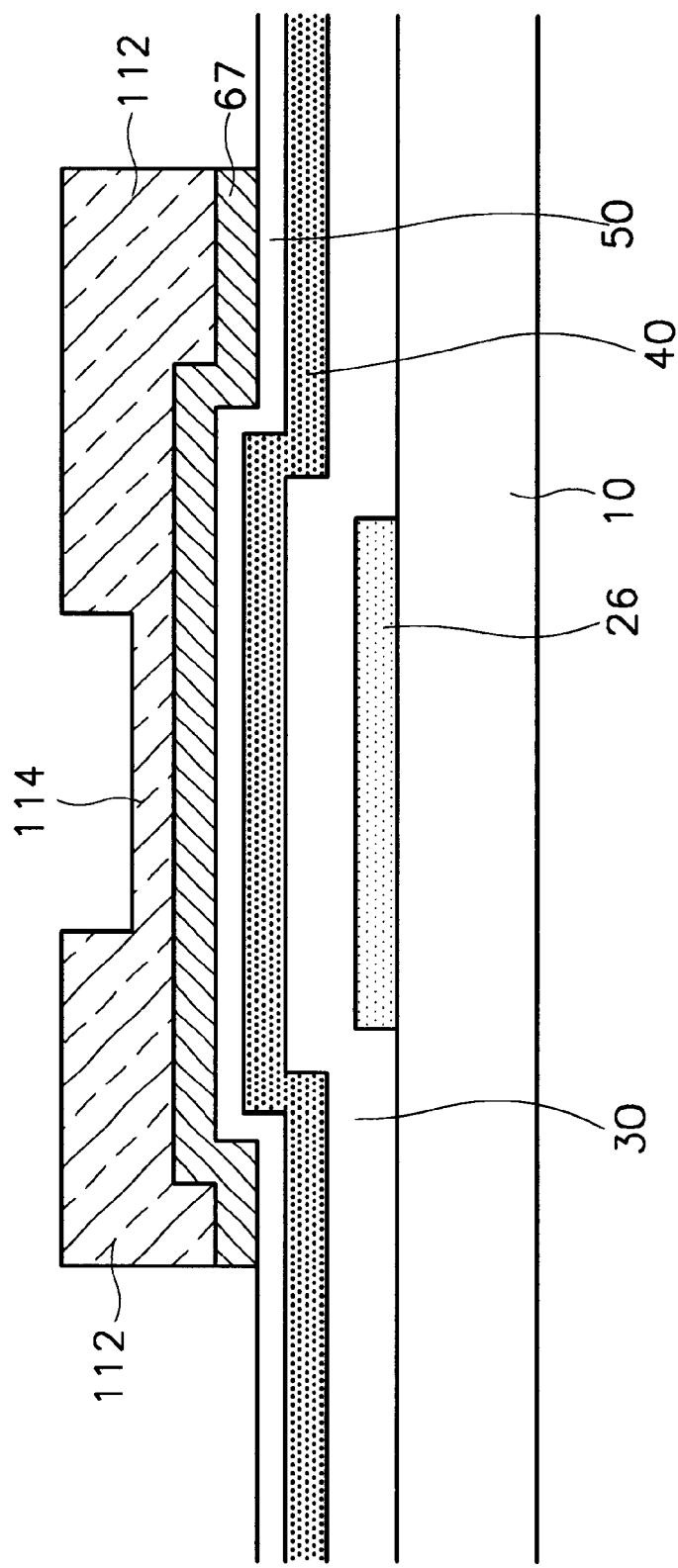

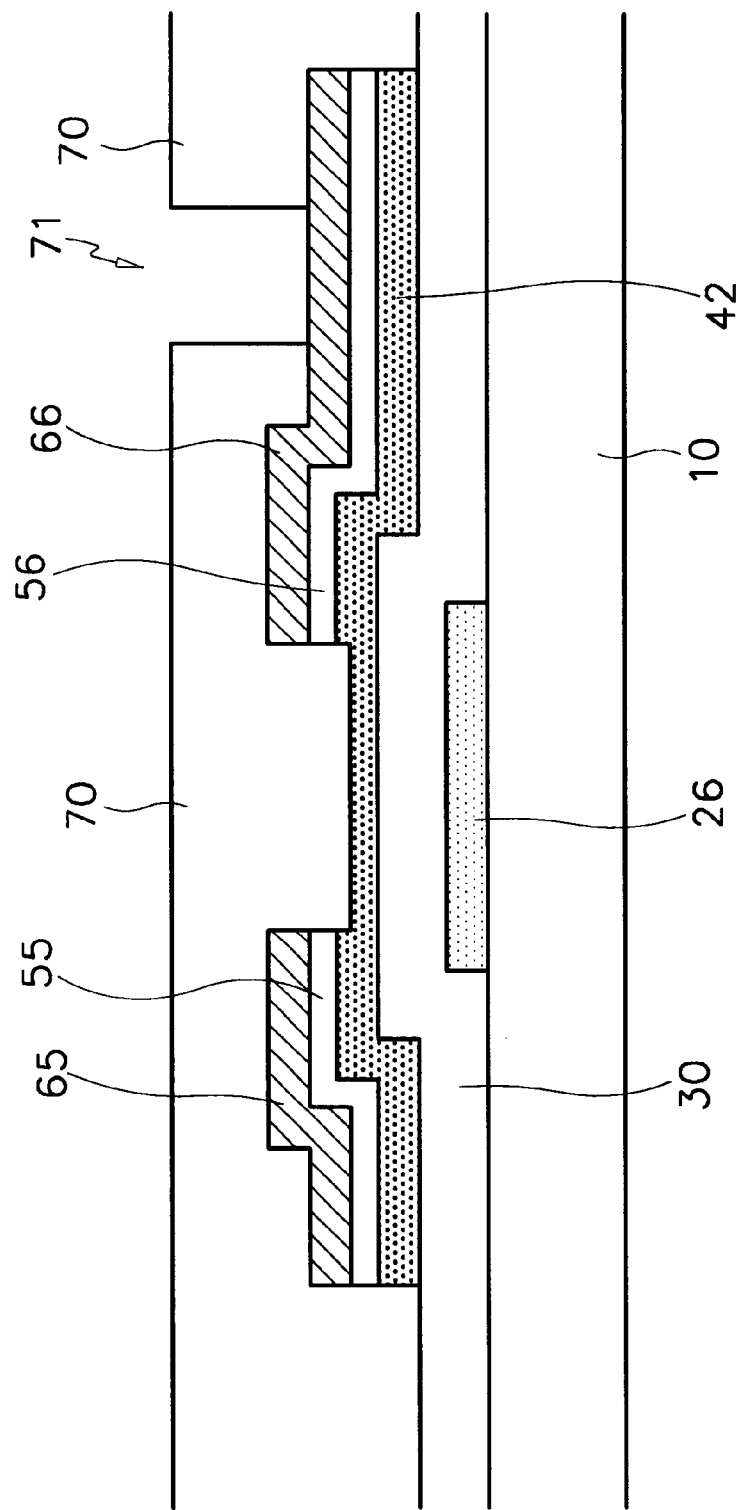

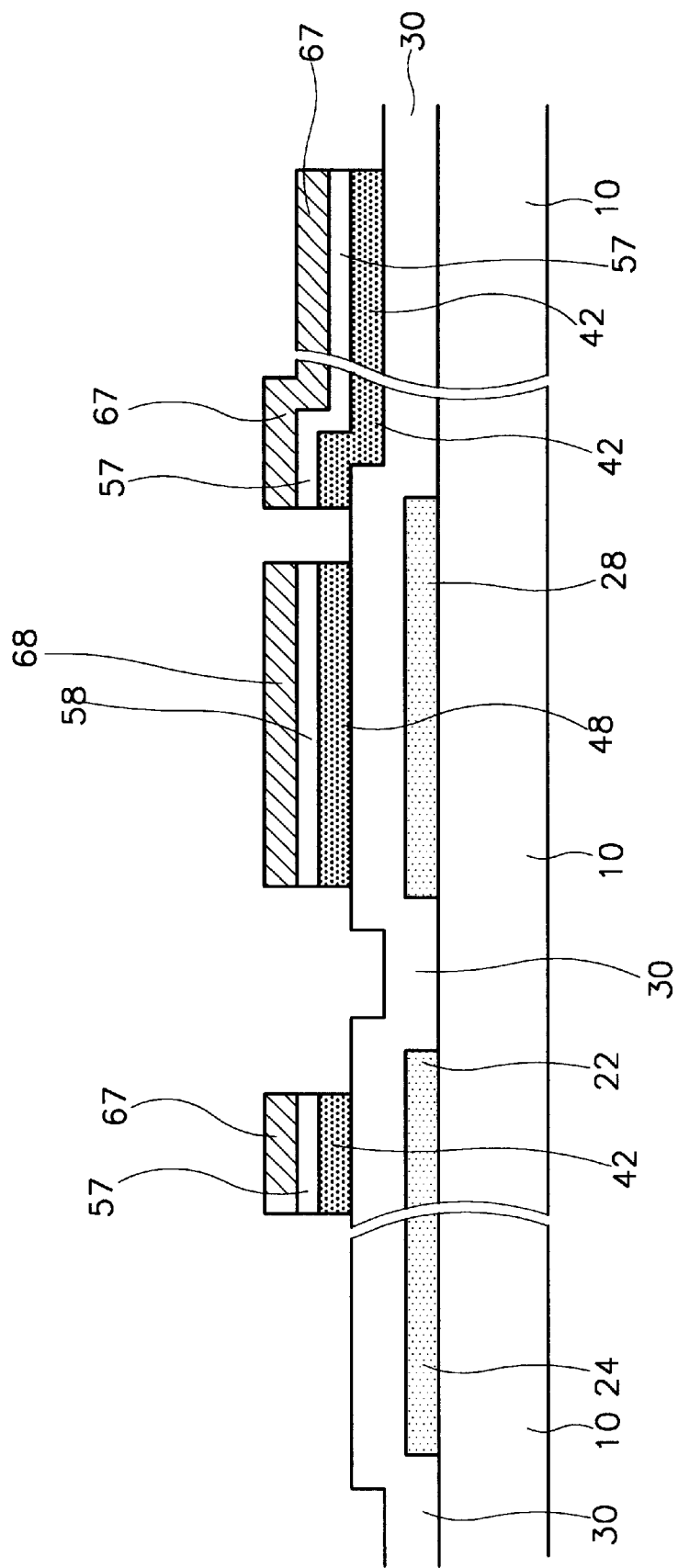

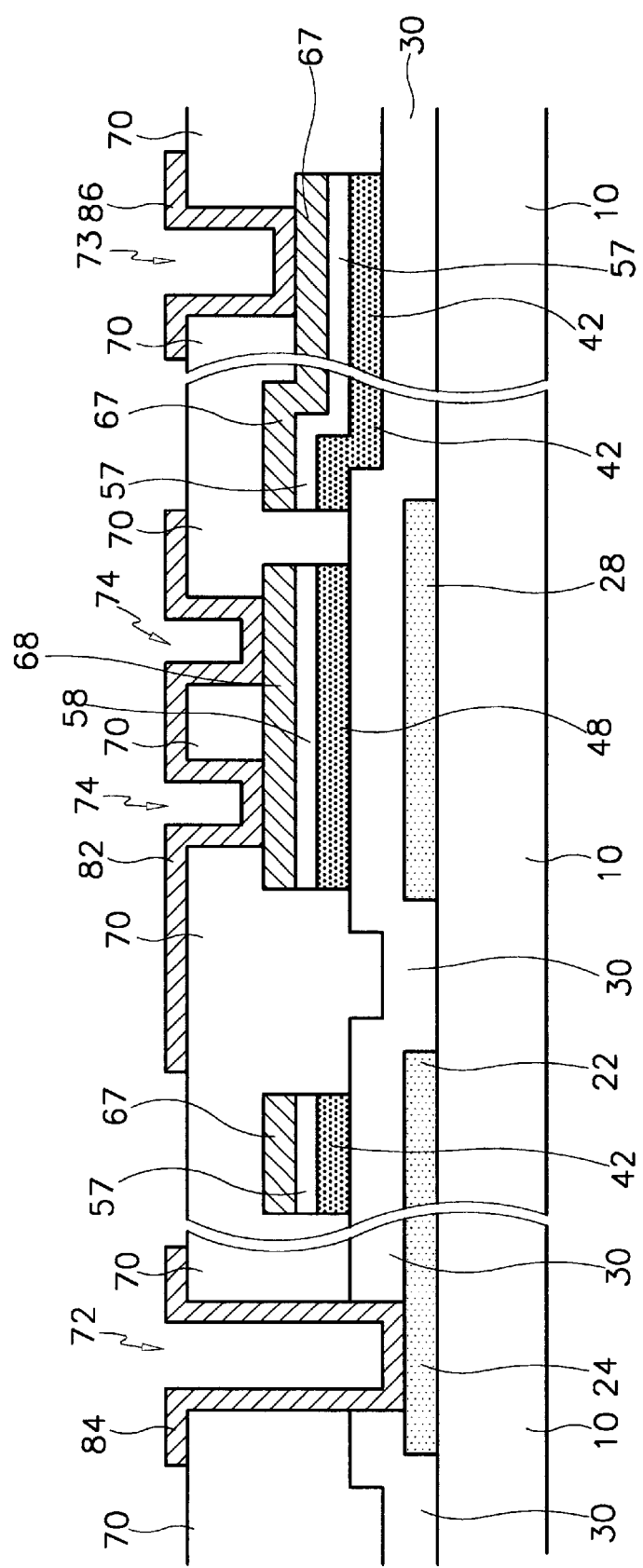

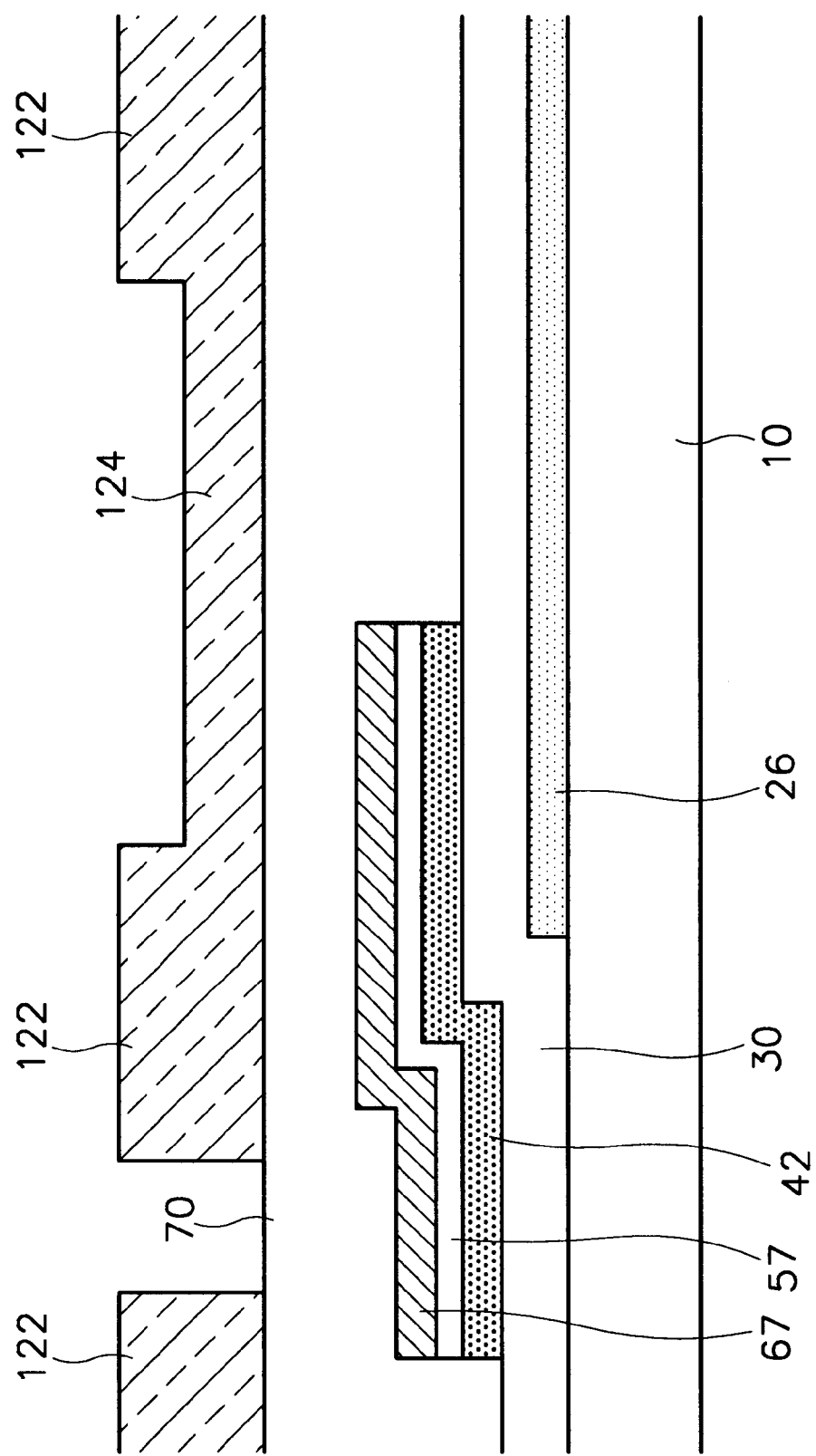

THIN FILM TRANSISTOR ARRAY PANEL
AND A METHOD FOR MANUFACTURING
THE SAME

BACKGROUND OF THE INVENTION (a) Field of the Invention

The present invention relates to a thin film transistor array panel and a method for manufacturing the same, especially to a method for manufacturing a thin film transistor array panel with less number of photolithography steps.

(b) Description of the Related Art

A liquid crystal display (LCD) is one of the most popular flat panel displays (FPDs). An LCD has two panels having electrodes for generating electric fields and a liquid crystal layer interposed therebetween.

The transmittance of incident light is controlled by the intensity of the electric field applied to the liquid crystal layer.

In the most widely used liquid crystal display, the field-generating electrodes are formed at each of the two panels, and one of the panels has switching elements such as thin film transistors.

In general, a thin film transistor array panel is manufactured by photolithography using a plurality of photomasks, and five or six photolithography steps are used. Since the photolithography process is expensive, it is desirable to reduce the number of the photolithography steps. Even though manufacturing methods using only four photolithography steps have been suggested, these methods are not easy to accomplish.

A conventional method for manufacturing a thin film transistor array panel using four photolithography steps is disclosed in U.S. Pat. No. 5,478,766 and will now be described.

First, a gate wire of aluminum or aluminum alloy is formed on a substrate using a first mask. Then, a gate insulating layer, an amorphous silicon layer, an n+ amorphous silicon layer, and a metal layer are sequentially deposited. The metal layer, the n+ amorphous silicon, and the amorphous silicon layer are patterned by using a second mask. At this time, gate pads of the gate wire are covered only with the gate insulating layer. An indium tin oxide (ITO) is deposited and patterned by using a third mask. Then the portions of the ITO layer over the gate pads are removed. After the metal layer and the underlying n+ amorphous silicon layer are patterned using the patterned ITO layer as etch mask, a passivation layer is deposited. A thin film transistor array panel is completed by patterning the passivation layer and the gate insulating layer thereunder using a fourth mask, thereby removing the portion of the passivation layer and the gate insulating layer on the gate pads.

As a result, the gate pads of aluminum or aluminum alloy are exposed in the conventional manufacturing method of photolithography using four masks. However, aluminum and aluminum alloy is vulnerable to the external physical and chemical stimuli and get easily damaged, even though they have advantages of a low resistivity. To compensate this matter, the gate lines are formed having a multiple-layered structure or made of materials that can endure physical and chemical stimuli. However, the former method complicates the manufacturing process, and the latter has a problem of a high resistivity.

SUMMARY OF THE INVENTION

It is therefore an object of the present invention to provide new methods for manufacturing a thin film transistor array panel for a liquid crystal display with a reduced number of masks.

It is another object of the present invention to protect the gate pads of the liquid crystal displays.

These and other objects are provided, according to the present invention, by forming a thinner portion of a photoresist (PR) layer than other portion between a source electrode and a drain electrode before the two electrodes are formed. Thus, the thin portion of the PR layer protects the underlying layers when some layers are etched, and is also etched along with other layers to expose its underlying layer.

According to the present invention, a gate wire including a gate line, and gate electrodes connected to the gate line, a gate insulating layer covering the gate wire, a semiconductor pattern, and an ohmic contact layer are sequentially formed on an insulating substrate. A data wire including a source electrode and a drain electrode formed of the same layer and separated from each other and a data line connected to the source electrode are formed thereover. A passivation layer pattern that covers the data wire but exposes the drain electrode at least in part is formed, and a pixel electrode connected to the drain electrode is formed. A photolithography process using a photoresist layer having three portions separates the source electrode from the drain electrode. The first portion is located between the source electrode and the drain electrode and has a first thickness, the second portion has a second thickness layer that is greater than the first thickness, and the third portion has no photoresist layer.

The photomask used in this step has three parts and is aligned as follows: the first part partially transmitting light faces the first portion of the photoresist layer; the second part that is substantially opaque faces the second portion; and the third part that is substantially transparent faces the third portion.

At this time, the first part of photomask may have a partly transparent layer or a pattern having at least an opaque portion of a size smaller than the resolution of the light source used in the exposing step.

In another way, the first part of photoresist layer may be formed by reflow of the photoresist layer.

It is preferable that the first portion of the photoresist layer has a thickness equal to or less than a half of that of the second part. In particular, it is preferable that the thickness of the second part is 1 μm~2 μm and the thickness of the first part is less than 4,000 Å.

Furthermore, the mask may comprise a fourth part having at least an opaque portion of a size that is smaller than the resolution of the light source used in the exposing step between the first part and the third part.

According to an embodiment of the present invention, a data wire, an ohmic contact layer pattern and a semiconductor pattern can be formed by one mask. A gate insulating layer, the semiconductor pattern, the ohmic contact layer pattern, and the data wire are formed through following steps. At first, a gate insulating layer, a semiconductor layer, an ohmic contact layer, and a conductive layer are deposited, and a photoresist layer is coated thereon. Then, the photoresist layer is exposed to light through a photomask, and developed to form a photoresist pattern. The above-described second portion of the photoresist pattern is located over a data wire. Next, a data wire of the conductive layer, an ohmic contact layer pattern, and a semiconductor pattern are formed by etching the portion of the conductive layer, the ohmic contact layer, and semiconductor layer under the third portion, the first portion, the portion of the conductive layer and underlying ohmic contact layer, and an upper part of the second portion. Thereafter, the photoresist pattern is removed. At this time, the data wire, the ohmic contact layer pattern, and the semiconductor pattern may be formed through three steps. At first, the portion of conductive layer under the third portion is wet or dry etched to expose the ohmic contact layer. Then, the portion of the ohmic contact layer and the semiconductor layer under the third portion are subject to dry etching together with the first part. Thereby, the portion of the gate insulating layer under the third part and the portion of the conductive layer under the first part are exposed, and a complete semiconductor pattern is obtained at the same time. Finally, the data wire and the ohmic contact layer pattern are completed by etching the portion of the conductive layer under the first part and the ohmic contact layer thereunder.

Here, if the data wire is dry etched, the ohmic contact layer pattern and the semiconductor pattern may be completed through one step by adjusting the thickness of the first portion of the photoresist pattern and the dry etch condition.

At this time, the portion between the source electrode and the drain electrode may have one shape selected from a group of shapes comprising a linear-shape, a semicircular-shape having a gentle curve, and a hook-shape having a sharp corner portion. It is desirable that the semiconductor pattern with the sharp corner portions is removed.

Furthermore, a part or all of the gate insulating layer under the third portion are removed in the manufacturing method according to the present invention.

The gate wire may have a gate pad connected to the gate line and receiving a signal from an external circuit. The data wire may have a data pad connected to the data line and receiving a signal from an external circuit. The passivation layer and the gate insulating layer together may have a first contact hole exposing the gate pad and a second contact hole exposing the data pad. At this time, a step of forming a redundant gate pad connected to gate pad through the first contact hole and the redundant data pad connected to the data pad through the second contact hole may be added. The redundant gate pad and the redundant data pad are formed of the same layer as a pixel electrode.

According to another embodiment of the present invention, a passivation layer pattern may be formed of a photoresist pattern. A gate wire may have a gate pad connected to a gate line and receiving a signal from an external circuit, and a data wire may have a data pad connected to the data line and receiving a signal from an external circuit. At this time, a gate insulating layer, a semiconductor pattern, an ohmic contact layer pattern, the data wire, the passivation pattern, and a pixel electrode are formed through following steps. First, a gate insulating layer, a semiconductor layer, an ohmic contact layer, and a conductive layer are deposited. Then, a data wire, a conductive bridge connecting a source electrode to a drain electrode, an ohmic contact layer pattern, an ohmic contact bridge under the conductive bridge, and the semiconductor pattern are formed by etching the conductive layer, the ohmic contact layer, and the semiconductor layer. A photoresist layer is coated on the whole surface and then exposed to a light source through a photomask and developed to form a the photoresist pattern such that the above described third portion is located on the gate pad, the data pad, and the drain electrode, and the second portion is located on the conductive bridge. After the gate pad is exposed by removing the portion of the gate insulating layer over the gate pad, a pixel electrode, a redundant gate pad and a redundant data pad respectively covering the drain electrode, the gate pad, and the data pad are formed on the photoresist pattern. The first portion is etched to expose the conductive bridge, and the thickness of the second portion is reduced. The conductive bridge and the underlying portion of the ohmic contact layer are removed to obtain a complete data wire and an ohmic contact layer pattern.

According to another embodiment of the present invention, a gate wire may have a gate pad connected to a gate line and receive a signal from an external circuit, a data wire may have a data pad connected to a data line and receive a signal from an external circuit. At this time, a gate insulating layer, a semiconductor pattern, an ohmic contact layer pattern, a data wire, a passivation pattern, and a pixel electrode are formed through following steps.

First, a gate insulating layer, a semiconductor layer, an ohmic contact layer and a conductive layer are deposited. Then, the data wire, a conductive bridge connecting a source electrode with a drain electrode, an ohmic contact pattern, a contact bridge under the conductive bridge, and a semiconductor pattern are formed by etching the conductive layer, the ohmic contact layer, and the semiconductor layer. After depositing an insulating layer for passivation, a photoresist layer is coated on the insulating layer and exposed to a light source through photomask and developed to from a photoresist pattern such that the above described third portion is located on the gate pad, the data pad, and the drain electrode, and the second portion is located on the conductive bridge. Next, a passivation pattern of the insulating layer is formed by etching the portion of the insulating layer and the gate insulating layer above the gate pad. At this time, the gate pad and the conductive bridge are exposed. Then, the photoresist pattern is removed. A pixel electrode, a redundant data pad, and a redundant gate pad respectively covering the drain electrode, the data pad, and the gate pad are formed on the passivation pattern. A complete data wire and an ohmic contact layer pattern is completed by etching the conductive bridge and the contact bridge.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 6B and 6C are respectively the cross-sectional views taken along the line VIB–VIB' and VIC–VIC' of FIG. 6A.

FIGS. 7A, 7B and 7C, FIGS. 8A, 8B and 8C, and FIGS. 9A, 9B and 9C are embodiments of a photoresist layer having a various thickness.

FIGS. 10B, 11B, and 12B are cross-sectional views in the next manufacturing step of FIG. 6C taken along the line IVC–IVC' of FIG. 6A.

FIGS. 13B and 13C are the cross-sectional views taken along the line XIIIB–XIIIB' and XIIIC–XIIIC' of FIG. 13A, respectively.

FIGS. 18B and 18C are the cross-sectional views taken along the line XVIIIB–XVIIIB' and XVIIIC–XVIIIC' of FIG. 18A, respectively.

FIGS. 21A and 21B are cross-sectional views taken along the line XIXB–XIXB' and XIXC–XIXC' of FIG. 19A, respectively, in the next manufacturing step of FIG. 20.

FIGS. 24B and 25B are cross-sectional views taken along the line XIXC–XIXC' of FIG. 19A in the next manufacturing steps of FIGS. 18A to FIG. 18B, according to the third embodiment of the present invention.

FIG. 36B is a cross-sectional view taken along the line XXXVIB–XXXVIB' in FIG. 36A.

FIG. 38B is a cross-sectional view taken along the line XXXVIIIB–XXXVIIIB' in FIG. 38A.

DETAILED DESCRIPTION OF THE PREFERRED EMBODIMENTS

Figure 1:
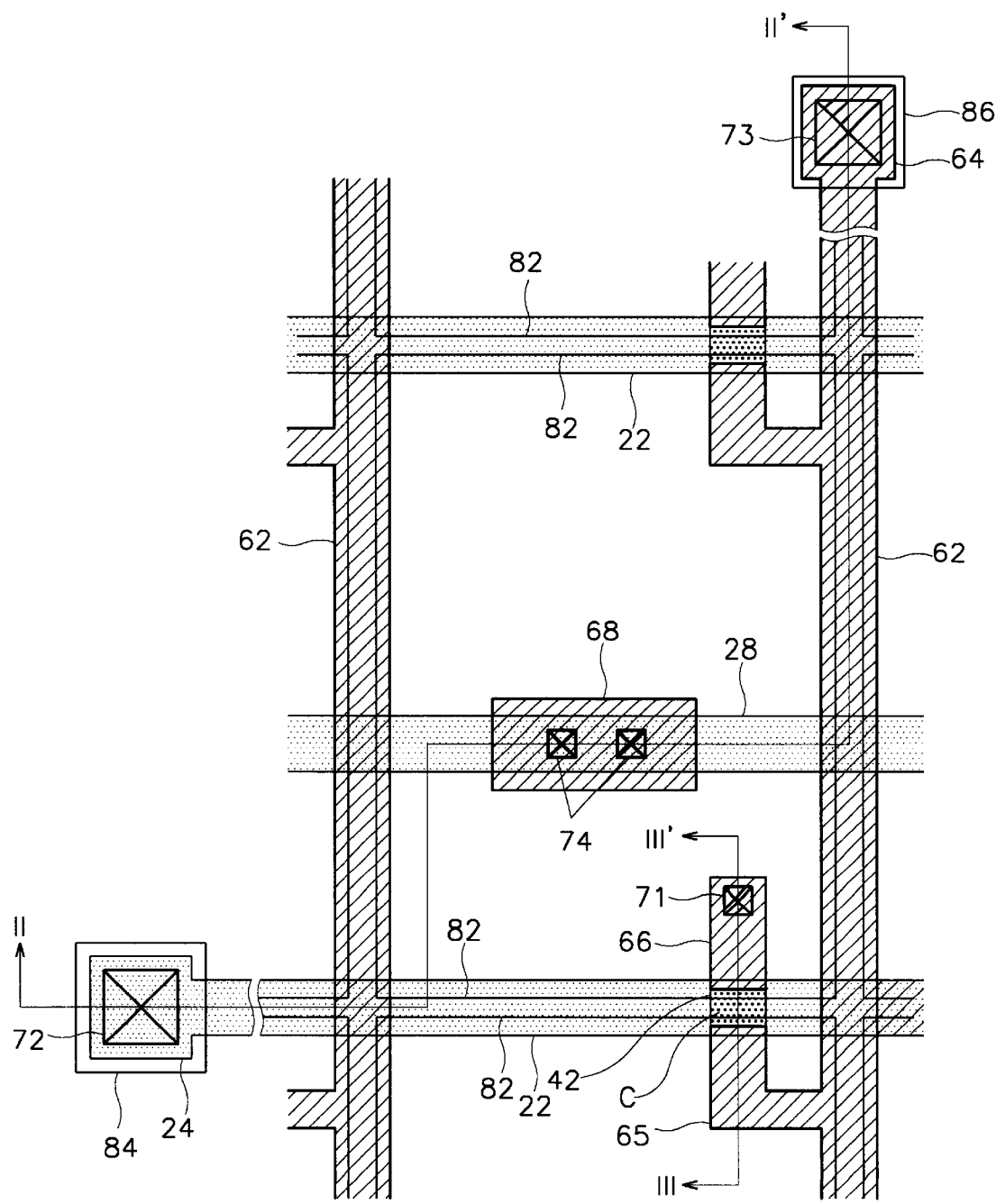
FIG. 1 is a layout view of a thin film transistor array panel for a liquid crystal display according to the first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

The manufacturing steps are reduced by forming a photoresist pattern having a thinner portion between the electrodes in the step of separating the source electrode from the drain electrode.

Figure 2:
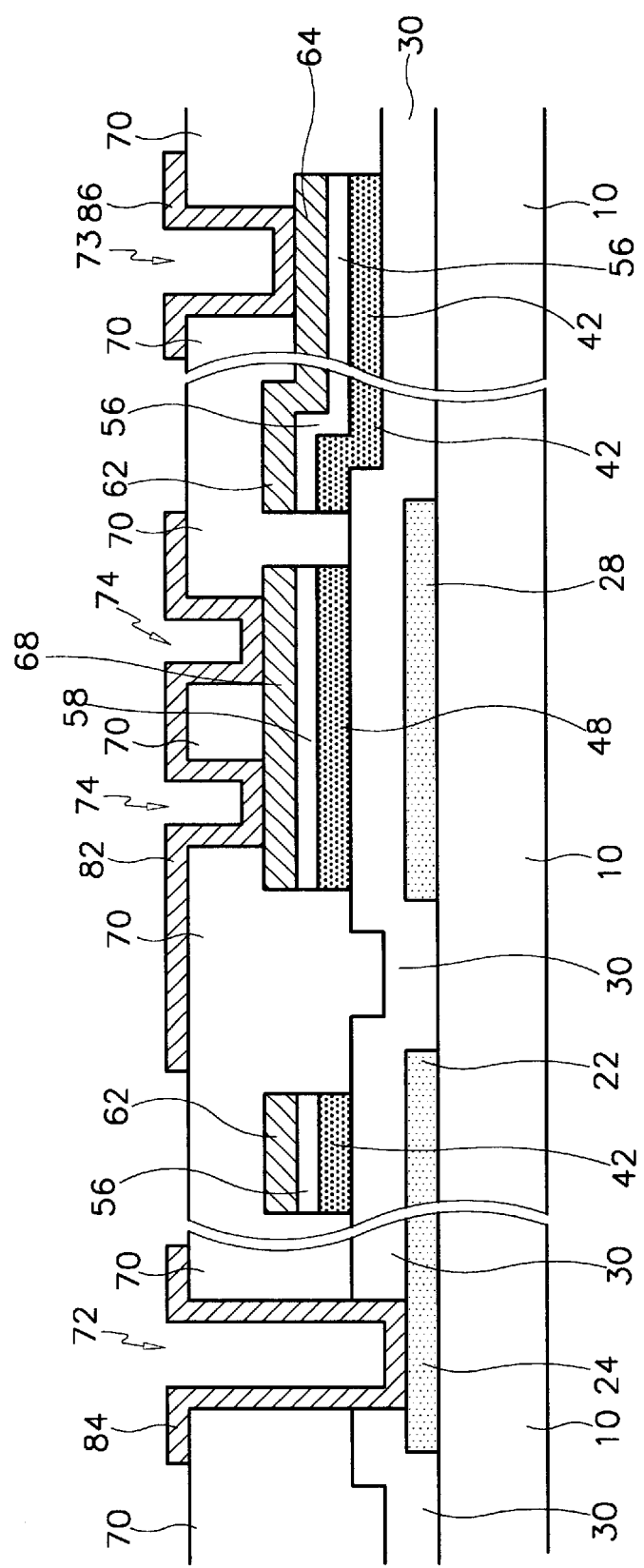
FIGS. 2 and 3 are cross-sectional views taken along lines II–II' and III–III' of FIG. 1, respectively.
Figure 3:
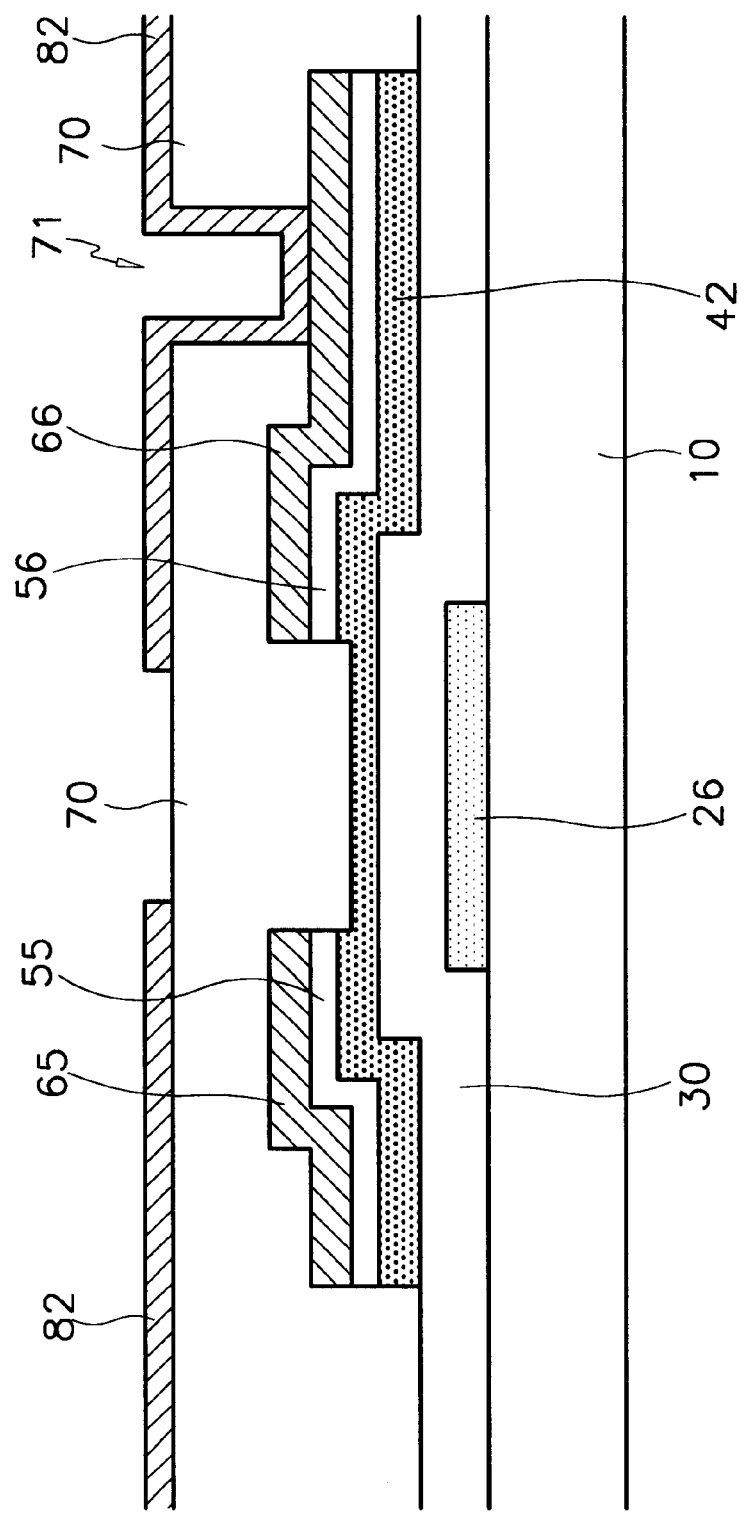

FIG. 1 is a layout view of a thin film transistor array panel for a liquid crystal display according to the first embodiment of the present invention, and FIGS. 2 and 3 are the cross-sectional views taken along lines II–II' and II–II' of FIG. 1. The structure of the thin film transistor array panel is described referring to FIGS. 1–3.

A gate wires of metal or conductive material such as aluminum (Al) or aluminum alloy, molybdenum (Mo) or molybdenum-tungsten (Mow), chromium (Cr), and tantalum (Ta) are formed on an insulating substrate 10. A gate wire includes a gate line (or scanning signal line) 22 extending in the horizontal direction in FIG. 1, a gate pad 24 connected to an end of the gate line 22 and transmitting a scanning signal from an external circuit to the gate line 22, a gate electrode 26 that is a part of a thin film transistor, and a storage electrode 28 that is parallel with the gate line 22 and receives such a voltage as a common voltage applied to a common electrode (not shown) on the upper panel of a liquid crystal display. The storage electrode 28 provides storage capacitance along with a conductor pattern 68 connected to a pixel electrode 82 that will be described later. The liquid crystal capacitor includes the pixel electrode 82 and the common electrode. The storage electrode 28 may not be provided if the storage capacitance between the pixel electrode 82 and the gate line 22 is sufficient.

The gate wire parts 22, 24, 26, and 28 may have a multiple-layered structure as well as a single-layered structure. When the gate wire parts 22, 24, 26, and 28 form a multiple-layered structure, it is preferable that one layer is made of a material having a low resistivity and another layer is made of a material having a good contact with other materials. Double layers of Cr/Al (or Al alloy) and Al/Mo are such examples.

A gate insulating layer 30 of silicon-nitride (SiNx) is formed on the gate wire parts 22, 24, 26,and 28 and covers them.

A semiconductor pattern 42 and 48 (made of semiconductor such as hydrogenated amorphous silicon) is formed on the gate insulating layer 30. An ohmic contact layer pattern 55, 56, and 58 (made of such materials as amorphous silicon heavily doped with impurities like phosphorus) is formed on the semiconductor pattern 42 and 48.

A data wire made of conductive materials such as Mo or MoW, Cr, Al or Al alloy, and Ta is formed on the ohmic contact layer pattern 55, 56 and 58. The data wire has a data line part including a data line 62 extending in the vertical direction on FIG. 1, a data pad 64 connected to an end of data line 62 and transmitting image signals from an external circuit to the data line 62 and a source electrode 65 of a thin film transistor that is a branch of data line 62. The data wire also includes a drain electrode 66 of the thin film transistor on the other side of the gate electrode 26 or the channel part C of a thin film transistor and separated from the data line parts 62, 64, 65, and a conductor pattern 68 for a storage capacitor located on the storage electrode 28. When there is no storage electrode 28, the conductor pattern 68 is not provided, either.

The data wire parts 62, 64, 65, 66, and 68 may have a multiple-layered structure like the gate wire parts 22, 24, 26, and 28. Of course, when the data wire has a multiple-layered structure, it is preferable that one layer is made of a material having a low resistivity and another is made of a material having a good contact with other materials.

The ohmic contact layer pattern 55, 56 and 58 reduces the contact resistance between the semiconductor pattern 42 and 48 and the corresponding data wire parts 62, 64, 65, 66, and 68, and has the same layout as the data wire parts 62, 64, 65, 66, and 68. In other word, a first ohmic contact layer portion 55 under the data line part has the same shape as the data line parts 62, 64, and 65, a second ohmic contact layer portion 56 under the drain electrode part has the same shape as the drain electrode 66, and a third ohmic contact layer portion 58 under the conductor pattern 68 has the same shape as the conductor pattern 68 for the storage capacitor.

The semiconductor pattern 42 and 48 has the same layout as the corresponding data wire parts 62, 64, 65, 66, and 68 and the corresponding ohmic contact layer pattern 55, 56, and except for the channel part C of the thin film transistor. Or, more concretely, the semiconductor portion 42, the conductor pattern 68, and the third ohmic contact layer portion 58 all have the same shape, but the semiconductor portion 42 has a different shape from the data wire and the ohmic contact layer pattern. In other words, the data line parts 62, 64, and 65, especially the source electrode 65 and the drain electrode 66 are separated from each other by the channel part C of thin film transistor and the portions 55 and 56 of ohmic contact layer pattern thereunder are also separated from each other, but the semiconductor portion 42 is not divided into two pieces so that it can traverse the channel of a thin film transistor.

A passivation layer 70 is formed on the data wire parts 62, 64, 65, 66, and 68. The passivation layer 70 has contact holes 71, 73, and 74 respectively exposing the drain electrode 66, the data pad 64, and the conductor pattern 68 for the storage capacitor, and also has (along with the gate insulating layer 30) another contact hole 72 exposing the gate pad 24. The passivation layer 70 can be made of an insulating material such as SiNx, acrylic organic material, other transparent photo-definable material, or other organic material.

The pixel electrode 82 that receives an image signal and generates an electric field with a common electrode of an upper panel is formed on the passivation layer 70. The pixel electrode 82 is made of a transparent conductive material such as indium tin oxide (ITO). The pixel electrode 82 is connected to the drain electrode 66 both physically and electrically through the contact hole 71, and receives the image signal from the drain electrode. Even though the aperture ratio is increased when the pixel electrode 82 overlaps the gate lines 22 or the adjacent data lines, these lines are not required to overlap the pixel electrode. The pixel electrode 82 is connected to the conductor pattern 68 for the storage capacitor through the contact hole 74 and transmits the image signal to the conductor pattern 68.

A redundant gate pad 84 and a redundant data pad 86 respectively connected to the gate pad 24 and the data pad 64 through the contact holes 72 and 73 are formed on the gate pad 24 and the data pad 64. These redundant pads 84 and 86 are optional as they protect the pads 24 and 64 from corrosion due to external air and supplement the adhesiveness between an external circuit and the pads 24 and 64.

In this embodiment, transparent ITO is taken as an example of the material of the pixel electrode 82, but an opaque-conductive material may also be used in a reflective type liquid crystal display.

A method for manufacturing a thin film transistor array panel according to an embodiment of the present invention will now be described with reference to the FIGS. 4A to 13C and FIGS. 1 to 3.

Figure 4A:
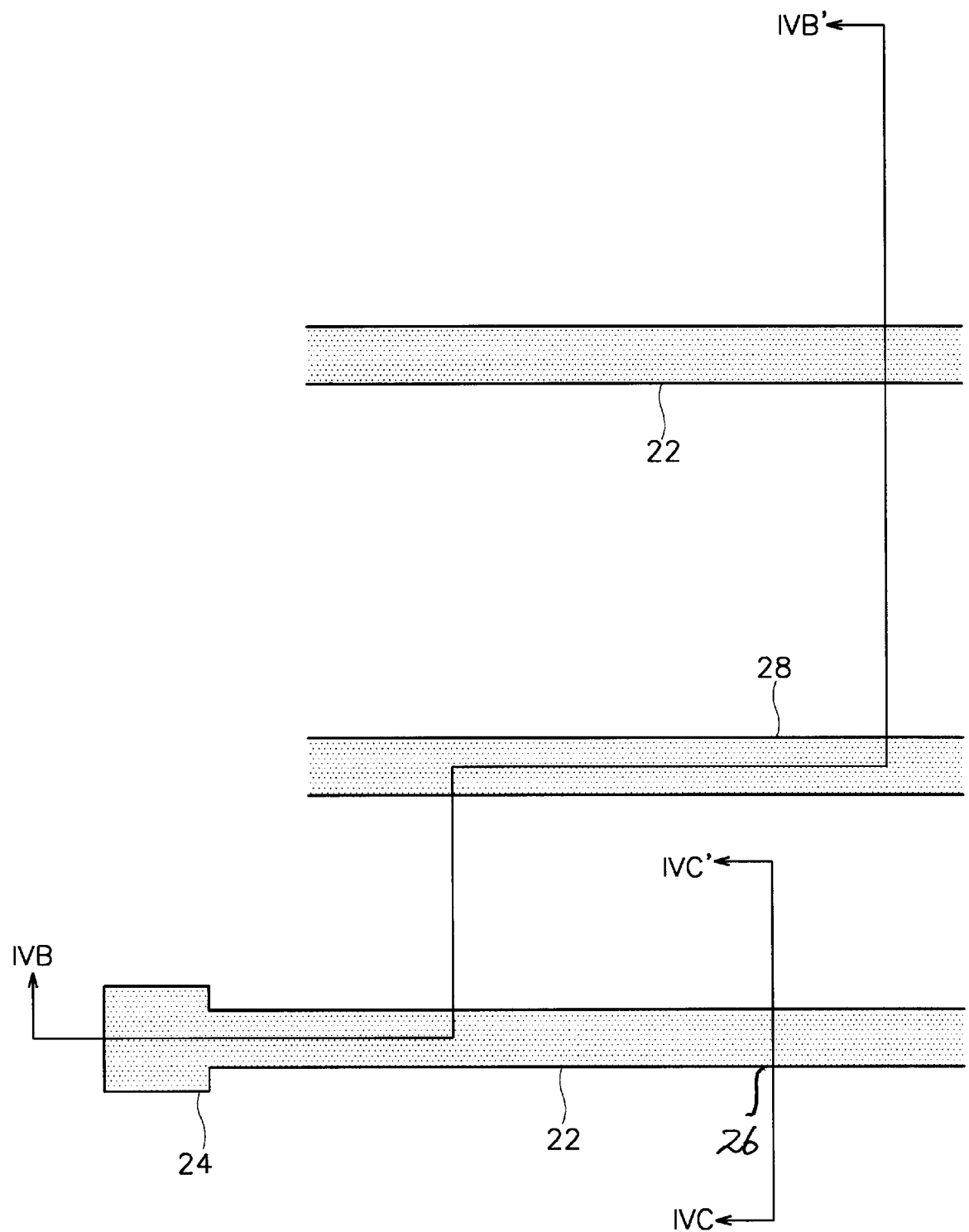
FIG. 4A is a layout view of the thin film transistor array panel according to the first embodiment of the present invention at the first manufacturing step of manufacturing method.
Figure 4B:
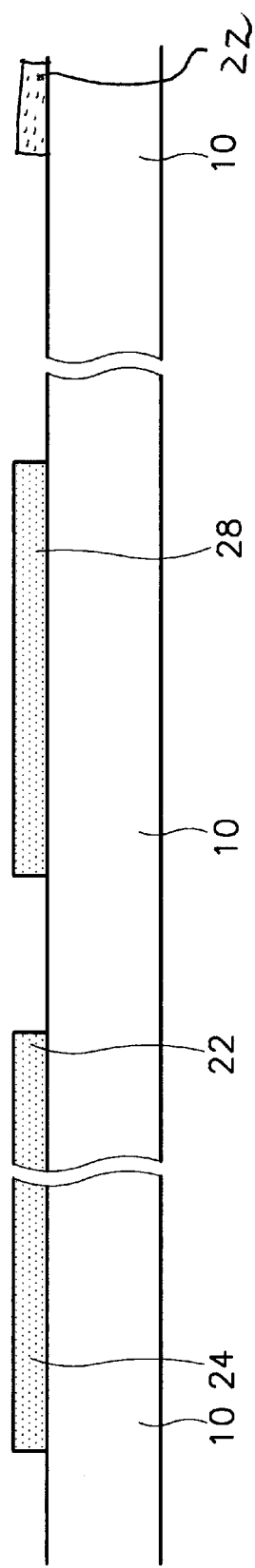
FIGS. 4B and 4C are the cross-sectional views taken along the line IVB–IVB' and IVC–IVC' of FIG. 4A.
Figure 4C:
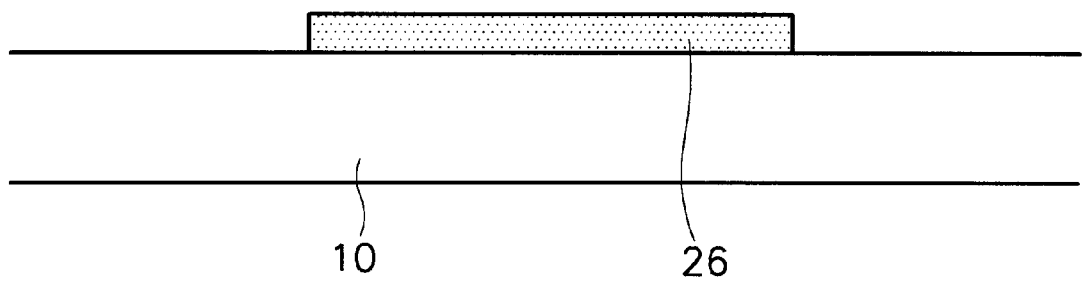

At first, as shown in FIGS. 4A to 4C, a layer of conductor, such as a metal, is deposited on a substrate 10 by such methods as sputtering to a thickness of 1,000 Å to 3,000 Å, and gate wire parts including a gate line 22, a gate pad 24, a gate electrode 26, and a storage electrode 28 are formed by dry or wet etching using a first mask.

Figure 5A:
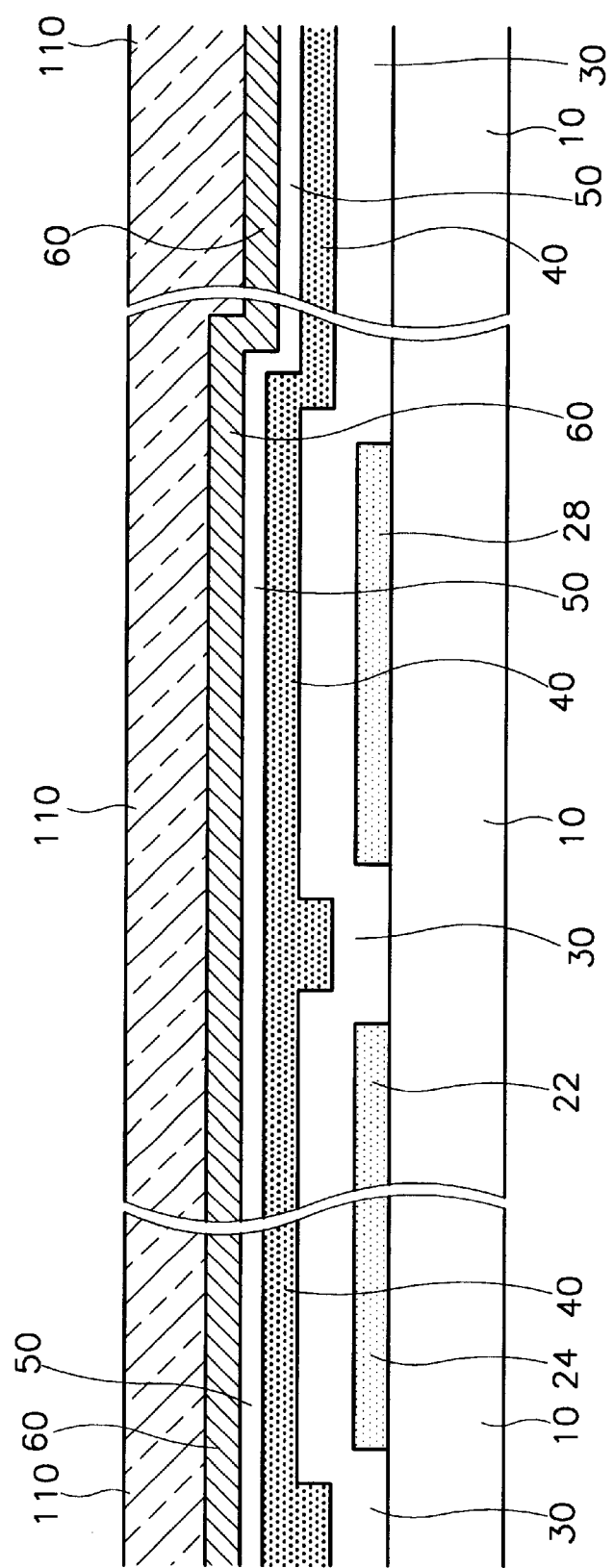
FIGS. 5A and 5B are cross-sectional views at the next manufacturing step of FIGS. 4B and 4C taken along the line IVB–IVB' and IVC–IVC' of FIG. 4A.
Figure 5B:
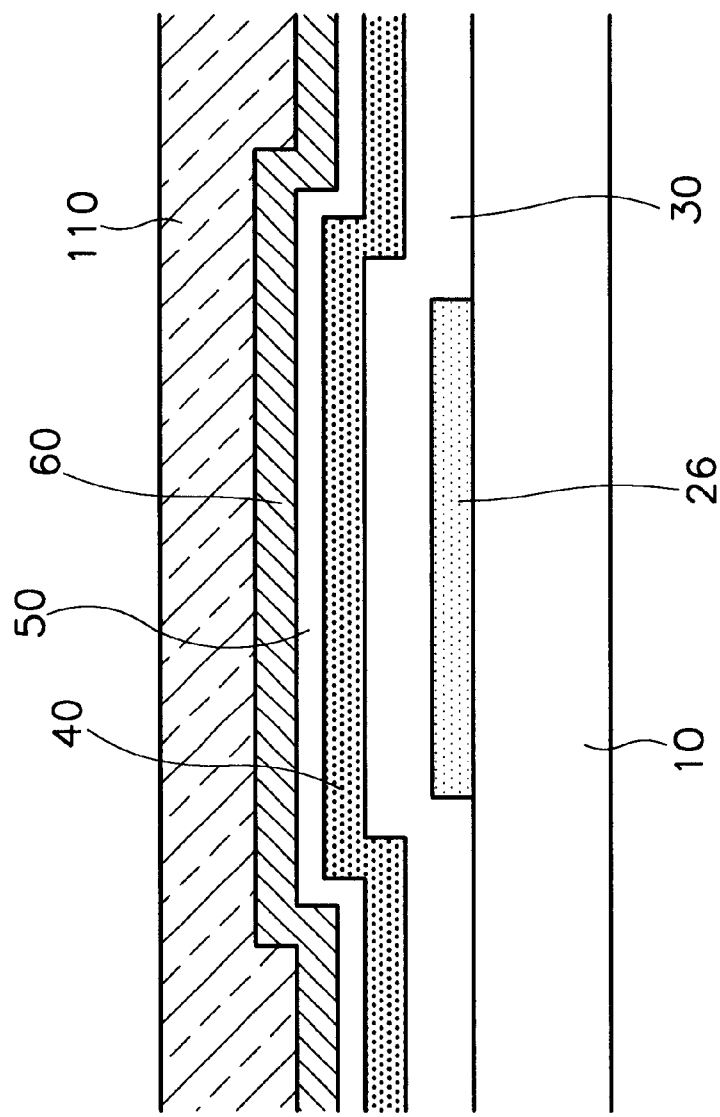

Next, as shown in FIGS. 5A and 5B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering and a photoresist layer 110 having a thickness of 1 μm to 2 μm is coated on the conductive layer 60.

Figure 6A:
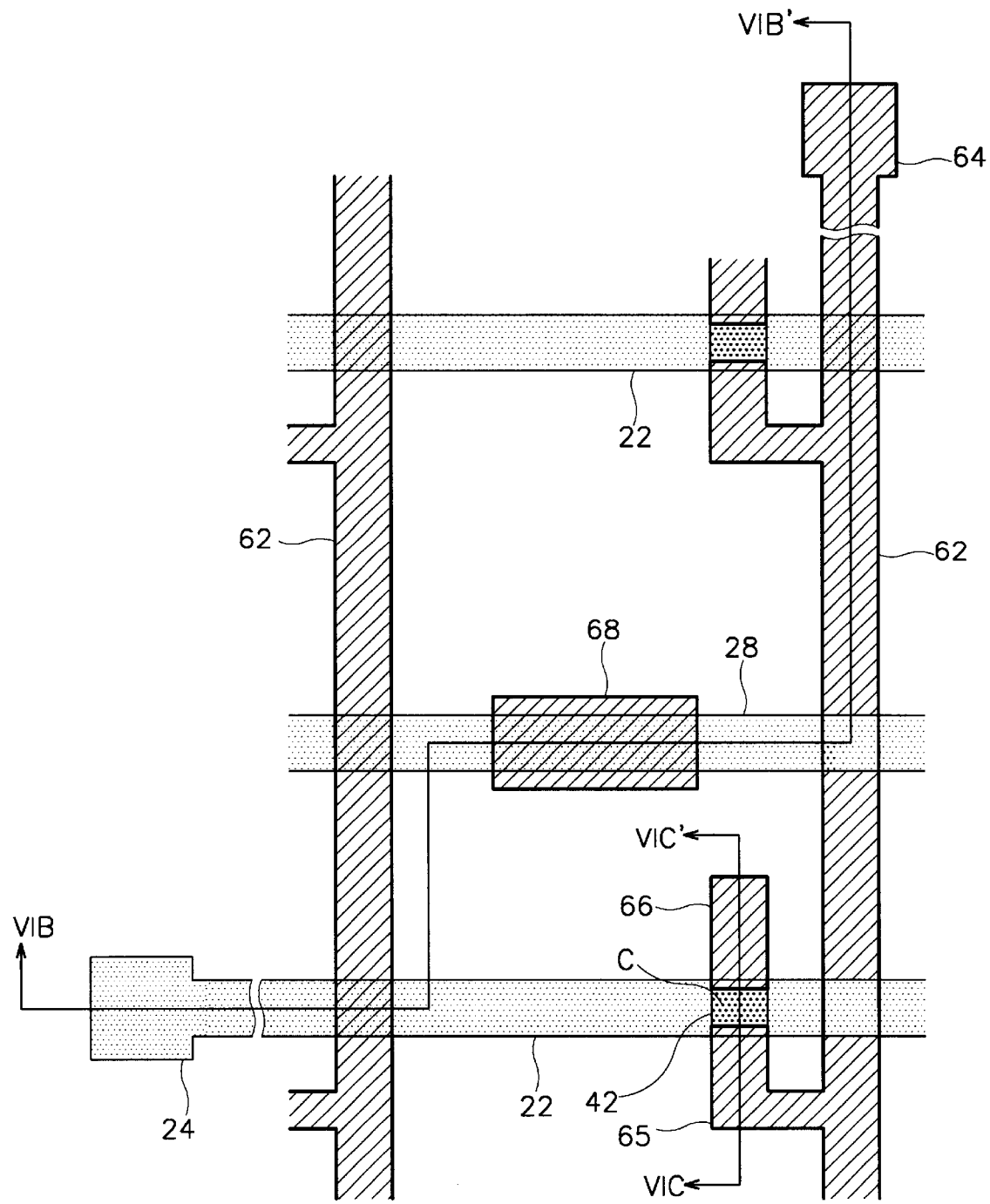
FIG. 6A is a layout view of a thin film transistor array panel in the next manufacturing step of FIGS. 5A and 5B.
Figure 6B:
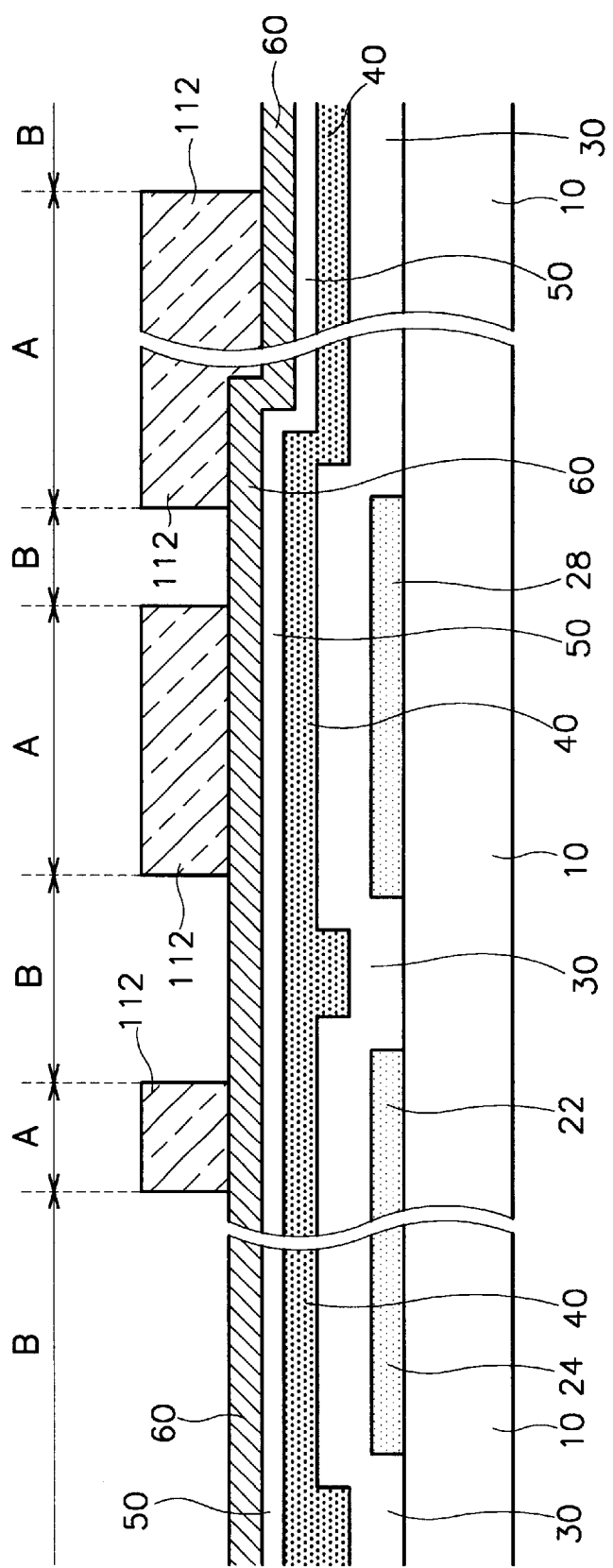

Thereafter, the photoresist layer 110 is exposed to light through a second mask and developed to form a photoresist pattern 112 and 114 as shown in FIGS. 6B and 6C. At this time, the first portion 114 of the photoresist pattern located between a source electrode 65 and a drain electrode 66, i. e., a thin film transistor channel part C as shown in FIG. 6C, is thinner than the second portion 112 of the photoresist pattern located over the data wire portion A where a data wire 62, 64, 65, 66, and 68 will be formed. And the third portion, the remaining portion of the photoresist pattern located at portion B, is thinner than the first portion. The third portion may have a certain thickness depending on the etching method. For example, the third portion has substantially no thickness when using a wet etch, but the third portion may have some thickness when using a dry etch. At this time, the thickness ratio between the first portion 114 and the second portion 112 depends on the etch condition, which will be described later. However, it is preferable that the thickness of the first portion 114 is equal to or less than a half of that of the second portion 112, or for example, less than 4,000 Å.

There are many methods to make the thickness of the photoresist layer different depending on the position, and two of the methods using a positive photoresist layer will be described.

Figure 7A:
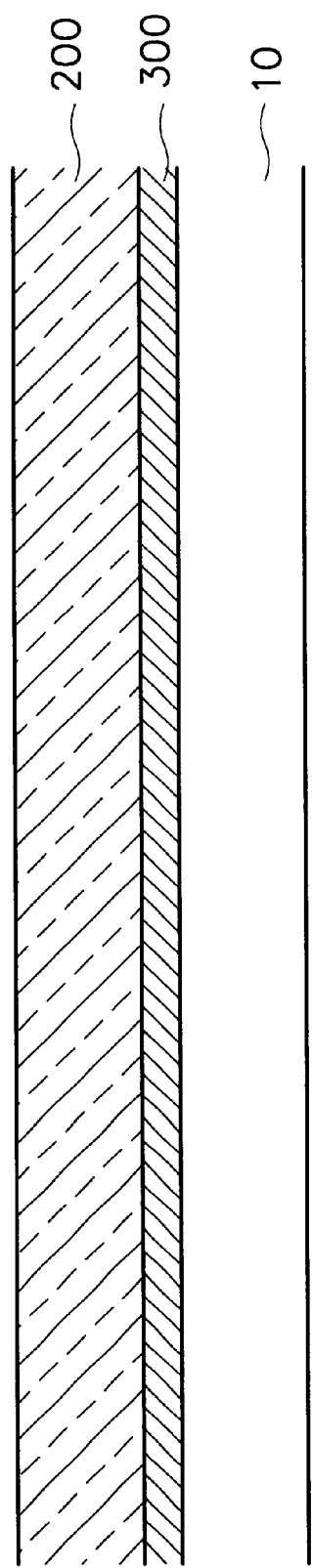

The first method, as shown in FIGS. 7A to 7C, is to control the amount of incident light by forming a pattern such as a slit or a lattice that is smaller than the resolution of the exposure device, or by providing a partly-transparent layer on the mask.

At first, as shown in FIG. 7A, a photoresist layer 200 is coated on a thin film 300 on a substrate 10. At this time, it is preferable that the photoresist layer 200 is thicker than normal to control the thickness of the photoresist layer after development.

Next, as shown in FIG. 7B, the photoresist layer 200 is exposed to light through a photomask 400 having a plurality of slits 410. At this time, the size of the slit 410 and the opaque portion 420 between the slits are smaller than the resolution of the exposure device. It is preferable that the slit size is less than half of the device resolution. In the preferred embodiment, the slit size is about 1.25 μm, when a Nikon exposure device, such as FX-501D, FX-601F, FX-604F or FX-701M, is used, of which resolution is 3 μm. On the other hand, when a Canon exposure device, such as MPA-5000 or MPA-2000 is used, the slit size is not larger than 2 μm. When a partly-transparent layer is used, a Cr layer (not shown) is coated on the mask 400 to some thickness, thereby reducing the amount of exposing light. Alternately, a mask including films having different transmittances may be used.

When the photoresist layer 200 is exposed to light, the polymers of the photoresist layer 200 are disintegrated by the light from the surface. The more lights are radiated, the more polymers are disintegrated to the bottom. The exposing continues until the bottom of the polymers directly exposed to the light, for example, the left and right ends of in FIG. 7B, are completely disintegrated. However, the polymers near the bottom of a photoresist layer 200 portion that are exposed through the slit pattern 410 are not resolved because the amount of incident light is less than that of the directly exposed portion. If the exposing time is too long, all the polymers of the photoresist layer 200 are disintegrated. Therefore, the exposure time should be closely controlled. In FIG. 7B, the reference numeral 210 indicates the disintegrated part and the numeral 220 indicates the parts that still remain intact.

Only the non-disintegrated part 220 is left after developing the photoresist layer 210 and 220, and a thinner portion of photoresist layer is left at the center that was exposed to less amount of light.

The second method to make the thickness of the photoresist layer different is reflowing. It is described with reference to the examples shown in the FIGS. 8A to 8C and FIGS. 9A to 9C.

Figure 8A:
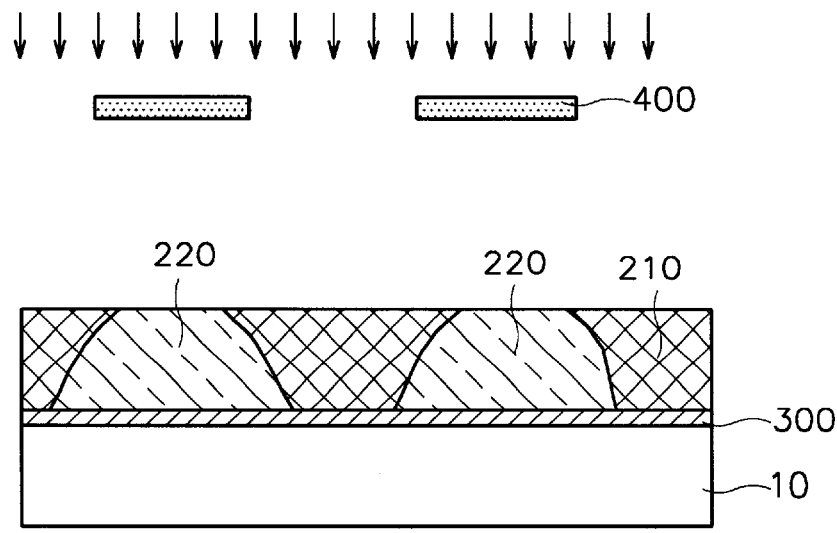
Figure 8B:
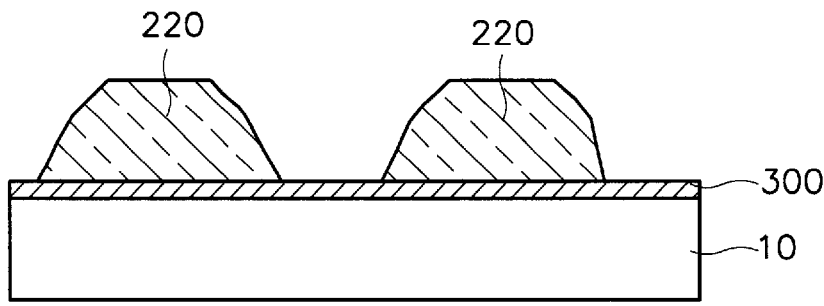
Figure 8C:
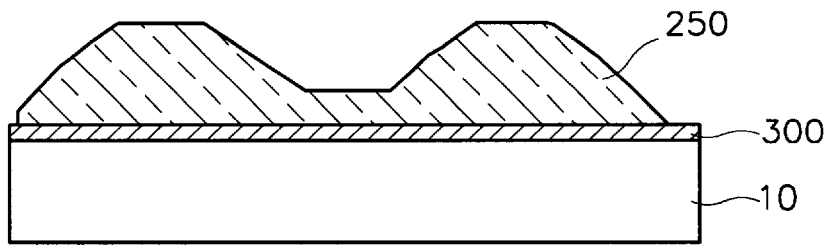

As shown in FIG. 8A, two portions 210 and 220 of a photoresist layer are exposed to light through a mask 400 having substantially transparent portions and substantially opaque portions, respectively. In portion 210, all polymers are disintegrated, and in the other portion 220, all polymers remain. Then, as shown in FIG. 8B, the photoresist layer is developed to form a photoresist pattern having a zero thickness portion and a nonzero thickness portion. However, as described above, the portion of a zero thickness may have a residual thickness of photoresist. The photoresist pattern is then subject to reflowing such that the photoresist 220 flows into the zero thickness portions to form a new photoresist pattern 250.

Figure 9A:
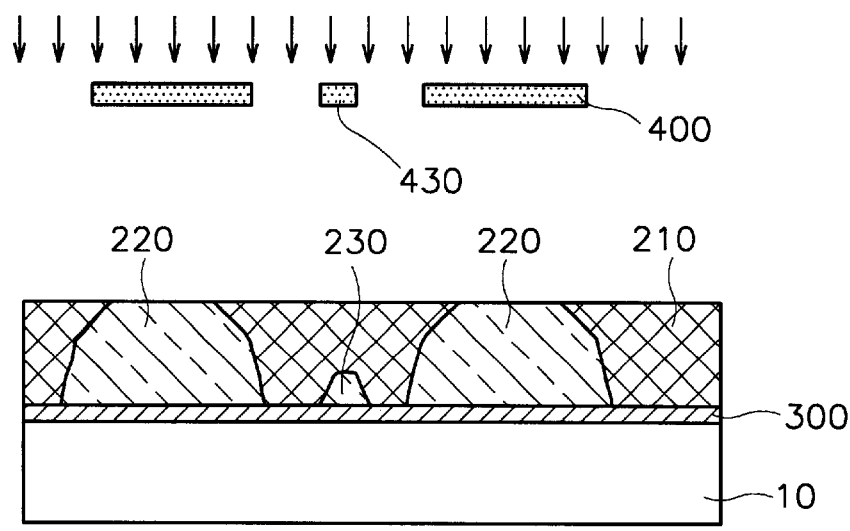
Figure 9B:
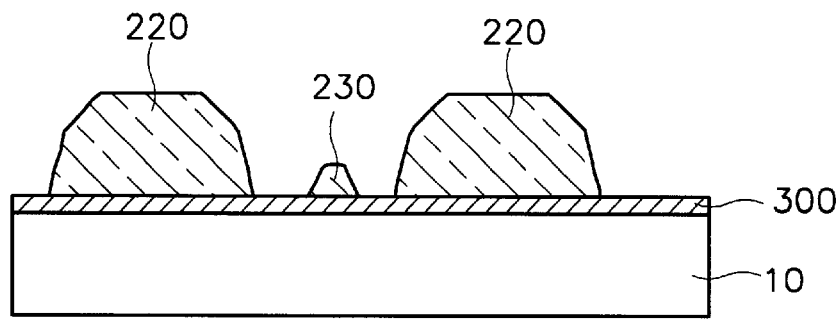
Figure 9C:
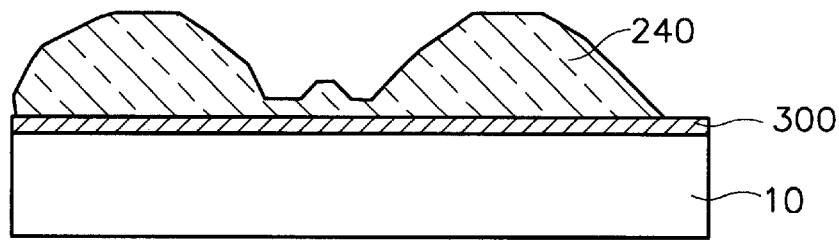

However, the zero thickness portions between the photoresist portions 220 may not be completely covered with photoresist by reflowing. To avoid such a case, an opaque pattern 430 that is smaller than the resolution of the exposure device is provided on the mask 400 as shown in FIG. 9A. Then, as shown in FIG. 9B, a thinner portion 230 is formed between the thick portions 220 after development. By reflowing this photoresist pattern, a photoresist pattern 240 having thick portions with a thin portion therebetween is formed.

Using these methods, a photoresist pattern is formed to have a different thickness at different positions.

Referring back to FIG. 6C, the photoresist pattern 114 and the underlying layers including the conductor layer 60, the ohmic contact layer 50, and the semiconductor layer 40 are then etched. After etching, a data wire and the underlying layers remain in part A. In part C, only the semiconductor layer remains. In addition, three layers of 60, 50, and 40 in the remaining part B are removed, exposing the gate insulating layer 30.

Figure 10A:
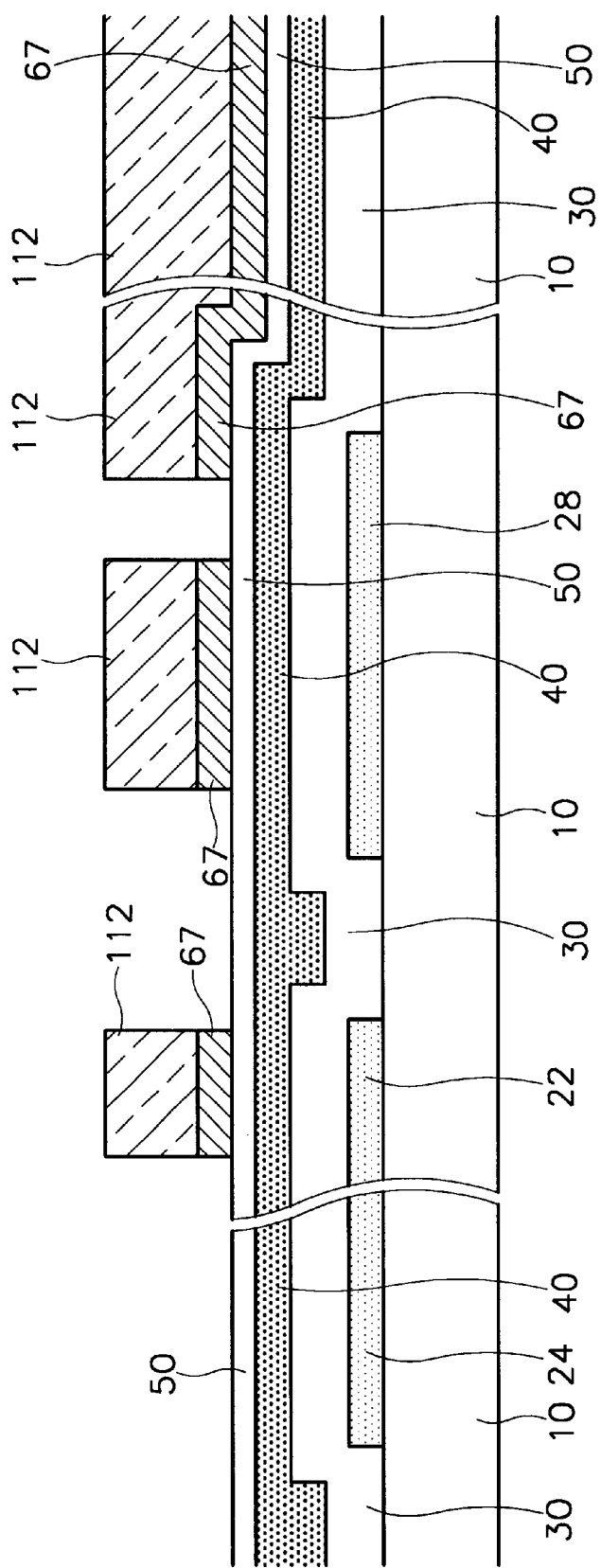
FIGS. 10A, 11A, and 12A are cross-sectional views in the next manufacturing step of FIG. 6B taken along the line IVB–IVB' of FIG. 6A.

As shown in FIGS. 10A and 10B, the ohmic contact layer 50 of the part B is exposed by removing the conductor layer 60 thereon. At this time, both wet and dry etch can be used, and it is preferable that the conductor layer 60 is etched but the photoresist layer 112 and 114 are not etched. However, since the dry etch method can hardly achieve this result, the photoresist pattern 112 and 114 may also be etched. In this case, the first portion 114 needs to be made thicker than when the wet etch method is employed, so that the conductor layer 60 is not exposed.

If the conductor layer 60 is made of Mo or MoW alloy, Al or Al alloy, or Ta, both dry etch method and wet etch method can be used. However, if the conductor layer 60 is made of Cr, wet etch method is better because Cr is not easily removed by dry etch method. $CeNHO_3$ is available as a wet etchant for etching a Cr conductor layer 60. When the conductor layer 60 is composed of Mo or MoW, it may be dry etched using a gas mixture of $CF_4$ and HCl or $CF_4$ and $O_2$. In this case, the etch rate for the photoresist layer is close to that for the conductor layer 60.

As shown in FIGS. 10A and 10B, the photoresist layer and its underlying conductor layer 60 corresponding to part B are totally removed to expose the underlying ohmic contact layer 50. Only portions of photoresist layers 112 and 114 and their underlying conductor layer 60 corresponding to part A for source/drain electrodes and a storage capacitor and part C for channel remains. At this time, the conductor patterns 67 and 68 has the same layout as the data wire parts 62, 64, 65, 66, and 68 except that the source electrode 65 and the drain electrode 66 are not separated yet. When dry etched, the photoresist layers 112 and 114 are also etched to a certain thickness.

Figure 11A:
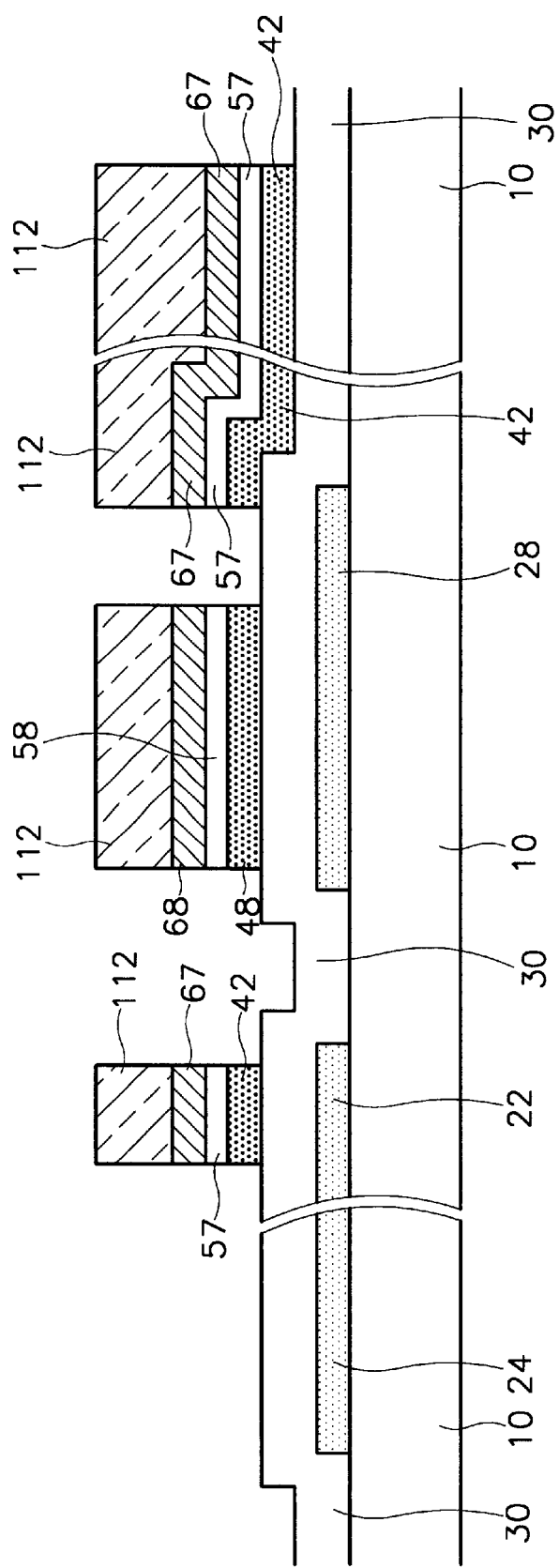
Figure 11B:
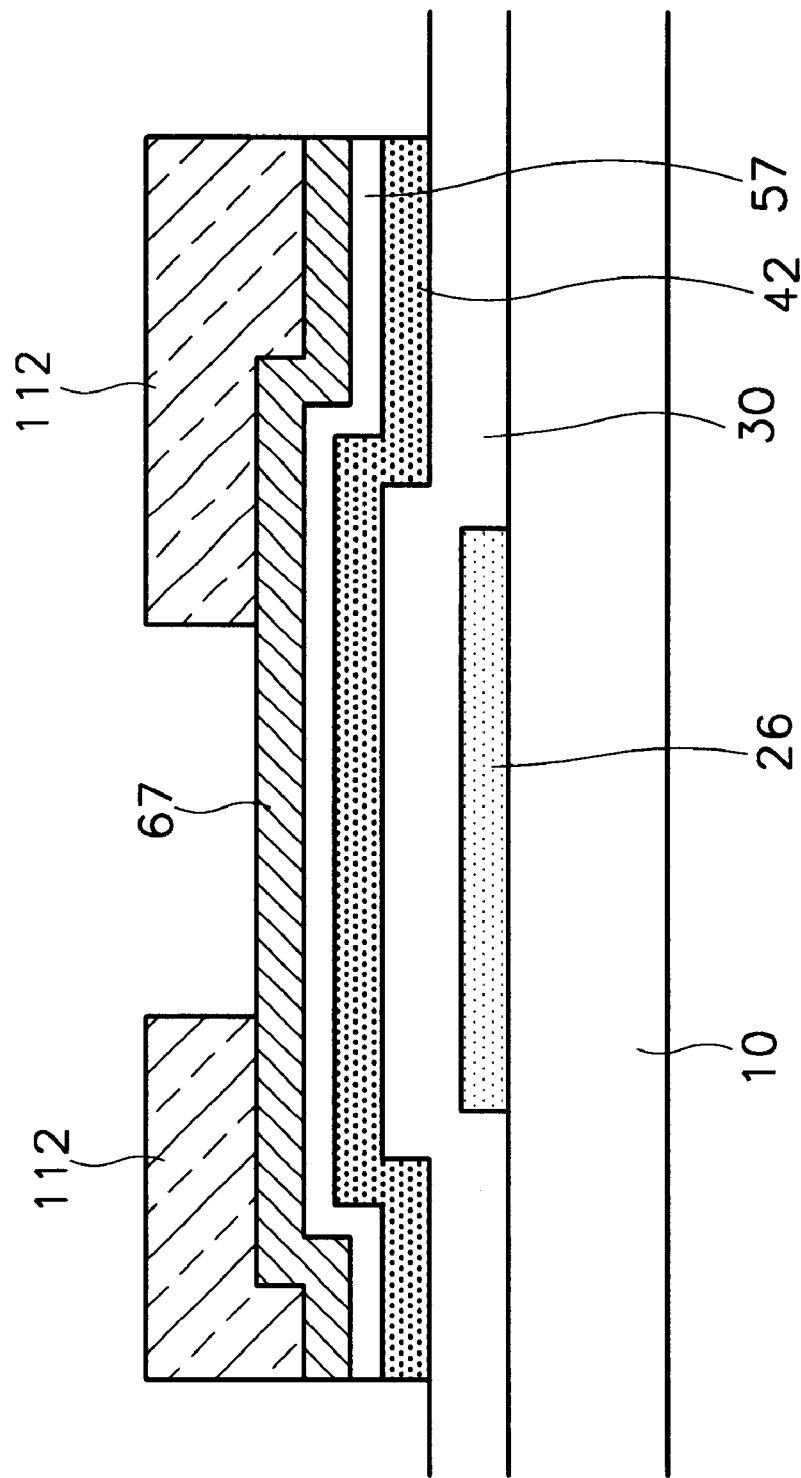

Next, the exposed portions of the ohmic conductor layer 50 at part B and the underlying semiconductor layer 40 of FIGS. 10A and 10B have been removed by dry etching along with first portion 114 of the photoresist layer as shown FIGS. 11A and 11B. The etch condition may be such that the photoresist patterns 112 and 114, the ohmic contact layer 50, and the semiconductor layer 40 are all etched (the semiconductor layer and the ohmic contact layer have almost the same etch rate), but the gate insulating layer 30 is not etched. It is preferable that the etch rates for the photoresist patterns 112 and 114 and for the semiconductor layer 40 are almost the same. Gas mixtures of $SF_6$ and HCl or $SF_6$ and $O_2$ can be used for this purpose. When the etch rates for the photoresist patterns 112 and 114 and the semiconductor layer 40 are almost the same, the photoresist pattern 114 needs to be as thin as or thinner than the combined thickness of the semiconductor layer 40 and the ohmic contact layer 50.

Then, as shown in FIGS. 11A and 11B, the conductor pattern 67 is exposed by removing the first portion 114 of the channel part C, and the gate insulating layer 30 is exposed by removing the ohmic contact layer 50 and the semiconductor layer 40 of the part B. At the same time, the second portion 112 over the data wire part A becomes thinner by etching. This step completes semiconductor patterns 42 and 48. The reference numerals 57 and 58 respectively represent the ohmic contact layer patterns under the conductor pattern 67 and 68 for the source/drain electrode and the storage capacitor.

The remaining photoresist layer on the conductor pattern 67 is then removed by ashing or plasma etching.

Plasma gas or microwaves are used for ashing and the main composition of gas is oxygen.

Next, as shown in 12A and 12B, the conductor pattern 67 for source/drain electrodes at the channel part C and the ohmic contact layer pattern 57 for source/drain electrodes of FIG. 11B are removed by etching. At this time, both the conductor pattern 67 and the ohmic contact layer 57 may be etched by a dry etching method. Otherwise, the conductor pattern 67 may be etched by a wet etching method and the ohmic contact layer 57 by a dry etching method. In the former case, it is preferable that the etch conditions of a large etch selectivity between the conductor pattern 67 and the ohmic contact layer pattern 57 is employed. If the etch selectivity is not large enough, it is hard to detect the end point of the etch and to control the thickness of the semiconductor pattern 42 around the channel part C. This can be achieved by using a gas mixture of $SF_6$ and $O_2$, for example.

Figure 12A:
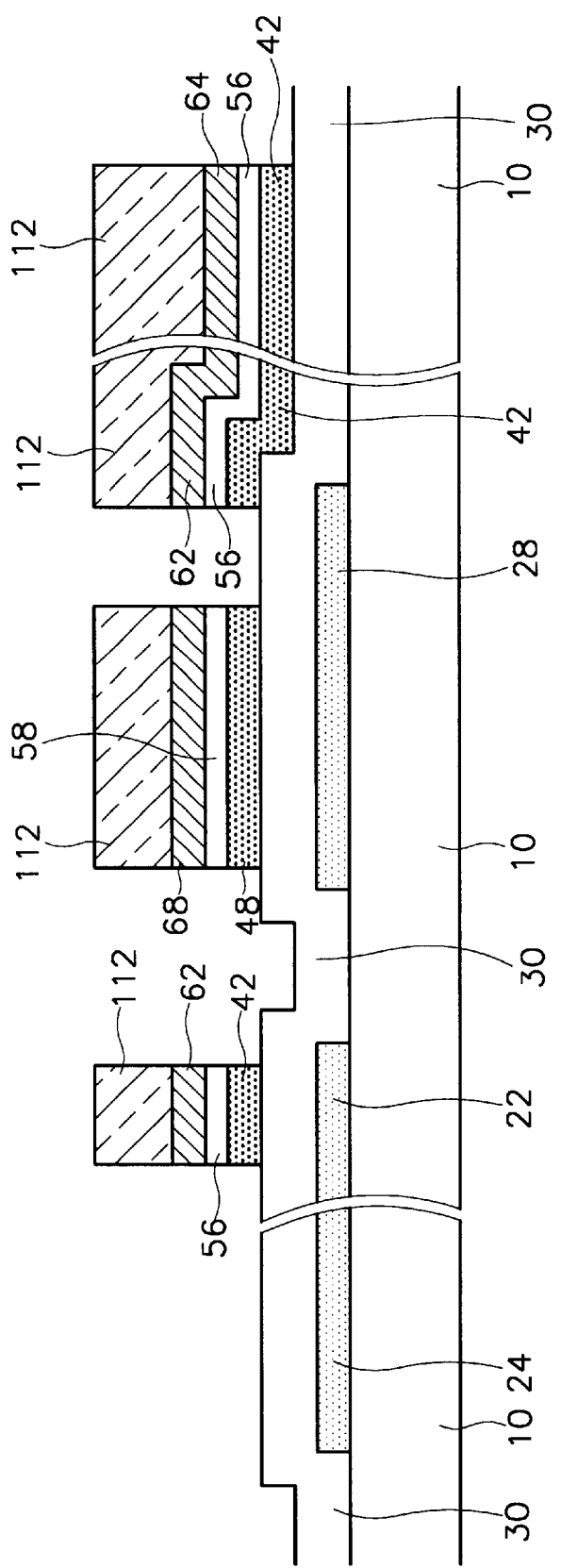
Figure 12B:
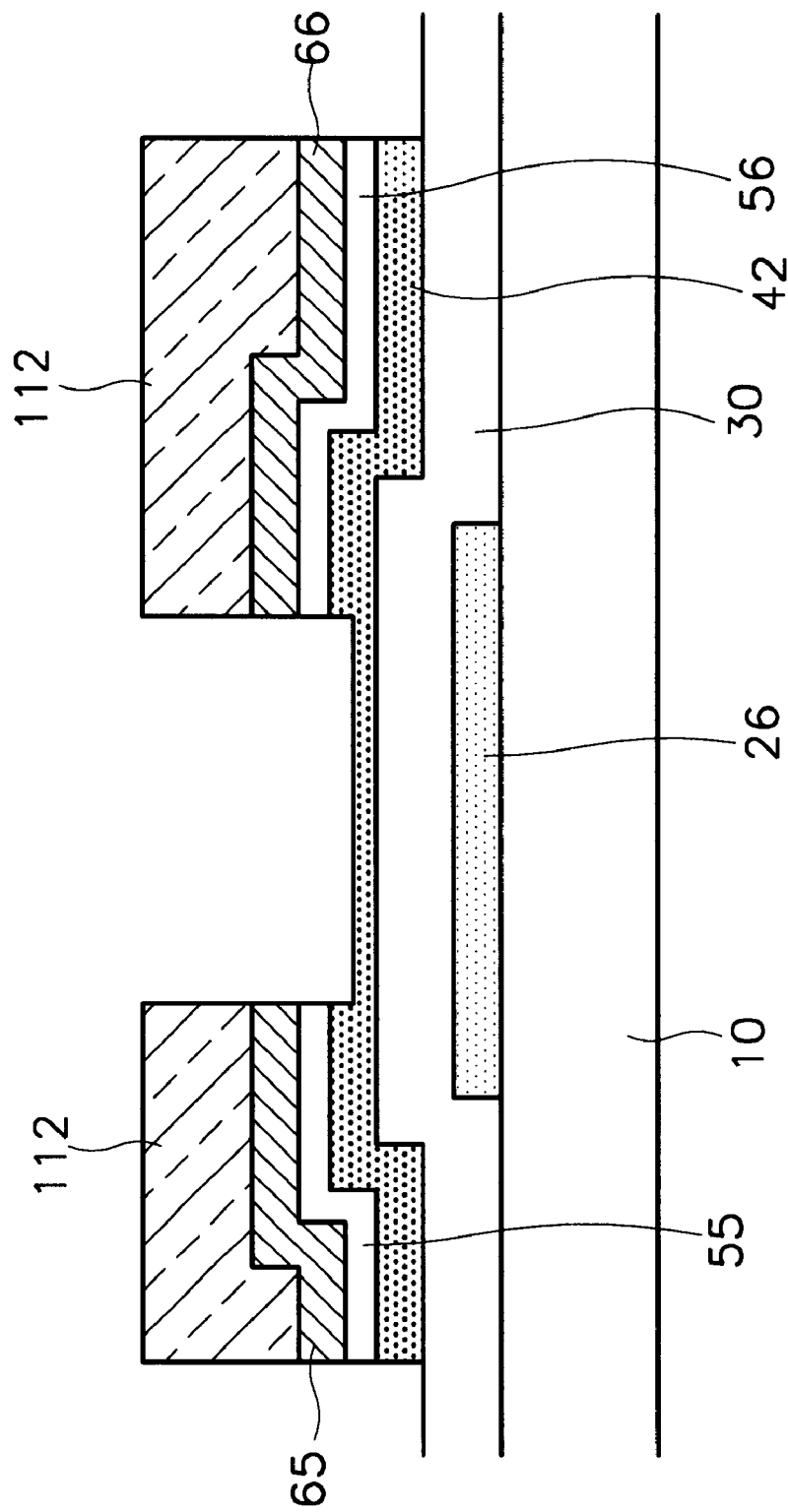

When using the wet etch and the dry etch sequentially, the lateral sides of the conductor pattern 67 subject to the wet etch are also etched but those of the ohmic contact layer pattern 57 that is dry etched are hardly etched at all. Thereby, the profile of these two patterns 67 and 57 shapes like a step. The gas mixture of $CF_4$ and $O_2$ may be used for etching the ohmic contact layer pattern 57 and the semiconductor pattern 42. The semiconductor pattern 42 may also be formed to have a uniform thickness by etching with the gas mixture of $CF_4$ and $O_2$. At this time, as shown in FIG. 12B, the thickness of the semiconductor pattern 42 may be reduced and the second portion 112 of photoresist pattern is also etched to a certain thickness. The etch conditions may also be set not to etch the gate insulating layer 30, and it is preferable to make the photoresist pattern thick enough not to expose the data wire parts 62, 64, 65, 66, and 68.

As a result, the source electrode 65 and the drain electrode 66 are separated, and the data wire parts 62, 64, 65, 66, and 68 and the underlying contact layer pattern 55, 56, and 58 are completed.

Next, the remaining second portion 112 of the photoresist layer on the data wire (Region A of FIG. 6C) is removed. However, the second portion 112 may be removed after removing the conductor pattern 67 for source/drain electrodes on the channel part C of FIG. 11B and before removing the ohmic contact layer pattern 57 under the conductor pattern 67.

When both wet etching and dry etching are employed, the conductor layer of the part B is first removed by wet etching, and the ohmic contact layer and the underlying semiconductor layer are removed by dry etching. At this time, the photoresist layer of the part C is consumed to a certain thickness, and the part C may have or may not have any residual photoresist, which substantially depends on the initial thickness of the photoresist layer of the part C. When the part C has residual photoresist, the residual photoresist is removed by ashing. Finally, the conductor layer of the part C is wet etched to separate the source and the drain electrodes, and the ohmic contact layer of the part C is removed by using dry etching.

When only the dry etching is employed, the conductor layer, the ohmic contact layer and the semiconductor layer of the part B are removed by dry etching. Like the previous case, the part C may have or may not have residual photoresist, and the residual photoresist is removed by ashing when the part C has residual photoresist. Finally, the conductor layer of the part C is dry etched to separate the source and the drain electrodes, and the ohmic contact layer of the part C is removed by dry etching.

Also, if the data wire is etched, the semiconductor pattern, the contact layer pattern and the data wire may be completed in one step. That is to say, it is desirable that the photoresist pattern 114 and the underlying contact layer 50 of the part C and the portion of the photoresist pattern 112 of the part A are dry etched, while the conductor layer, the ohmic contact layer, and the semiconductor layer of the part B are dry etched.

Since the latter process uses only one type of etching method, it is simpler but it is hard to keep proper etching conditions. On the contrary, the former process may be easier to keep proper etching conditions, but is more complicated.

Figure 13A:
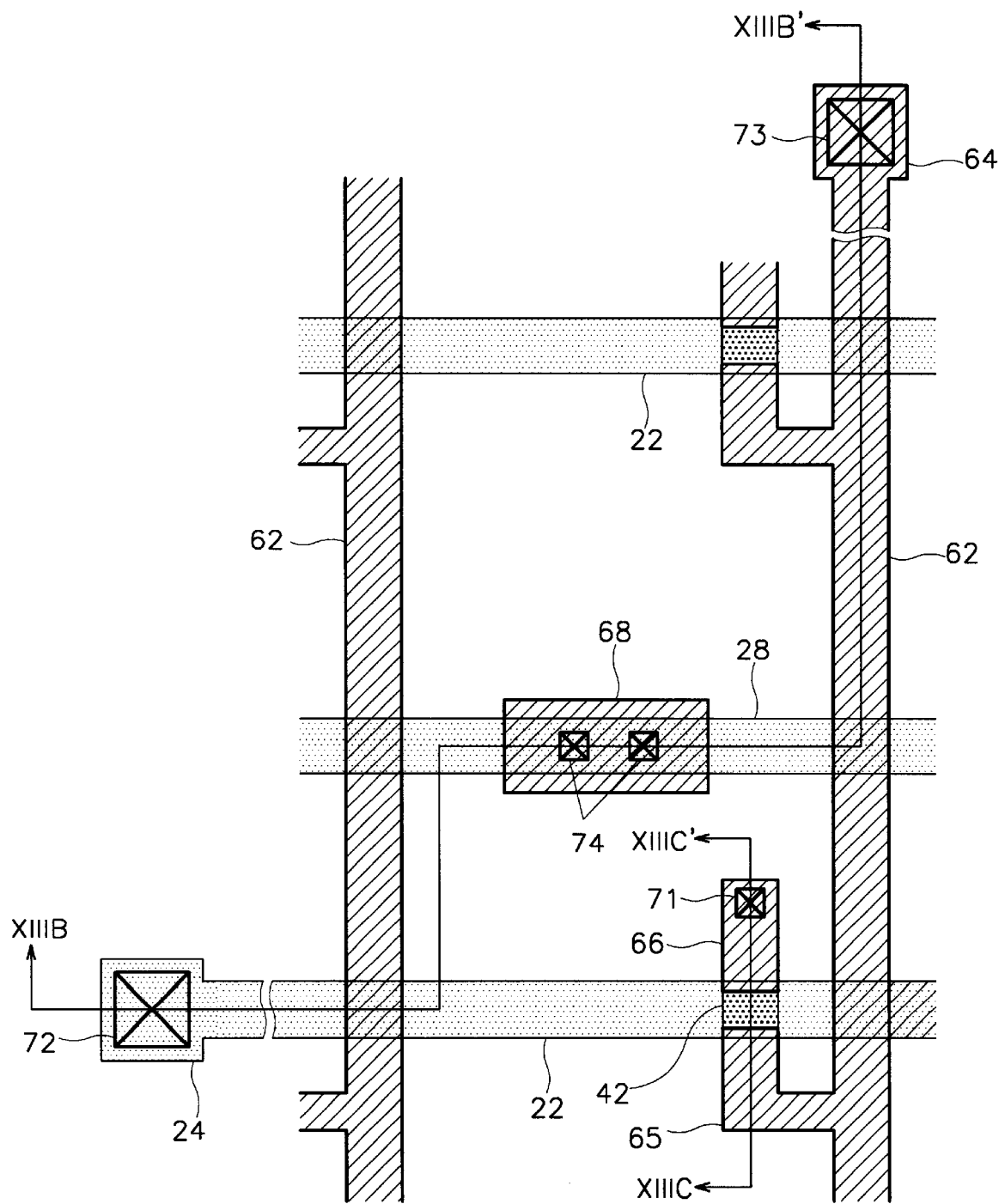
FIG. 13A is a layout view of a thin film transistor array panel in the next manufacturing step of FIGS. 12A and 12B.
Figure 13B:
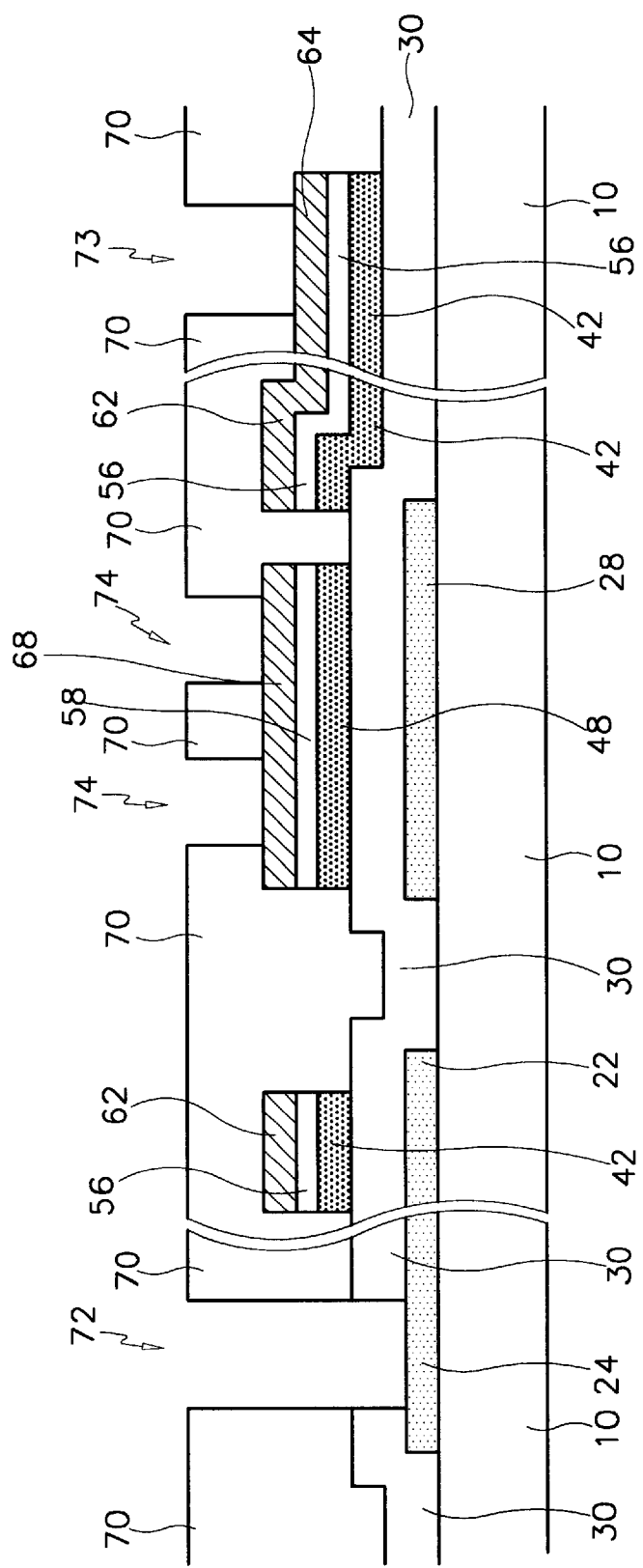

After forming data wire parts 62, 64, 65, 66, and 68, a passivation layer 70 having a thickness of over 2,000 Å is formed by CVD of SiNx or spin coating of organic insulator. Then, contact holes 71, 72, 73, and 74 respectively exposing the drain electrode 66, the gate pad 24, the data pad 64, and the conductor pattern 68 for the storage capacitor are formed by etching the passivation layer 70 and the gate insulating layer 30 at the same time by using the third mask, as shown in FIGS. 13A to 13C.

Next, as shown in FIGS. 1 to 3, an ITO layer is deposited having a thickness of 400 Å to 500 Å, and etched by using the fourth mask to form a pixel electrode 82, a redundant gate pad 84 and a redundant data pad 86.

As described above, in the first embodiment, the data wire 62, 64, 65, 66, and 68, the ohmic contact pattern 55, 56, and 58, and the semiconductor pattern 42 and 48 are formed using one mask. The source electrode and the drain electrode are also separated in this step. However, in the second and the third embodiments, the source electrode and the drain electrode are separated in the step forming the passivation layer.

A liquid crystal display and a manufacturing method thereof according to the second embodiment of the present invention will now be described with reference to the FIGS. 14 to 21B.

Figure 14:
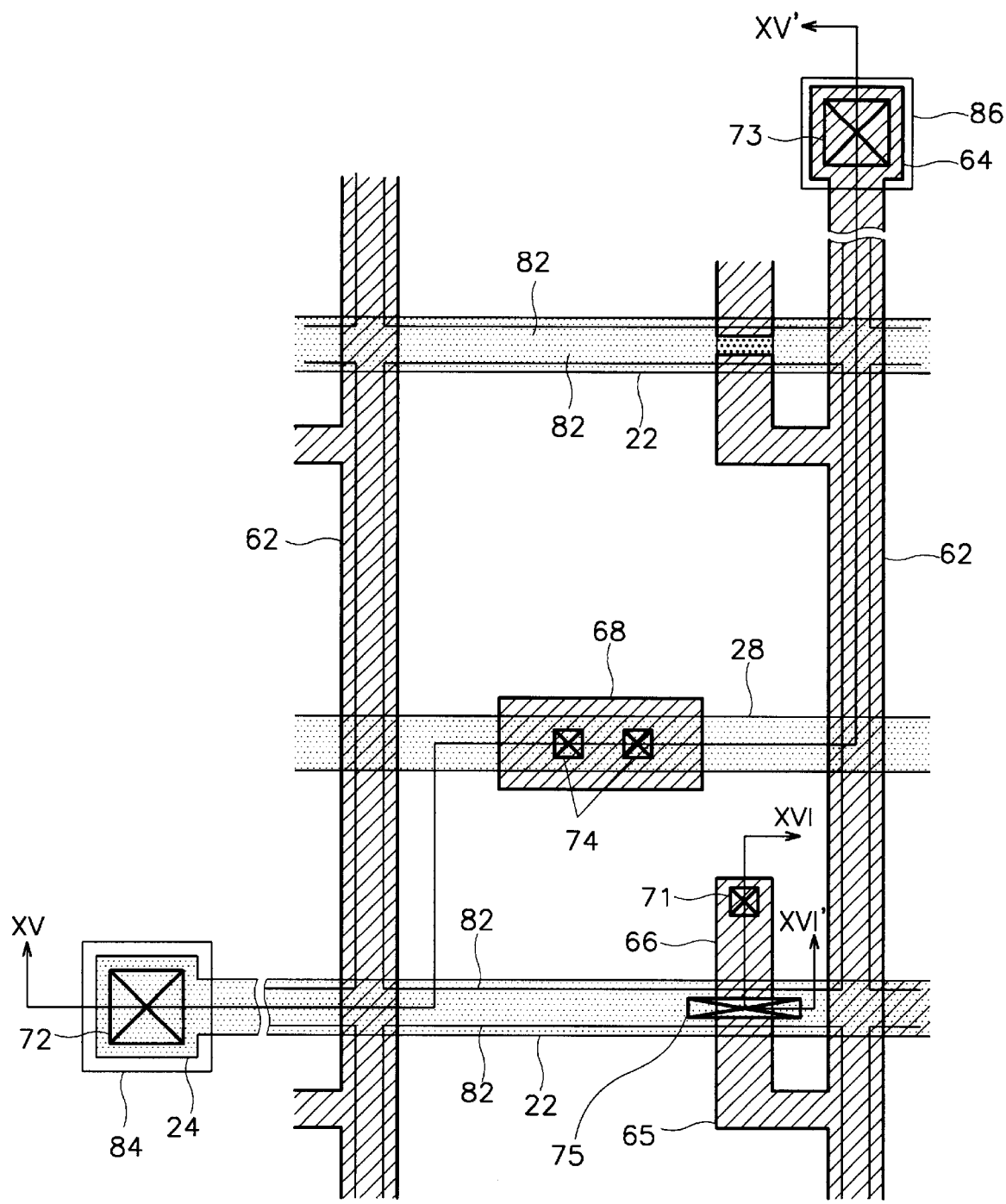
FIG. 14 is a layout view of a thin film transistor array panel for a liquid crystal display according to the second embodiment of the present invention.
Figure 15:
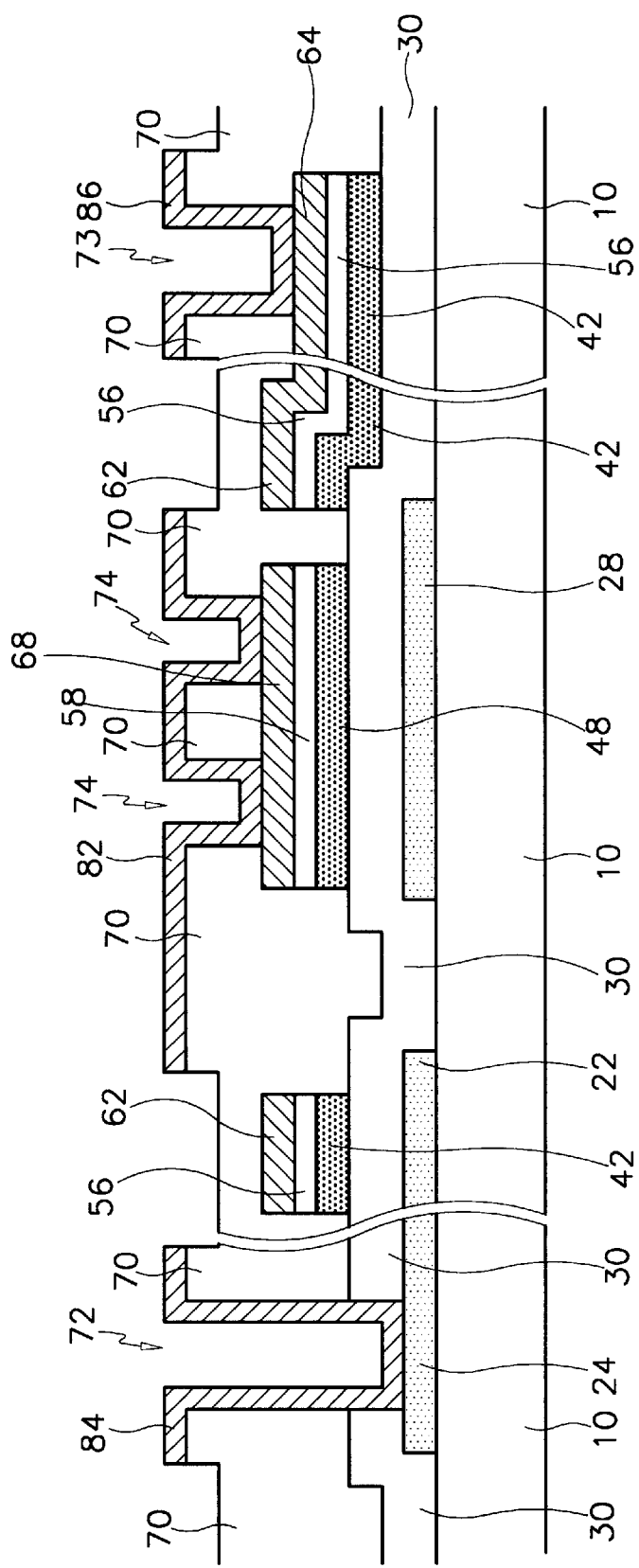
FIGS. 15 and 16 are the cross-sectional views taken along the line XV–XV' and XVI–XVI' of FIG. 14, respectively.
Figure 16:
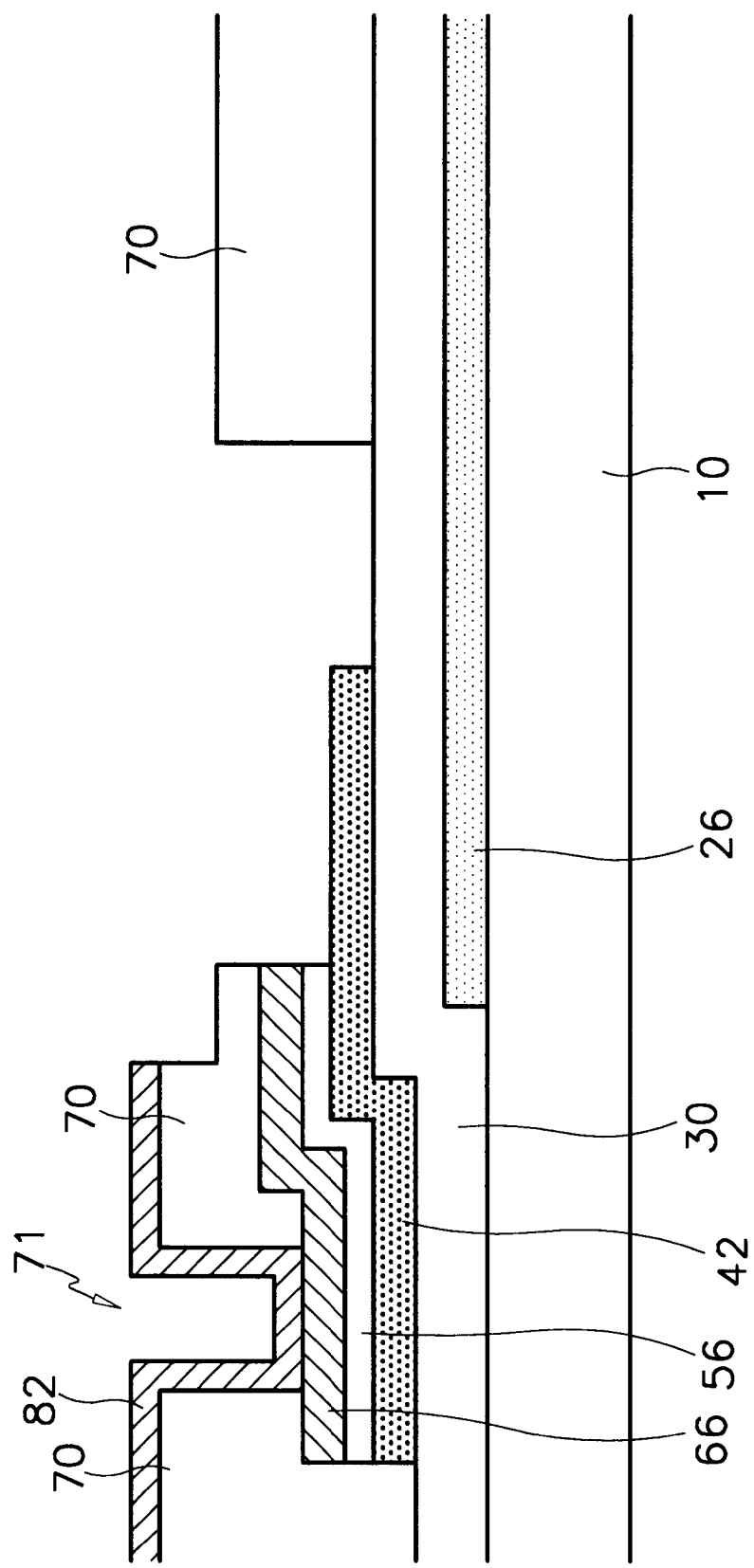

FIG. 14 is a layout view of a thin film transistor array panel for a liquid crystal display according to the second embodiment of the present invention, and FIGS. 15 and 16 are respectively the cross-sectional views taken along the line XV–XV' and XVI–XVI' of FIG. 14.

As shown in FIGS. 14 to 16, the structure of a thin film transistor panel according to this embodiment is similar to the thin film transistor panel according to the first embodiment. The difference is that the passivation layer 70 has an opening 75 exposing the semiconductor pattern 42 between the source electrode 65 and the drain electrode 66, and that the passivation layer 70 (except for the part which is covered with the pixel electrode 82), the redundant gate pad 84, and the redundant data pad 86 are all etched a little bit. At this point, the opening 75 completely separates the source electrode and the drain electrode, and the semiconductor pattern 42 that is exposed through the opening 75 will be covered and protected by an alignment layer that will be formed later.

A method for manufacturing a thin film transistor array panel according to the second embodiment of the present invention will now be described with reference to the FIGS. 17A to 21B and FIGS. 14 to 16.

Figure 17A:
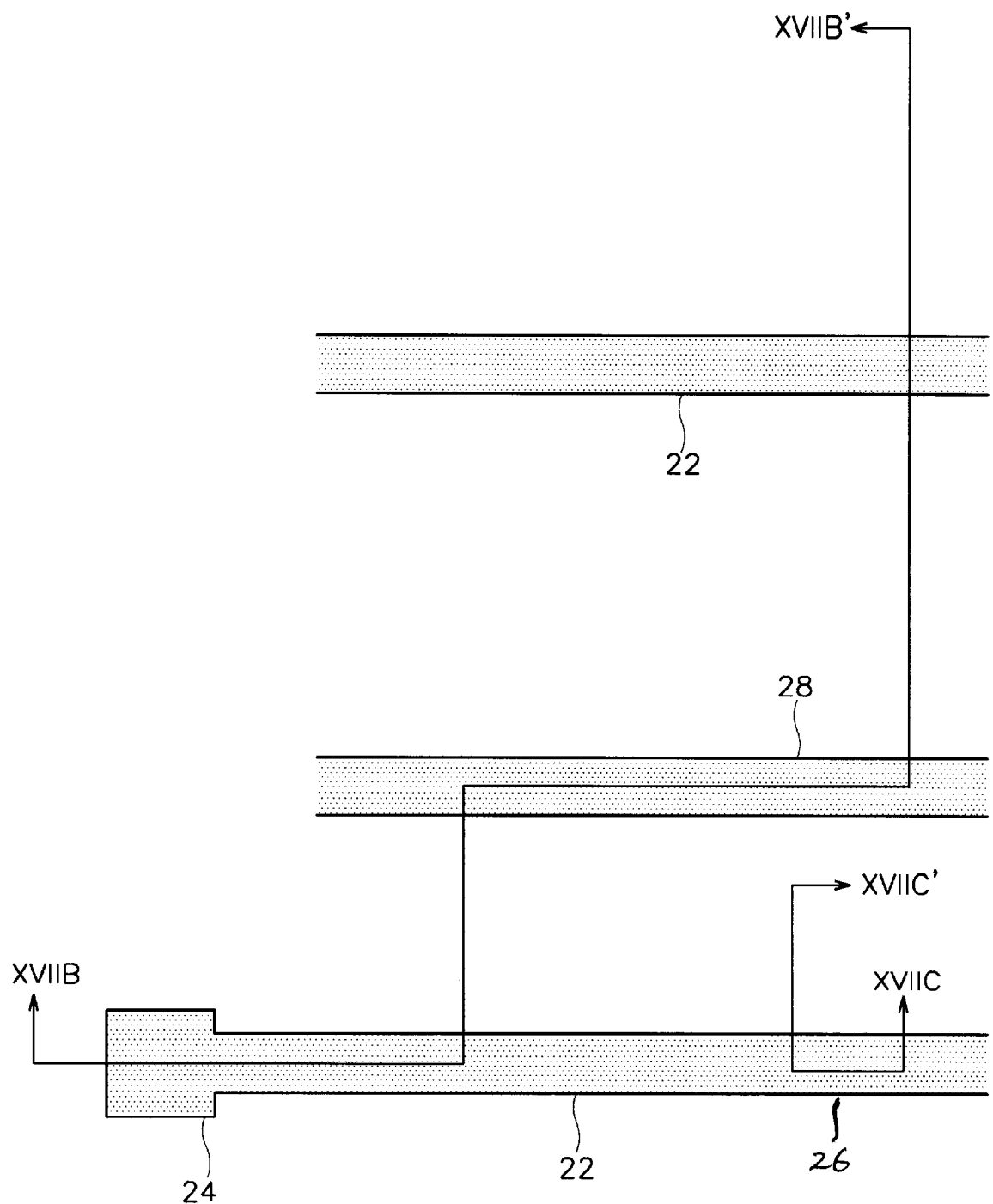
FIG. 17A is a layout view of a thin film transistor array panel according to the third embodiment of the present invention in the first step of manufacturing method.
Figure 17B:
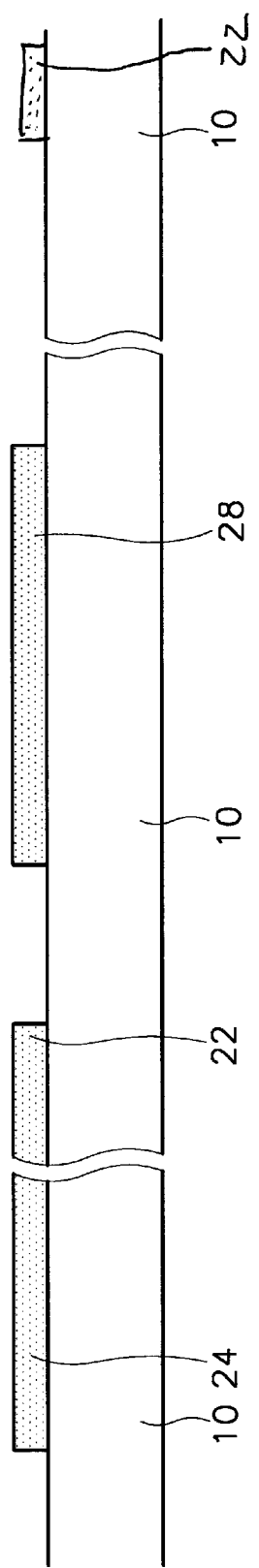
FIGS. 17B and 17C are the cross-sectional views taken along the line XVIIB–XVIIB' and XVIIC–XVIIC' of FIG. 17A, respectively.
Figure 17C:
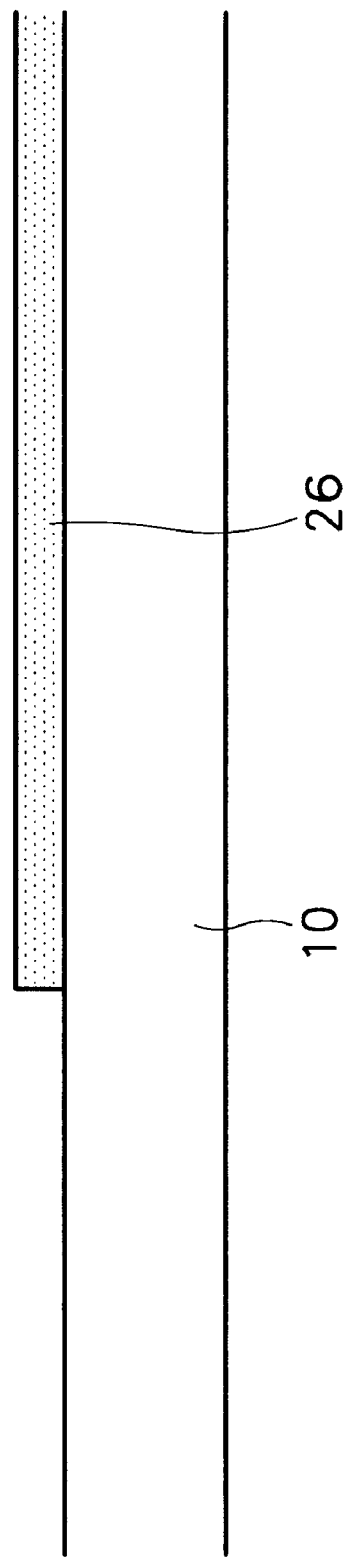

At first, as shown in the FIGS. 17A to 17C, a gate line 22, a gate pad 24, a gate electrode 26, and a storage electrode 28 are formed on the substrate 10 by using a first mask.

Figure 18A:
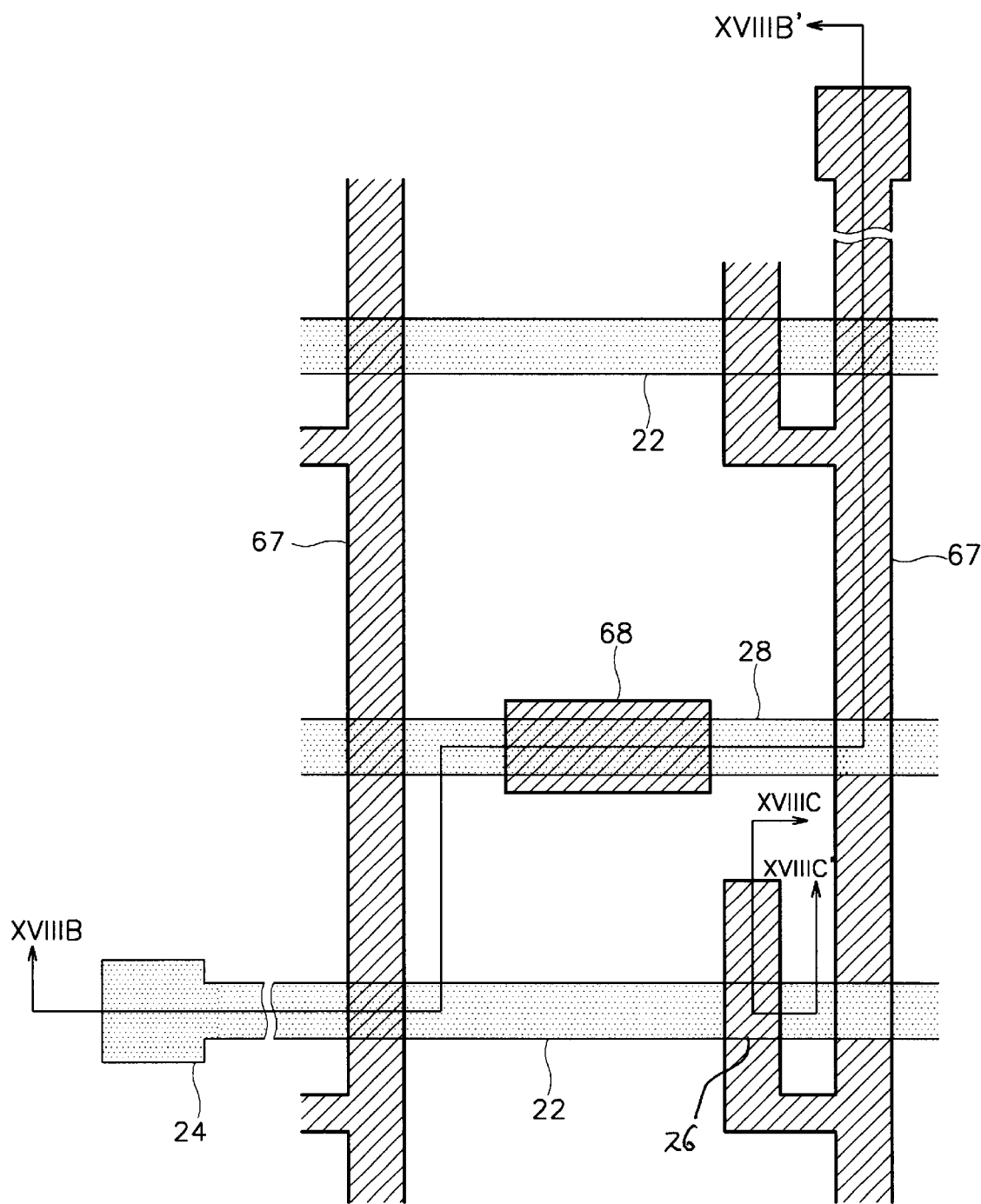
FIG. 18A is a layout view of a thin film transistor array panel in the next manufacturing step of FIGS. 17A, 17B and 17C.
Figure 18C:
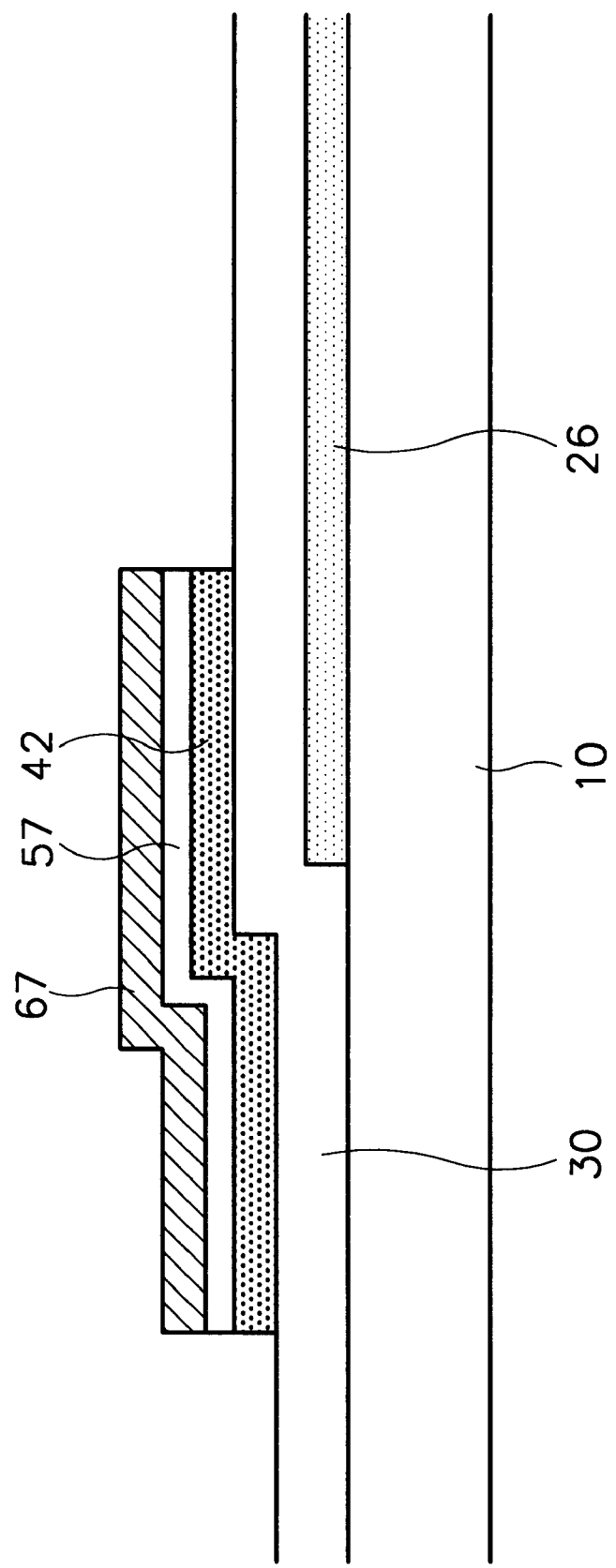

Next, as shown in the FIGS. 18A to 18C, a gate insulating layer 30, a semiconductor layer 40, and an ohmic contact layer 50 are sequentially deposited by such a method as chemical vapor deposition (CVD), and a conductor layer 60 (such as a metal) is deposited by a method such as sputtering. Then, a conductor pattern 67 for source/drain electrodes, an ohmic contact layer pattern 57 for source/drain electrodes under the conductor pattern 67, a semiconductor pattern 42 for thin film transistors, a conductor pattern 68 for storage capacitors, an ohmic contact layer pattern 58 for storage capacitors under the conductor pattern 68 and a semiconductor pattern 48 for storage capacitors are formed by sequential patterning using a second mask. At this time, the conductor pattern 67 for source/drain electrodes has the same structure as that of a finished thin film transistor except that the source electrode and the drain electrode are not separated yet.

Figure 19A:
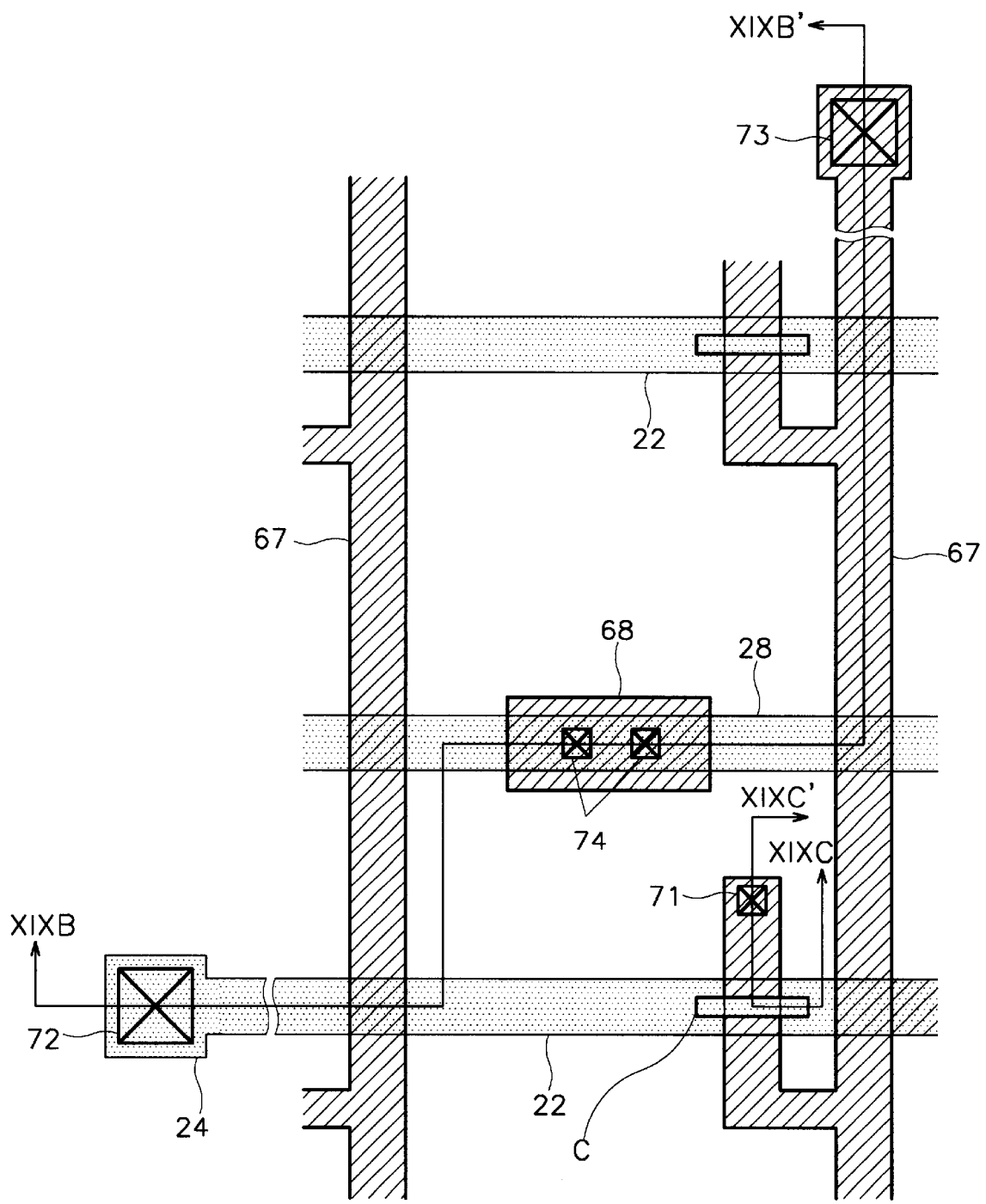
FIG. 19A is a layout view of a thin film transistor array panel in the next manufacturing step of FIGS. 18A, 18B and 18C.
Figure 19B:
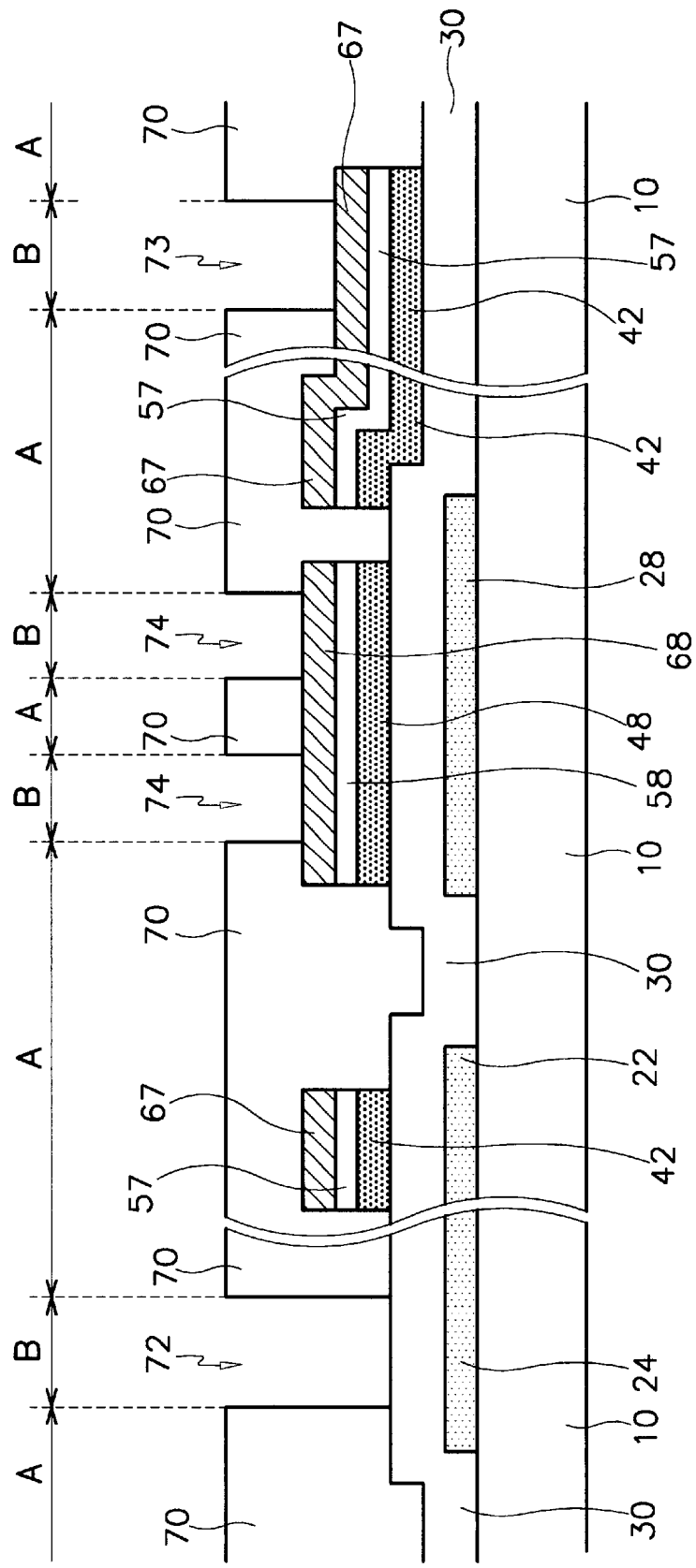
FIGS. 19B and 19C are the cross-sectional views taken along the line XIXB–XIXB' and XIXC–XIXC' of FIG. 19A, respectively.
Figure 19C:
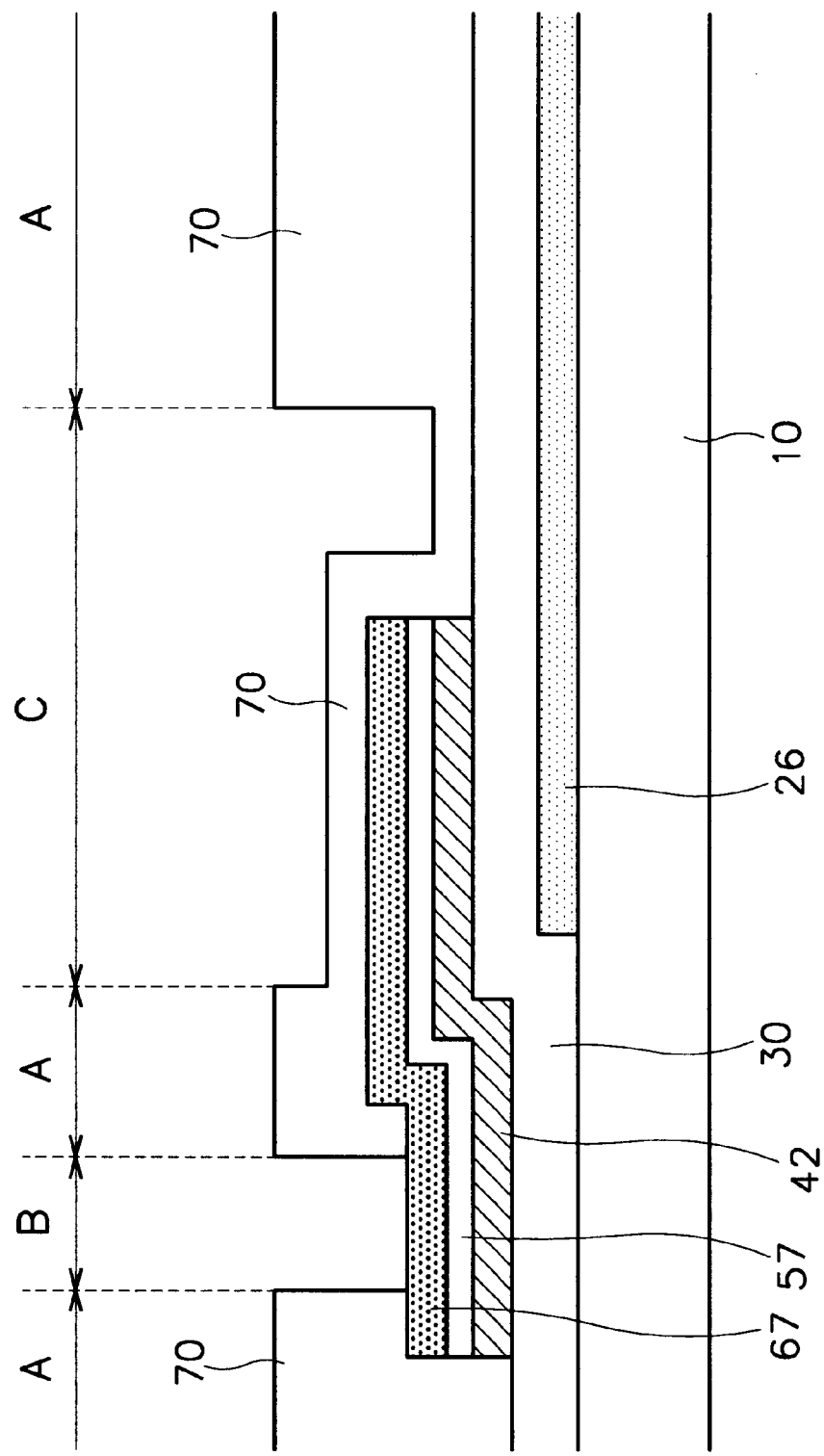

Next, as shown in FIGS. 19A to 19C, a passivation layer 70 having contact holes 71, 72, 73, and 74 and an opening 75 is patterned using a third mask. At this time, the thickness of the passivation layer 70 varies depending on the location. The portion of the passivation layer 70 on the thin film transistor channel part C, and the portion of passivation between the source electrode 65 and the drain electrode 66 are thinner than the parts A. The parts B in the FIGS. 19B and 19C will be the portion for the contact holes 71, 72, 73, and 74, as well as for the opening 75. The passivation layer 70 having multiple thicknesses is formed just like the photoresist pattern 112 and 114 having multiple thickness in the first embodiment. However, the photoresist patterns 112 and 114 in the first embodiment are removed but the passivation layer 70 in this embodiment becomes a part of the thin film transistor panel.

Figure 20:
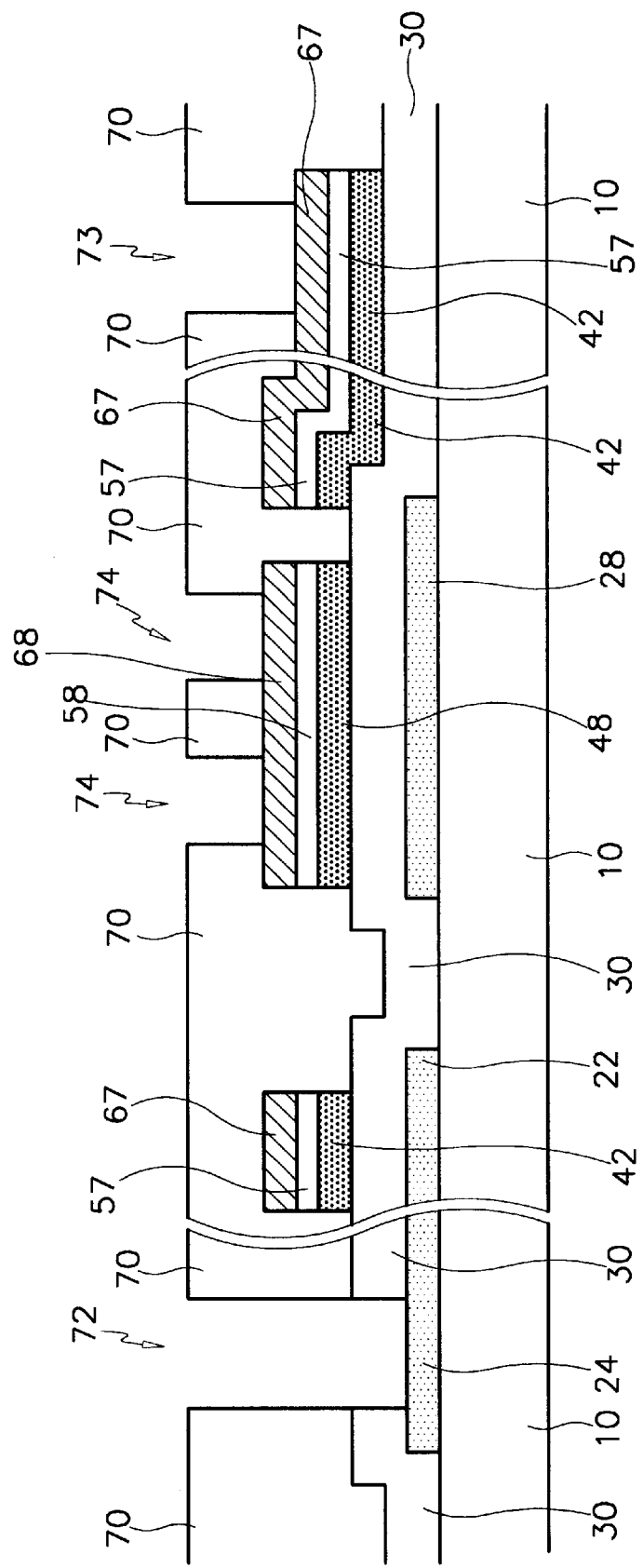
FIG. 20 is a cross-sectional view taken along the line XIXB–XIXB' of FIG. 19A in the next manufacturing step of FIGS. 19B and 19C.

Then, as shown in the FIG. 20, the gate pad 24 is exposed by removing the gate insulating layer 30 from the bottom of the contact hole 72. At this time, it is preferable that only the gate insulating layer 30 is etched out without etching the passivation layer 70 and the conductor pattern 67 and 68. Therefore, it is preferable to make the passivation layer 70 of materials different from the gate insulating layer 30. However, if the etch condition is such that the passivation layer 70 is also etched, it is preferable to make the passivation layer 70 thicker than normal.

Figure 21B:
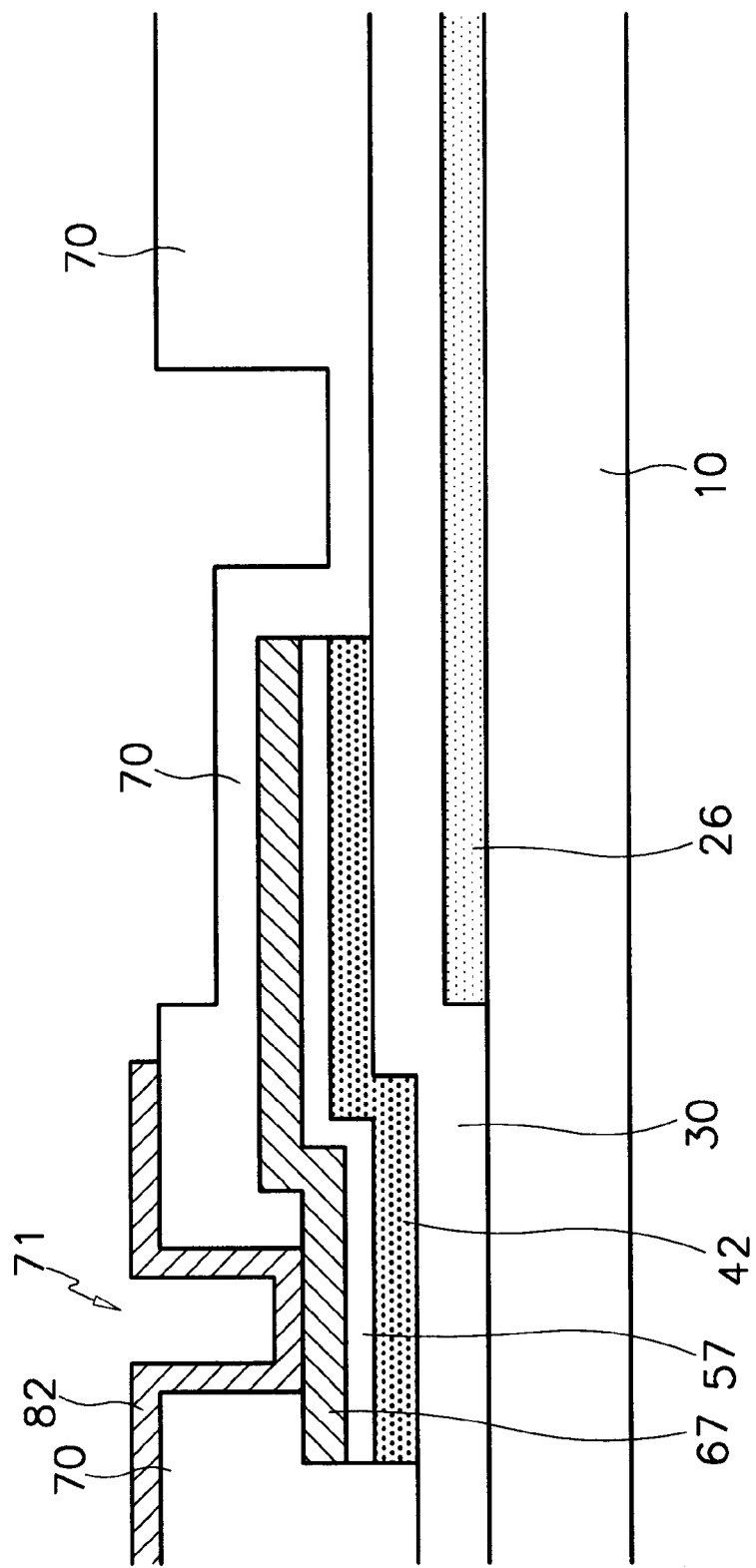

Next, as shown in FIGS. 14, 21A and 21B, a pixel electrode 82, a redundant gate pad 84, and a redundant data pad 86 are formed by depositing a conductor layer and patterning the conductor layer using a fourth mask.

Then, as shown in FIGS. 15 and 16, the passivation layer 70 is dry etched to form the opening 75, using the pixel electrode 82, the redundant gate pad 84, and the redundant data pad 86 as etch stopper. At this time, the etch condition may be set to etch only the passivation layer 70. The etching continues until the thin portion of the passivation layer 70 (or in other words the portion of passivation 70 in the channel) has been completely removed and the conductor pattern 67 for source/drain electrodes is exposed. Rather than using the pixel electrode 82, the redundant gate pad 84 and the redundant data pad 86 as etch stopper, the photoresist pattern formed to pattern the conductor layer can be used as etch stopper. The photoresist pattern may be removed at any later step.

The source electrode 65 and the drain electrode are separated by etching the conducting pattern 67 and the underlying ohmic contact layer pattern 57 in the same manner as the first embodiment.

However, unlike the first embodiment, the redundant gate pad 84 and the redundant data pad 86 are essential elements in this embodiment. If the gate pad 24 and the data pad 64 are exposed without the redundant pads 84 and 86, they would be etched when separating the source electrode 65 and the drain electrode 66.

Next, a liquid crystal display and a method for manufacturing the same according to the third embodiment of the present invention will be described with reference to the FIGS. 22 to 26B. In the second embodiment, there is no separate photoresist layer to pattern the passivation layer, but the third embodiment employs a separate photoresist layer for patterning the passivation layer.

Figure 22:
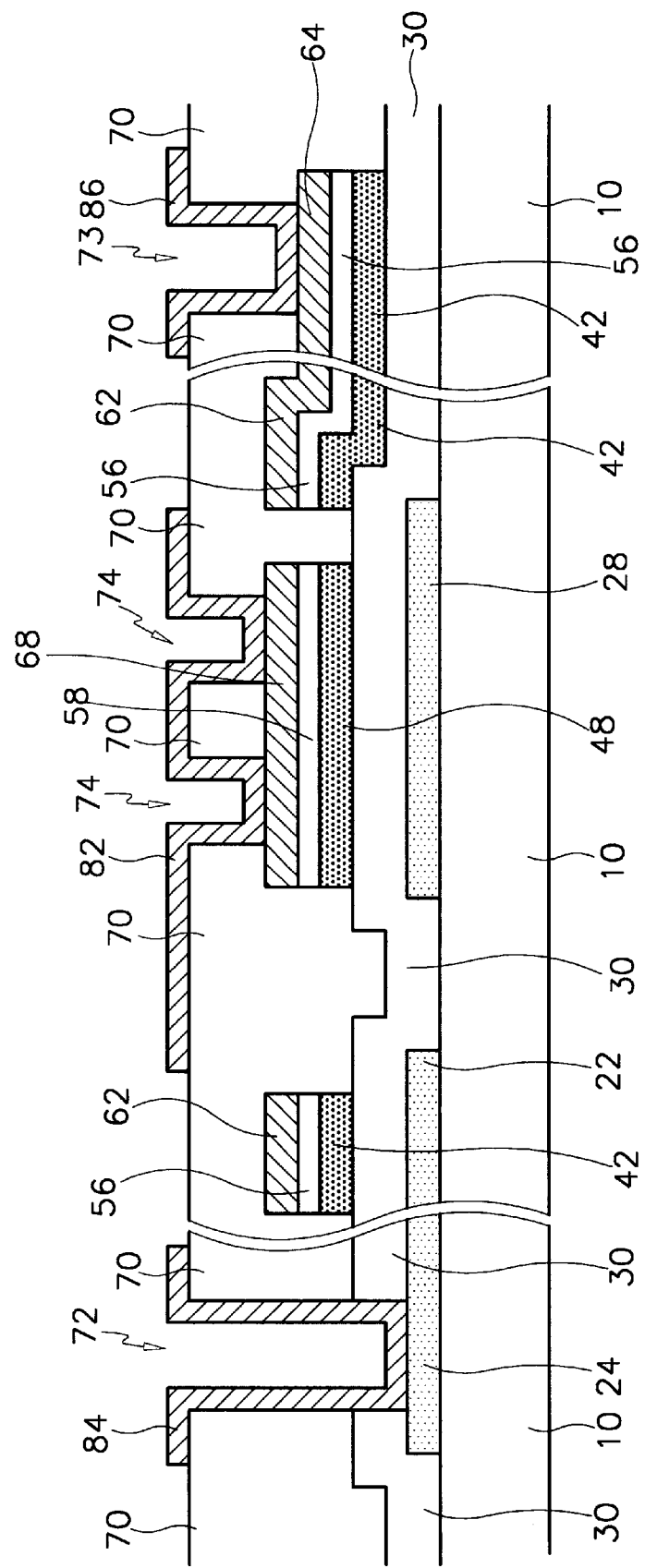
FIGS. 22 and 23 are cross-sectional views according to the third embodiment of the present invention and taken along the line XV–XV' and XVI–XVI' of FIG. 14, respectively.
Figure 23:
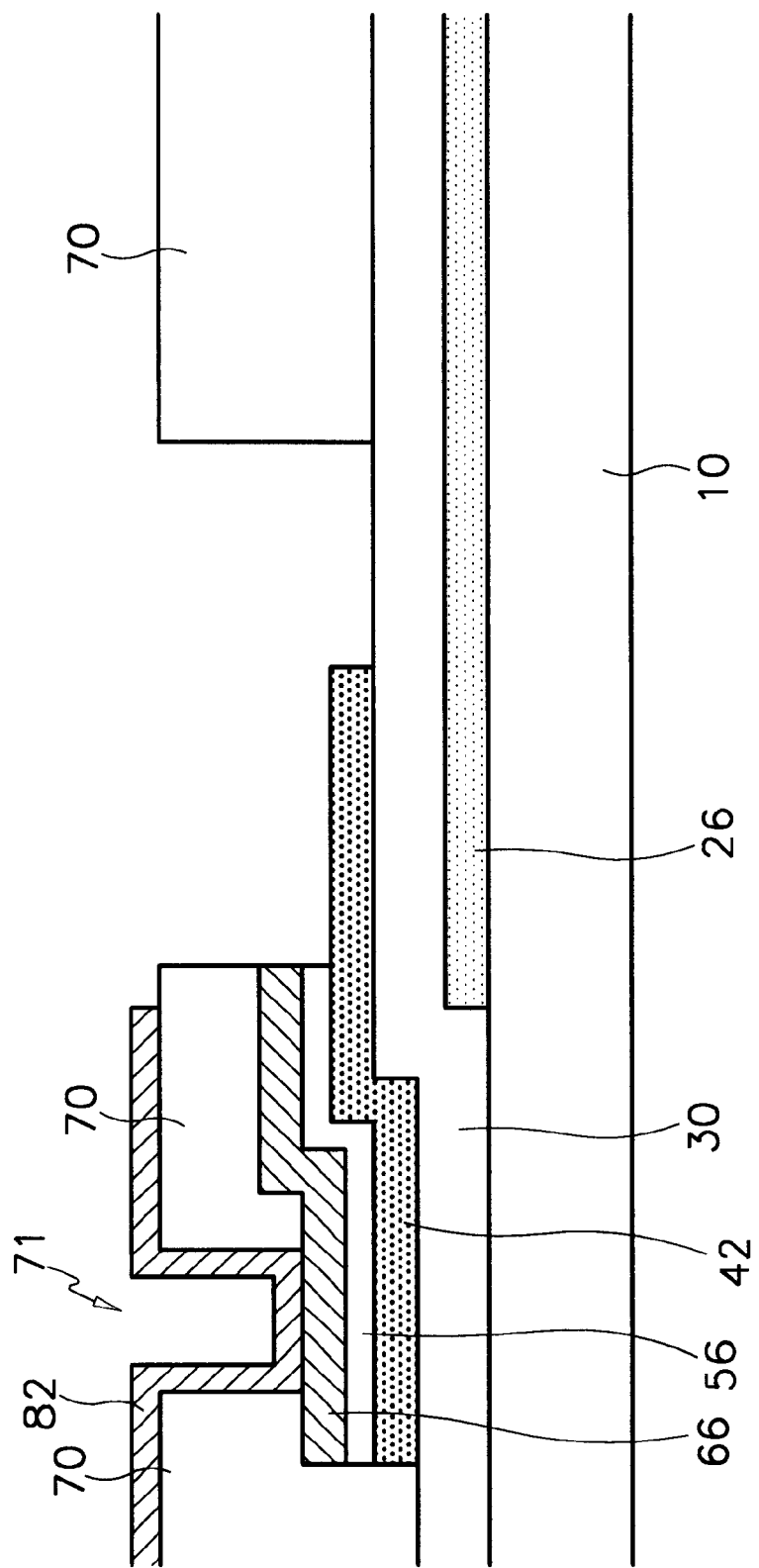

Since the layout view of a thin film transistor panel according to this embodiment is the same as shown in the FIG. 14, a structure of a thin film transistor panel according to the third embodiment will be described with reference to the FIGS. 14, 22 and 23. FIGS. 22 and 23 are cross-sectional views according to the third embodiment of the present invention and taken along the line XV–XV' and XVI–XVI' of FIG. 14.

As shown in FIGS. 14, 22 and 23, the thin film transistor panel structure of this embodiment is similar to that of the second embodiment. However, in the third embodiment, the passivation layer 70 that is not covered with the pixel electrode 82, the redundant gate pad 84, and the redundant data pad 86 is not etched.

Now, a method for manufacturing a thin film transistor array panel according to the third embodiment of the present invention will be described with reference to the FIGS. 14, 22, 23 and 24A to 26B.

At first, gate wire parts 22, 24, 26 and 28, a gate insulating layer 30, a conductor pattern 67 for source/drain electrodes, an ohmic contact layer pattern 57 under the conductor pattern 67, a semiconductor pattern 42 for thin film transistors, an ohmic contact layer pattern 58 for storage capacitors and a semiconductor pattern 48 for storage capacitors are formed by the same method as the second embodiment.

Figure 24A:
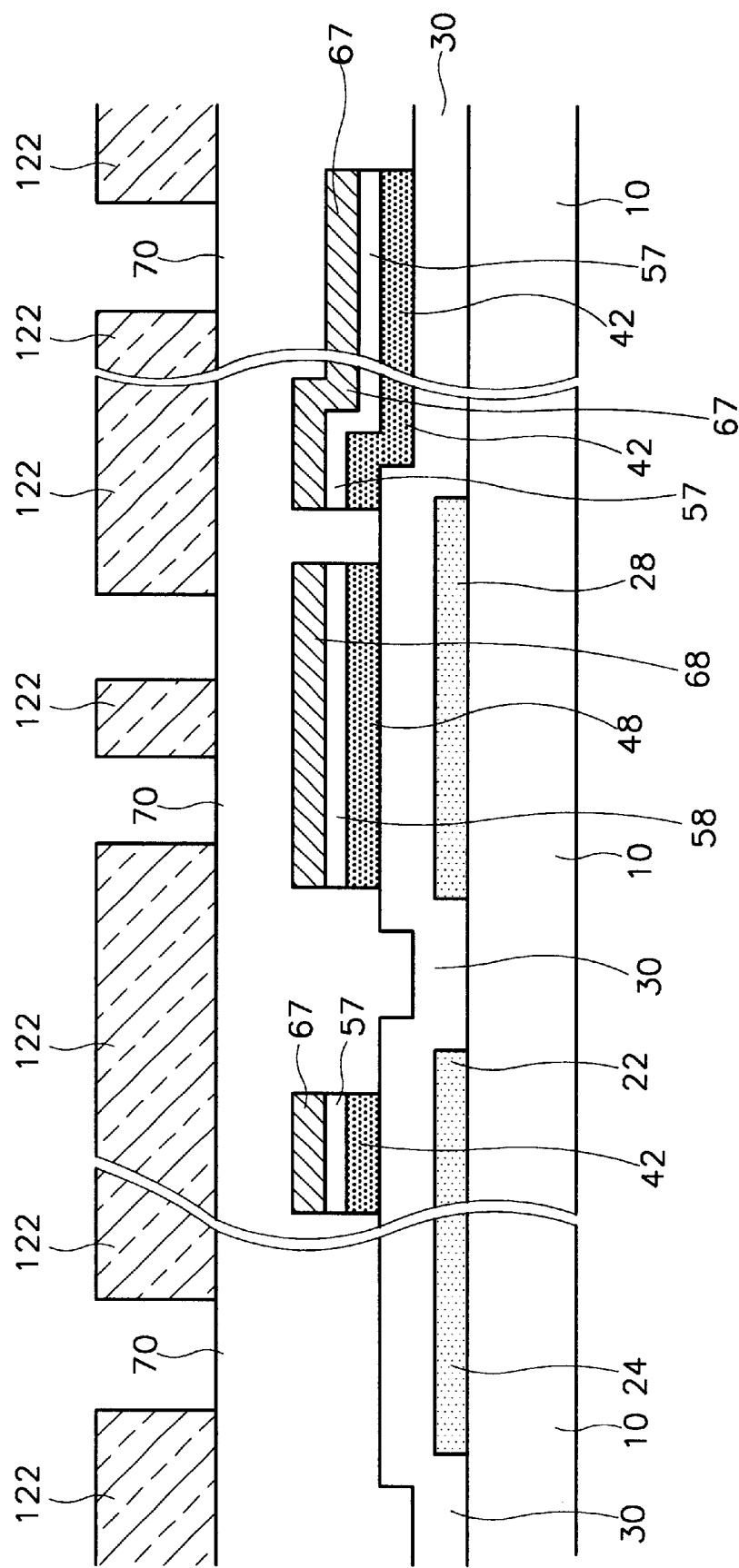
FIGS. 24A and 25A are cross-sectional views taken along the line XIXB–XIXB' of FIG. 19A in the next manufacturing step of FIGS. 18A to 18B, according to the third embodiment of present invention.

Then, as shown in the FIGS. 24A and 24B, a passivation layer 70 is deposited or coated, and a photoresist layer is coated on the passivation layer 70. Thereafter, the photoresist layer is exposed through a third mask and developed to form a photoresist pattern 122 and 124. At this time, the thickness of the photoresist pattern 122 and 124 varies depending on the location. The photoresist patterns corresponding to contact holes 71, 72, 73, and 74 have zero thickness. The portion 124 of photoresist pattern corresponding to an opening 75 is thinner than the portion 122. As described above, the photoresist layer having multiple thicknesses can be formed in the same manner as that of the first embodiment.

Figure 25A:
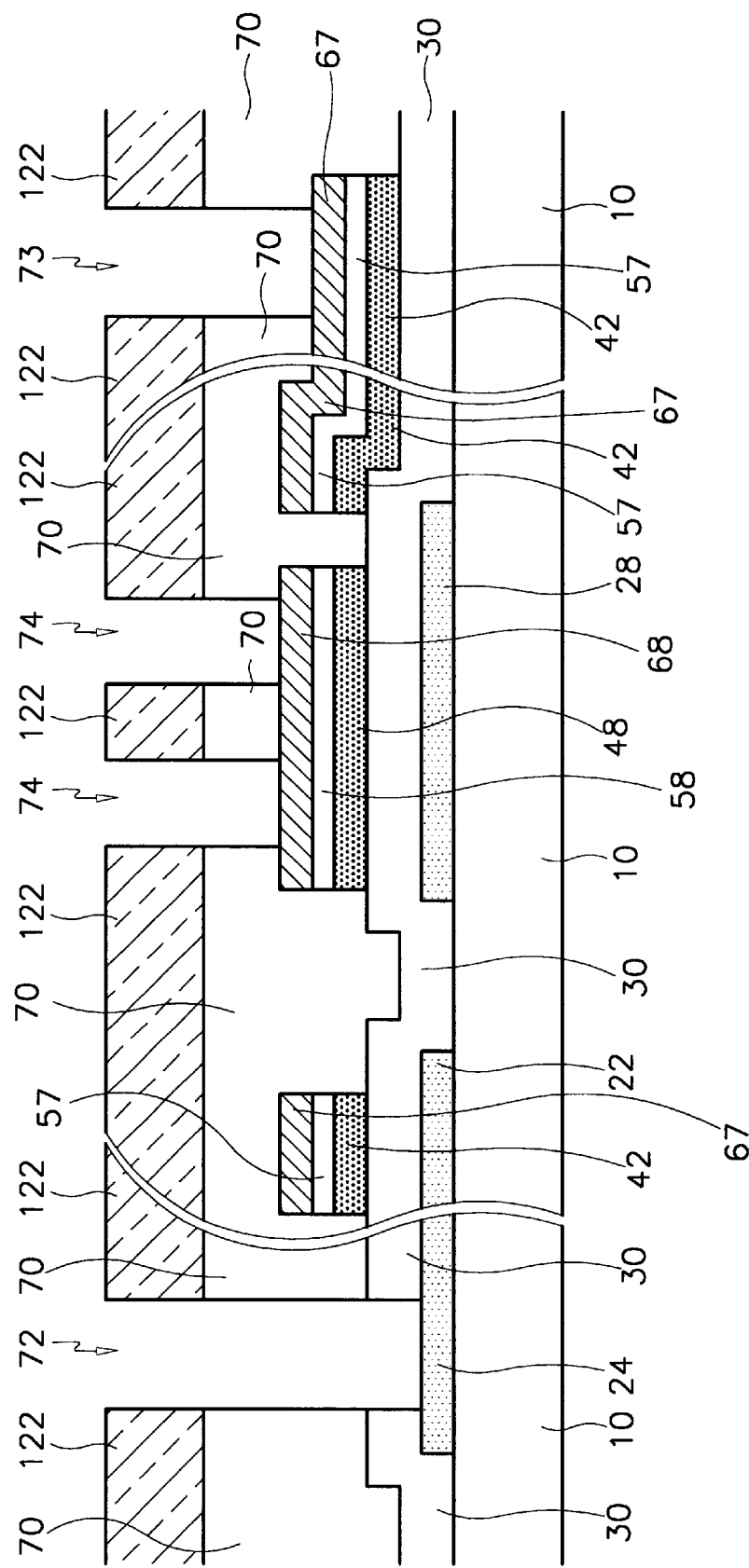
Figure 25B:
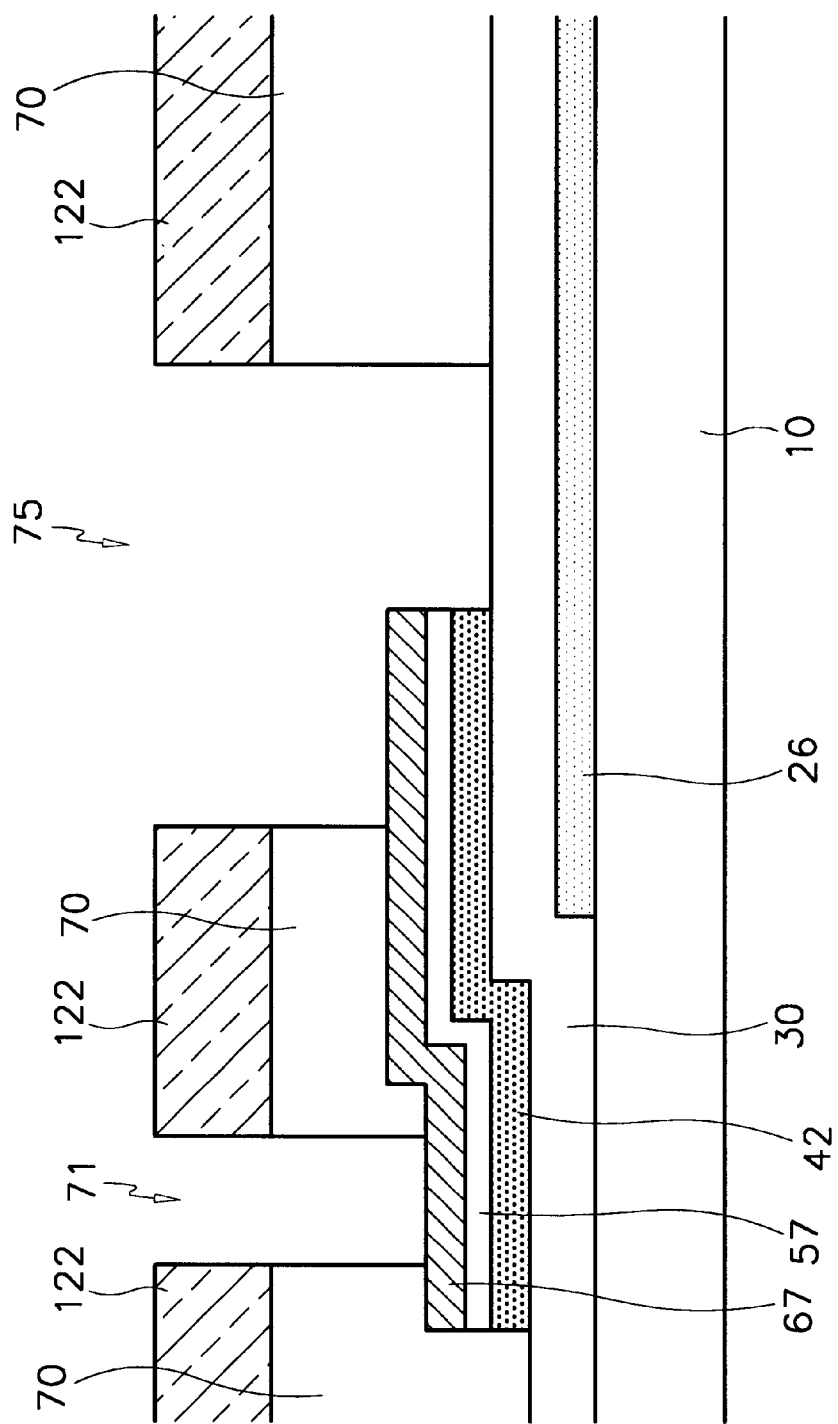

Then, as shown in FIGS. 25A and 25B, the thin portion 124 of photoresist layer on the channel and the underlying passivation layer 70 are etched at the same time, while etching the exposed passivation layer 70 and its underlying gate insulating layer 30. Since the passivation layer 70 and the gate insulating layer 30 need to be etched at the same time, it is preferable to make the passivation layer 70 of the same material as the gate insulating layer 30.

Thereby, the contact holes 71, 72, 73, and 74 and the opening 75 are finished, and the conductor pattern 67 for source/drain electrodes is exposed through opening 75.

Figure 26A:
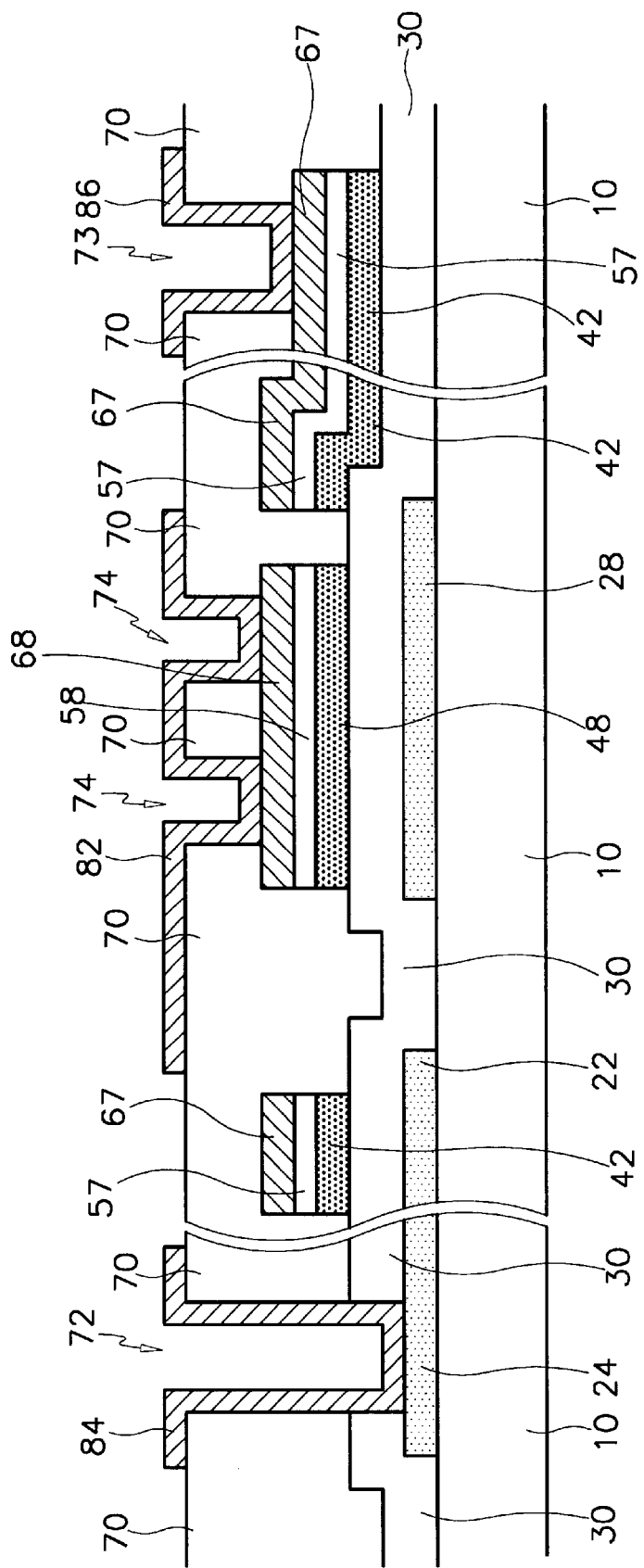
FIGS. 26A and 26B are cross-sectional views taken along the XIXB–XIXB' and XIXC–XIXC' of FIG. 19A, respectively, in the next manufacturing step of FIGS. 25A to 25B according to the third embodiment of present invention.
Figure 26B:
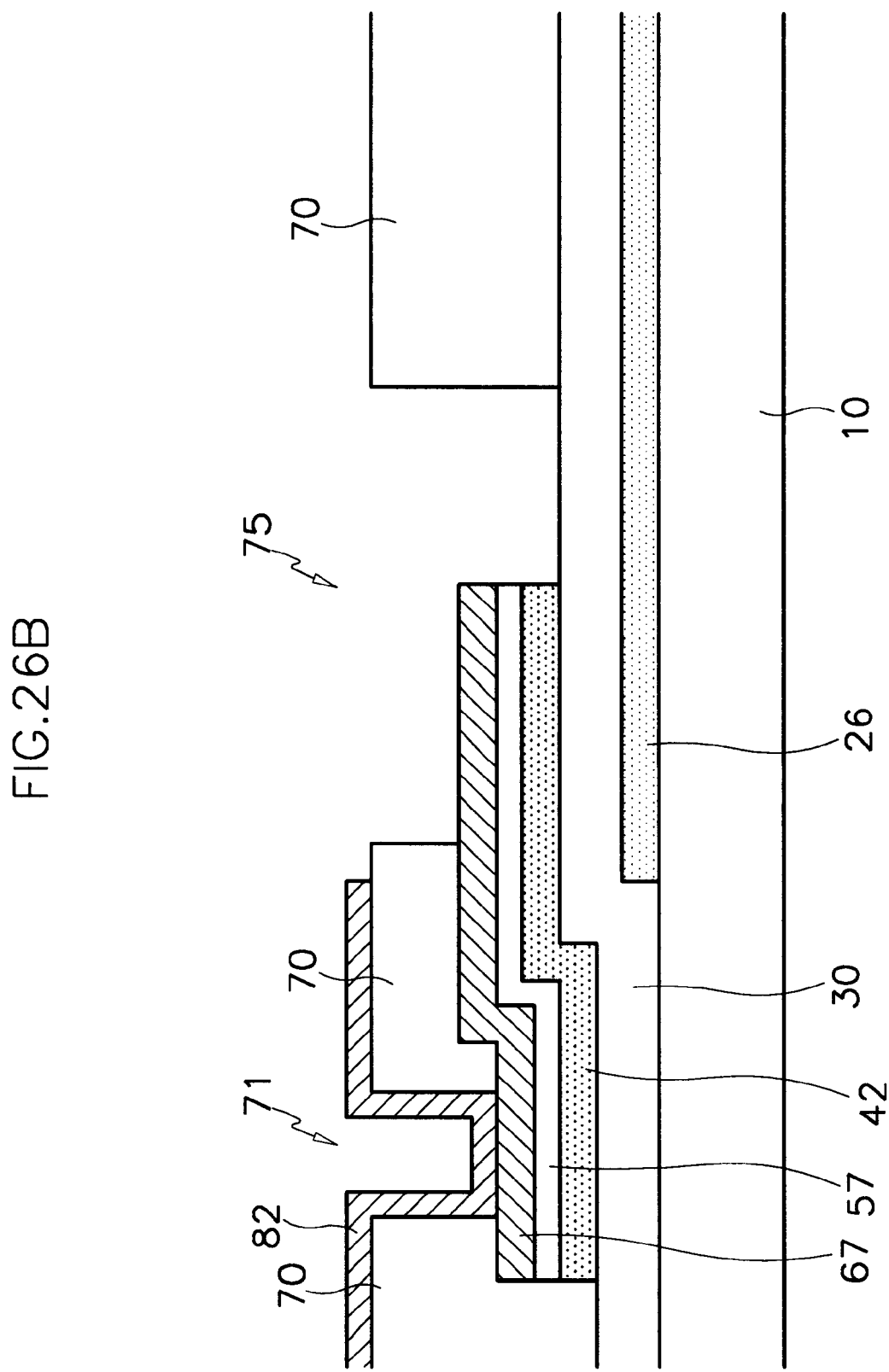

Next, as shown in the FIGS. 16, 26A and 26B, the photoresist pattern 122 is removed, and a conductor layer such as ITO is deposited. Then, the conductor layer is etched to form a pixel electrode 82, a redundant gate pad 84, and a data pad 86 using a fourth mask. Like the second embodiment, the redundant gate pad 84 and the redundant data pad 86 are essential.

Next, as shown in the FIGS. 14, 22, and 23, the source electrode 65 and the drain electrode 66 are separated by etching the conductor pattern 67 for source/drain electrodes and the underlying ohmic contact layer pattern 57 through the opening 75. This step is like that of the second embodiment.

A manufacturing method will now be described for a fourth embodiment of the present invention that features a liquid crystal display thin film transistor having channel portions C of 'U' shape. It will be explained with reference to FIG. 27. This fourth embodiment is rather different from the first, second, or third embodiments of this present invention.

Figure 27:
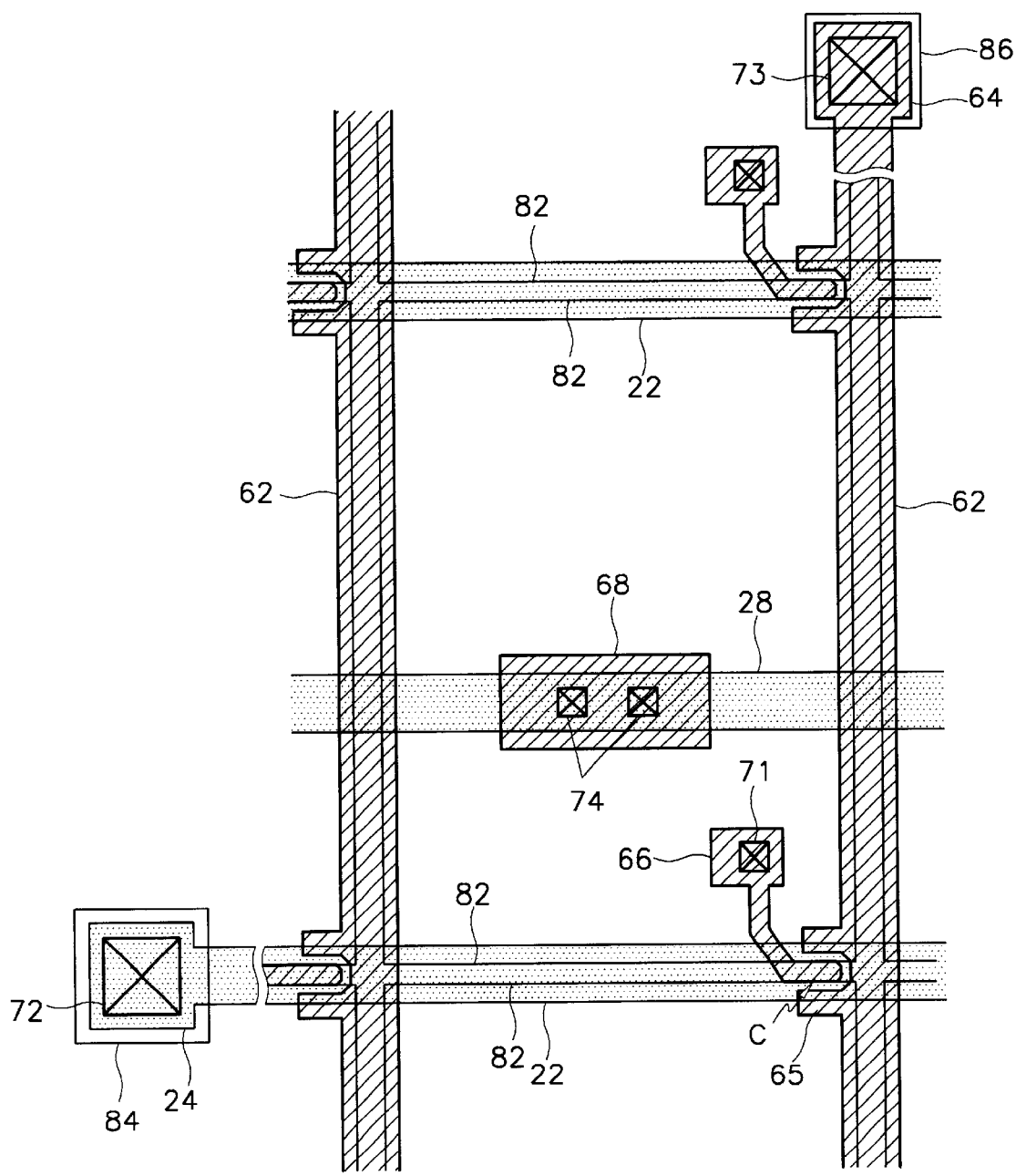
FIG. 27 is a layout view of a thin film transistor array panel for a liquid crystal display according to the fourth embodiment of the present invention.

FIG. 27 is a layout view of a thin film transistor array panel for a liquid crystal display according to the fourth embodiment of the present invention.

As shown in FIG. 27, most of structure is the same as that of the first embodiment.

However, the source electrode 65, which is a branch of the data line 60, is extended so that it overlaps slightly both of the edges of the gate electrode 26, and hence the data line 62 and the source electrode 65 are associated with the three sides of the 'U' shaped channel portion C. the drain electrode 66 in this embodiment extends to the open portion of the 'U' shaped channel portion C. This structure may obtain a wide channel width in a small area.

Because most of the cross sectional structures and the method for manufacturing a thin film transistor array panel for a liquid crystal display according to the fourth embodiment is the same as that of the first embodiment, a detailed description is omitted.

However, if the 'U' shaped channel portion C has sharp corners or edges, it is impossible for the photoresist pattern 114 to have a uniform thickness, due to the diffraction of light at the edge of the channel portion when exposing the channel portion C. In other words, if the channel portion C is '⊂' shaped to have angled corners where the two linear portions having different direction are joined, the light irradiation amount on the edge portion of the channel portion C is different from that of the other parts of the channel portion C due to light diffraction around the edge (boundary effect). Accordingly, the thickness of the developed photoresist pattern 114 is not uniform. If the corner portion is thinner than that of other portions, the thin film transistor may not work well enough. If the corner portion is thicker than the other portion, the thin film transistor may be connected to source and drain electrodes 65 and 66 (or underlying contact layer patterns 55 and 56). Accordingly, it is desirable that the corner portion of the channel portion C is removed by removing the photoresist pattern like in the part B of the first embodiment. This will be described through a fifth embodiment.

A thin film transistor array panel according to the fifth embodiment of the present invention will now be described with reference to the FIGS. 28 to 30.

Figure 28:
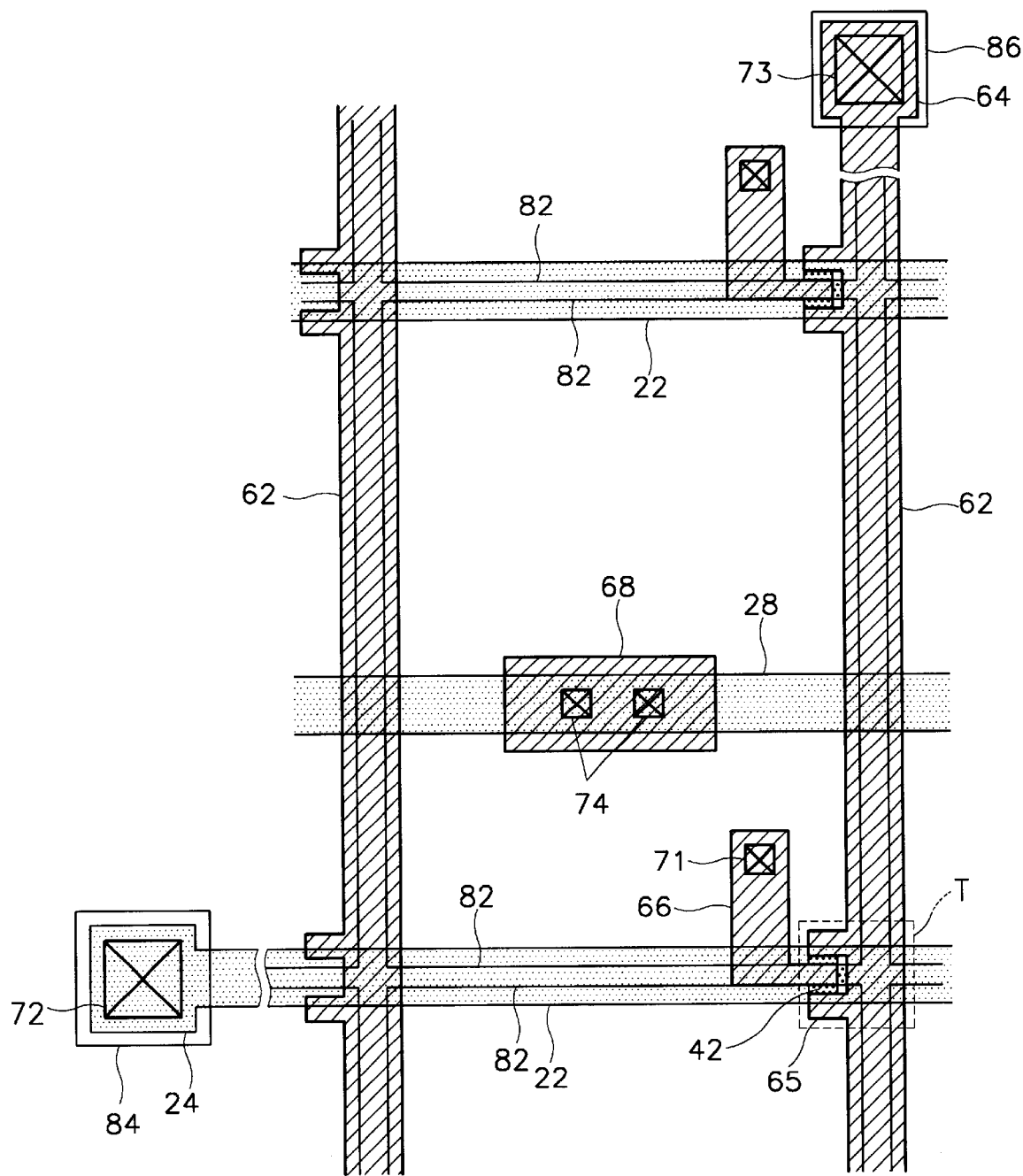
FIG. 28 is a layout view of a thin film transistor array panel for a liquid crystal display according to the fifth embodiment of the present invention.

FIG. 28 is a layout view of a thin film transistor array panel for a liquid crystal display according to the fifth embodiment of the present invention. FIG. 29 is an enlarged layout view of the T portion in FIG. 28, and FIG. 30 is a cross-sectional view taken along line XXX–XXX' of FIG. 29.

Figure 29:
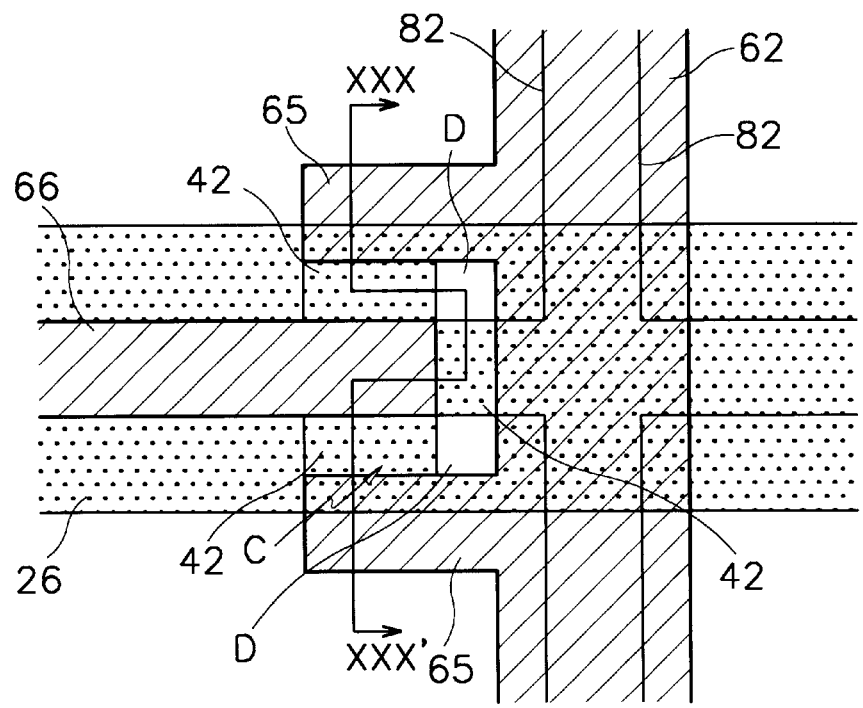
FIG. 29 is an enlarged layout view of the T portion in FIG. 28.
Figure 30:
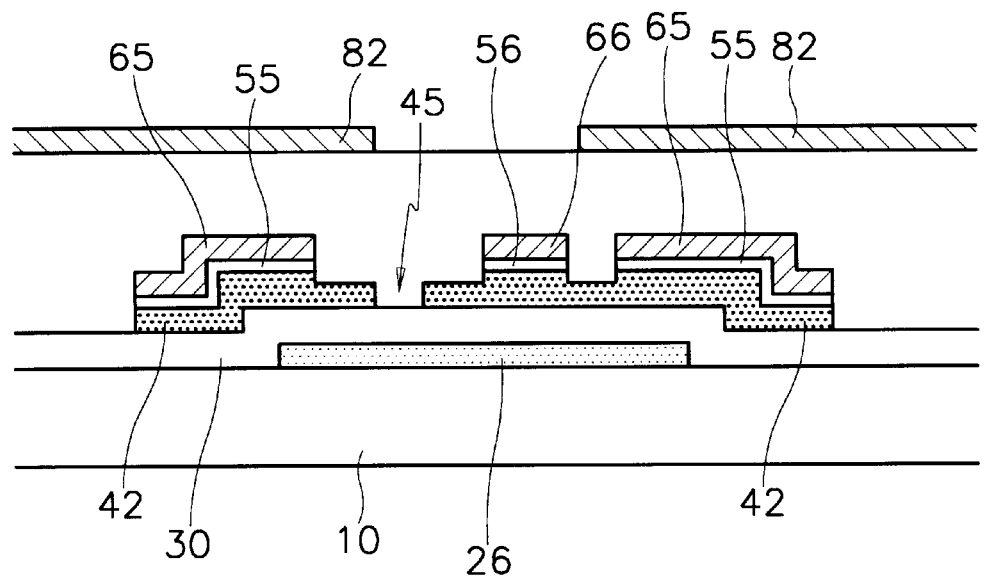
FIG. 30 is a cross-sectional view taken along line XXX–XXX' of FIG. 29.

As shown in FIGS. 28 to 30, most of the structure of the thin film transistor is the same as that of the fourth embodiment.

However, a channel portion C between a source electrode 65 and a drain electrode 66 has an angular '⊂' shape, and a semiconductor pattern has an opening 45 exposing a gate insulating layer 30 in the D part, which is a corner portion of the channel C. Here, the semiconductor pattern is completely removed in the D part.

A method for manufacturing a thin film transistor array panel according to the fifth embodiment of the present invention will now be described with reference to the FIGS. 28 to 31.

Figure 31:
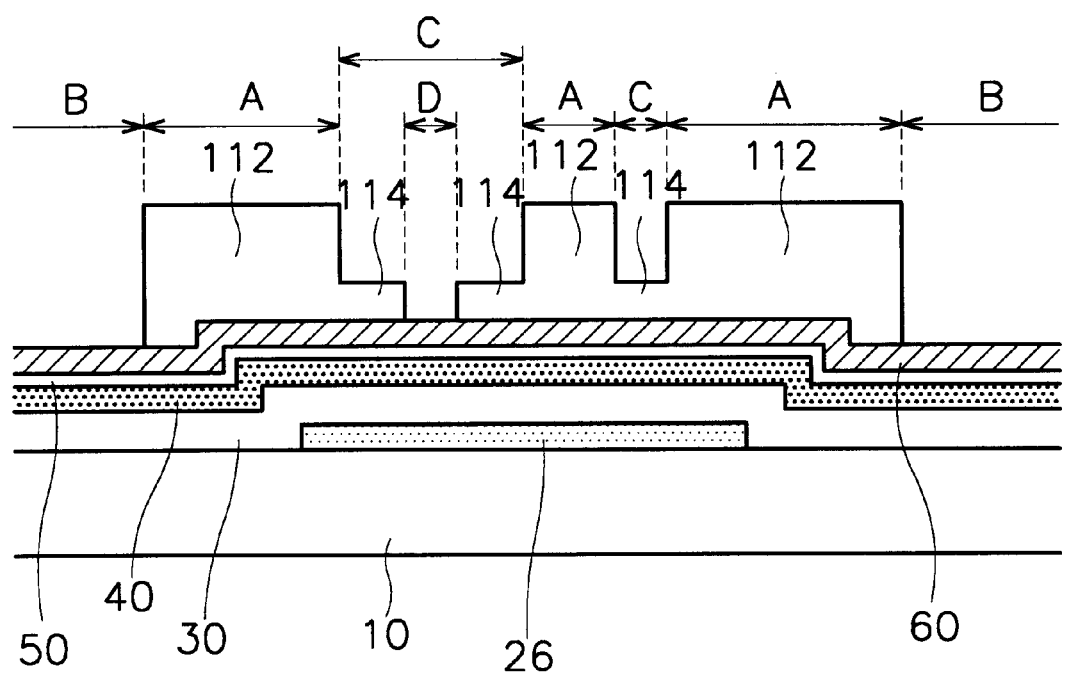
FIG. 31 is a cross-sectional view taken along the line XXX–XXX' of FIG. 29. Illustrating the method for manufacturing the thin film transistor array panel according to the fifth embodiment of the present invention.

FIG. 31 is a cross-sectional view taken along the line XXX–XXX' of FIG. 29 illustrating the manufacturing method of the thin film transistor array panel according to the fifth embodiment of the present invention.

A method for manufacturing a thin film transistor panel according to this embodiment is similar to that of the thin film transistor panel according to the first embodiment.

However, this method is different as the photoresist layer 110 is coated and exposed to light through a second mask, and developed to form a photoresist pattern 112 and 114 as shown in FIG. 31. At this time, the photoresist is completely removed in the corner portion D within the channel portion C and the B portions. As described above, the amount of light irradiation in the corner portion D within the channel portion C is different from that of the other portions of the channel portion C due to the boundary effect. Accordingly, the semiconductor pattern having a non-uniform thickness may be formed, or the source and the drain electrodes 65 and 66 (or the underlying contact layer patterns 55 and 56) may not be separated completely. Therefore, it is desirable that the photoresist pattern of the portion D is completely removed by irradiating enough lights like the semiconductor pattern of the B parts. Here, the second portion 112 of the data part A has the shape of the data wire parts 62, 64, 65, 66, and 68 including the angular ' ⊂ ' shaped source electrode 65.

Next, like the first embodiment, the exposed conductor layer 60 in portion B and portion D is etched. The underlying ohmic contact layer 50 and semiconductor layer 60 are removed by dry etching along with the first portion 114 of the photoresist. Then, the source electrode 65 and the drain electrode 66 are separated, and the semiconductor pattern 42 is exposed between the source electrode 65 and the drain electrode 66.

Accordingly, if the semiconductor layer of the corner portion of the channel portion C is removed, the semiconductor pattern 42 of the channel portion C may become uniform.

In this embodiment, the drain electrode 66 is extended to the opening of the source electrode 65, but the their positions may be changed. When forming the channel portion having a 'U' or 'J' shape in the fourth embodiment, the part of the semiconductor pattern between the source electrode 65 and the drain electrode 66 may not be removed by uniformly adjusting the irradiation amount of light of the channel portion. The structure of the photomask to form the photoresist pattern 114 having the uniform thickness will be described later.

On the other hand, like the first embodiment, the conductor layer 60, the contact layer 50 and the semiconductor layer 40 of the portion B are removed. The gate insulating layer 30 in the portion B remains. However, a part or all of the gate insulating layer 30 of the portion B may be removed. The method for removing all of the gate insulating layer 30 in the portion B will be described through the sixth embodiment.

Figure 32:
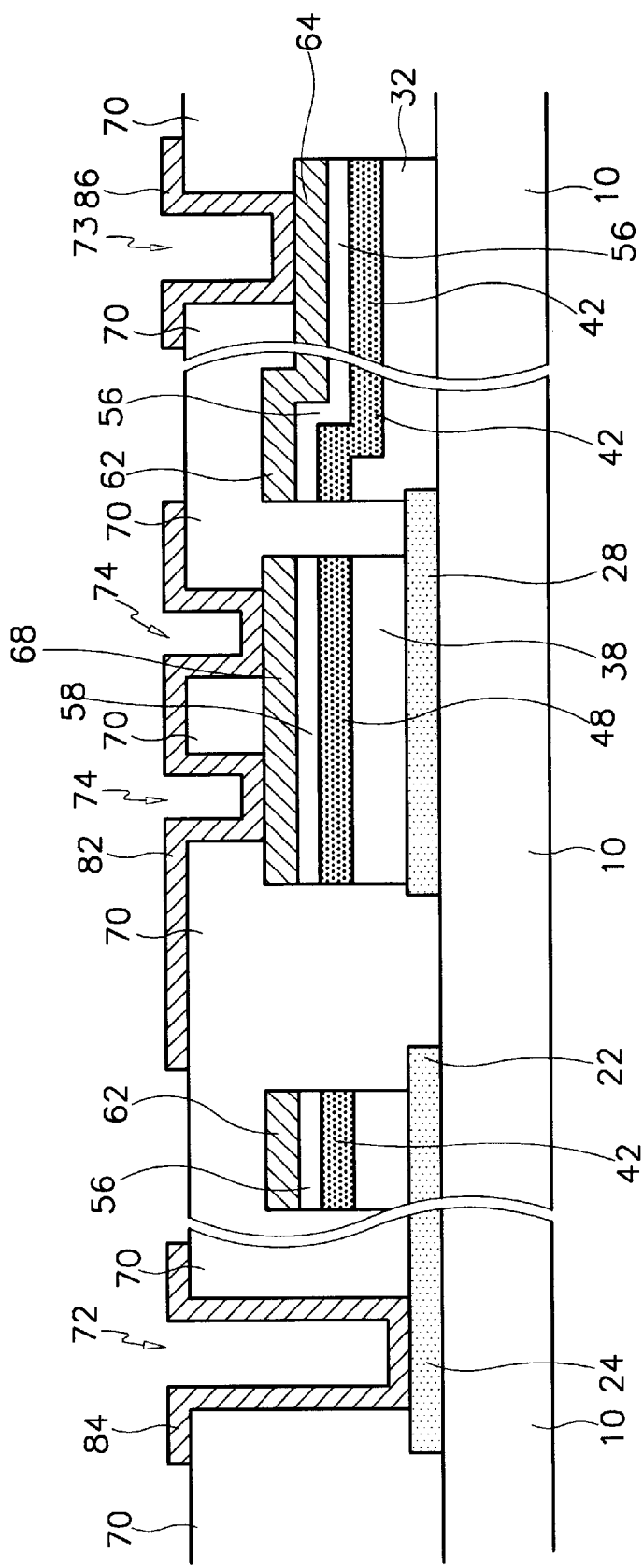
FIGS. 32 and 33 are cross-sectional views of a thin film transistor array panel for a liquid crystal display according to the sixth embodiment of the present invention, and taken along lines II–II' and III–III' of FIG. 1, respectively.
Figure 33:
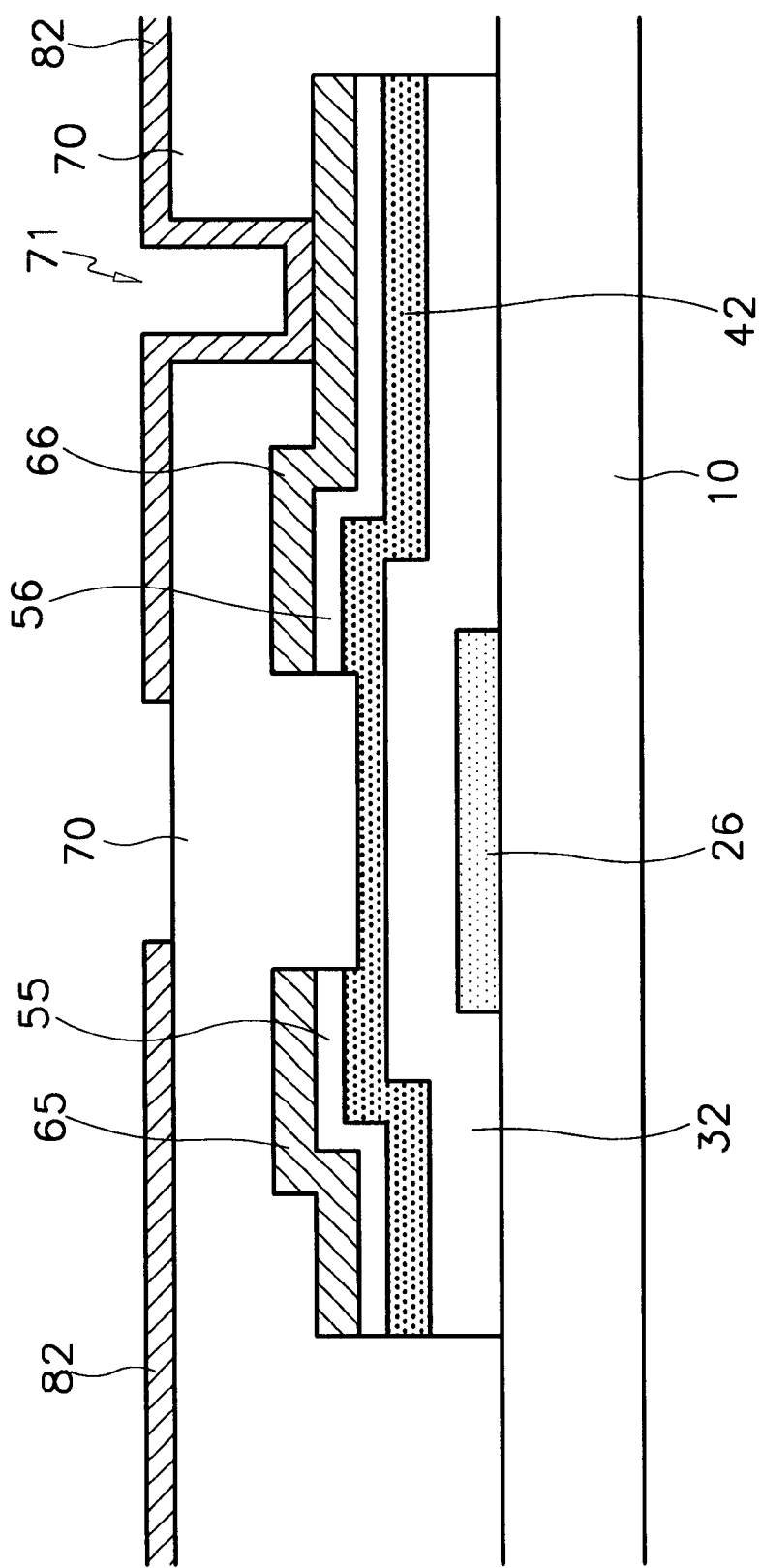

FIGS. 32 and 33 are cross-sectional views of a thin film transistor array panel for a liquid crystal display according to the sixth embodiment of the present invention, and taken along lines II–II' and III–III' of FIG. 1, respectively.

Most of the structure is similar to the first embodiment.

However, as shown in FIGS. 32 and 33, only the gate insulating layer pattern 32 and 38 under the semiconductor pattern 42 and 48 remain, and the substrate 10 and the gate wire parts 22, 24, 26, and 28, which are not covered by the gate insulating layer pattern 32 and 38, are covered by the passivation layer 70.

The manufacturing method of the thin film transistor array panel according to the sixth embodiment of the present invention will now be described with reference to the FIGS. 32, 33, 34A and 34B.

Figure 34A:
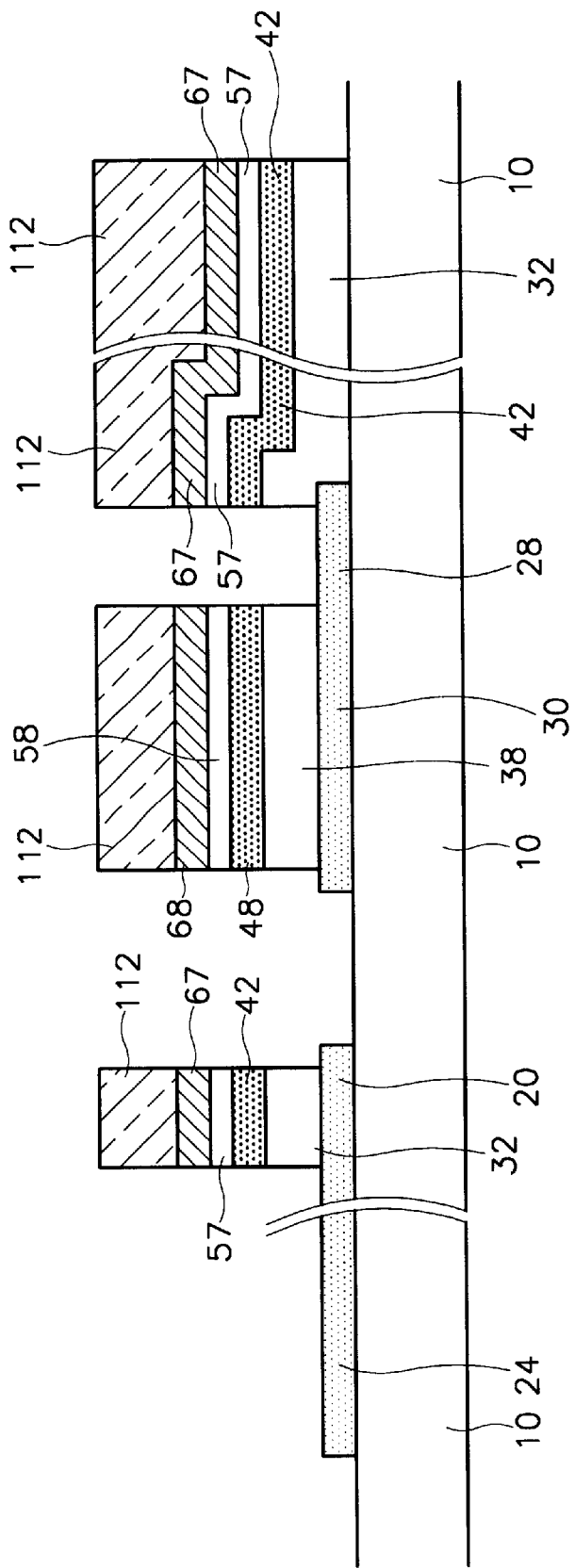
FIGS. 34A and 34B are cross-sectional views Illustrating the manufacturing method of the thin film transistor array panel according to the sixth embodiment of the present invention in the next manufacturing step of FIGS. 10A and 10B, taken along the lines VIB–VIB' and VIC–VIC' of FIG. 6A, respectively.
Figure 34B:
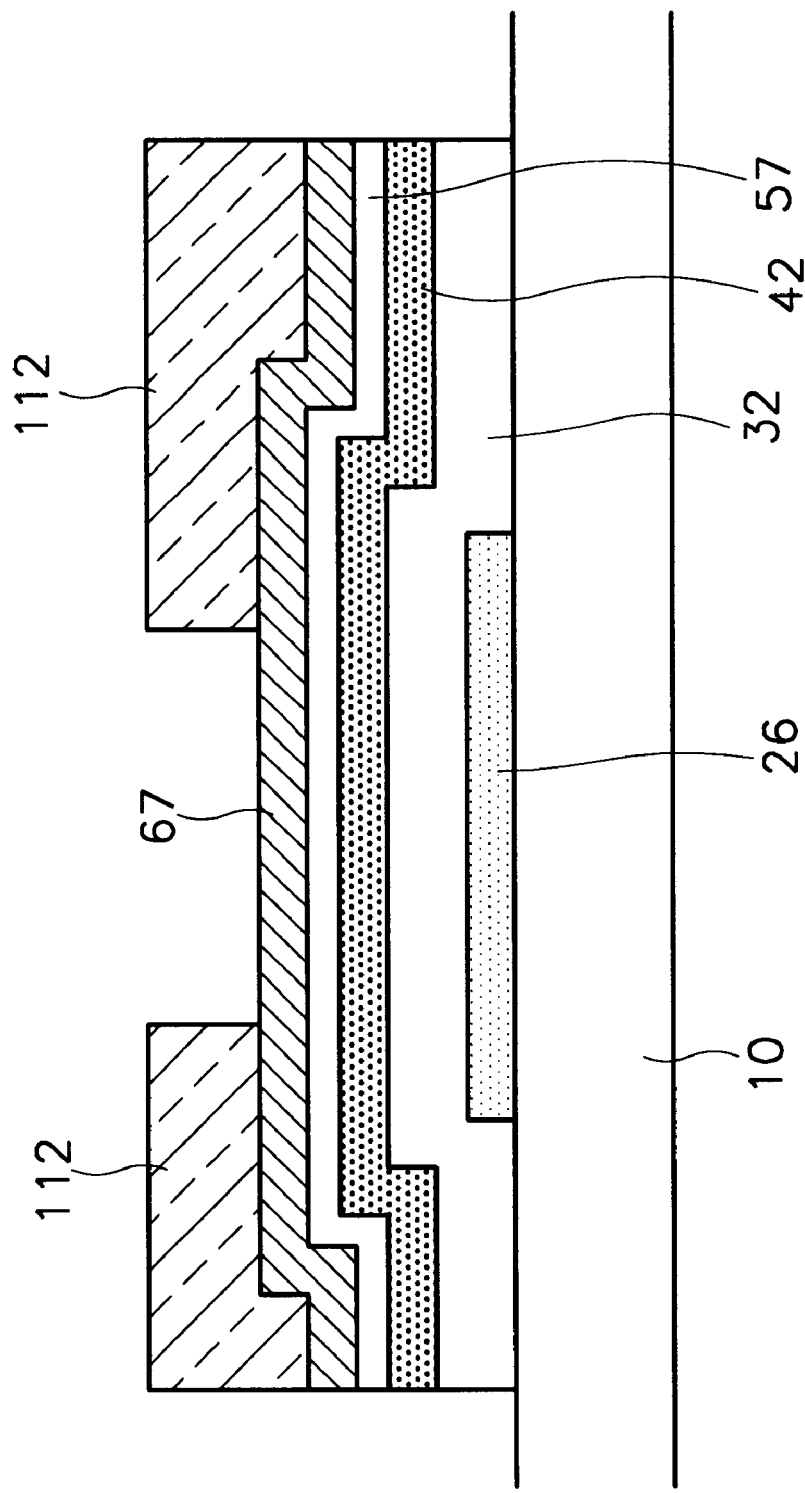

FIGS. 34A and 34B are cross-sectional views illustrating the method for manufacturing the thin film transistor array panel according to the sixth embodiment of the present invention in the next manufacturing step of FIGS. 10A and 10B, taken along the lines VIB–VIB' and VIC–VIC' of FIG. 6A, respectively.

As shown in FIGS. 10A and 10B, the manufacturing process according to the sixth embodiment is the same as that of the first embodiment up until etching the conductor layer 60 of the portion B to expose the ohmic contact layer 50 thereunder.

However, as shown in FIGS. 34A and 34B, the difference is that the exposed contact layer 50, the semiconductor layer 40 and the underlying gate insulating layer 30 of the portion B are etched along with the first portion 114 of the photoresist pattern to expose the source/drain conductor pattern 67 and to form the gate insulating patterns 32 and 38 and the semiconductor patterns 42 and 48.

Next, as shown in FIGS. 32 and 33, the data wire parts 62, 64, 65, 66, and 68, and the underlying ohmic contact layer patterns 55, 56, and 58 are completed by dividing the source electrode 65 and drain electrode 66. The passivation layer 70 is formed having contact holes 71, 72, 73, and 74 respectively exposing the drain electrode 66, the gate pad 24, the data pad 64, and the conductor pattern 68 for storage capacitor, and made of an insulating material such as SiNx, organic material. And the pixel electrode 82 of ITO, the redundant gate pad 84, and a redundant data pad 86 are formed to complete the thin film transistor array panel for a liquid crystal display according to the present invention.

Next, the structure of the photomask for forming a photoresist pattern having locally different thicknesses according to the embodiments of the present invention will be described in detail, particularly the channel portion C of the photomask having the minute pattern of a size smaller than the resolution of the exposure device used in the exposing step.

Figure 35A:
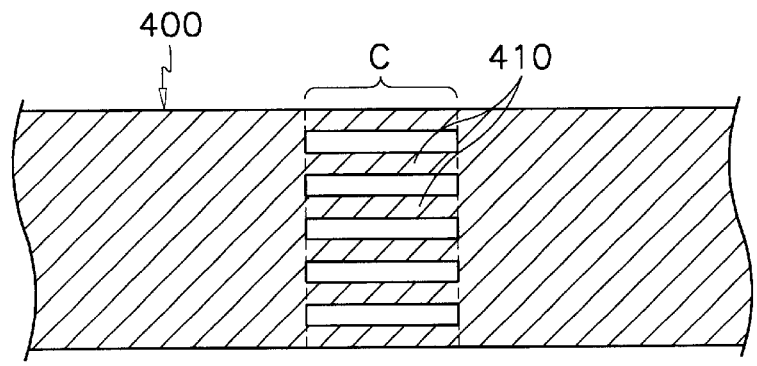
FIGS. 35A to 35C are layout views of the channel portion in the second photomask used in the manufacturing method of the thin film transistor array panel according to the embodiments of the present invention.
Figure 35B:
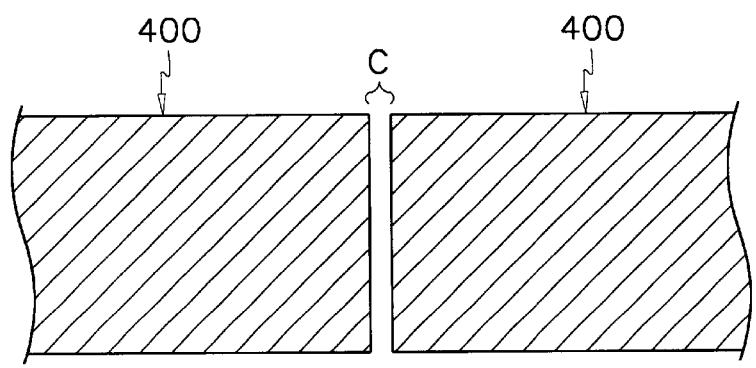
Figure 35C:
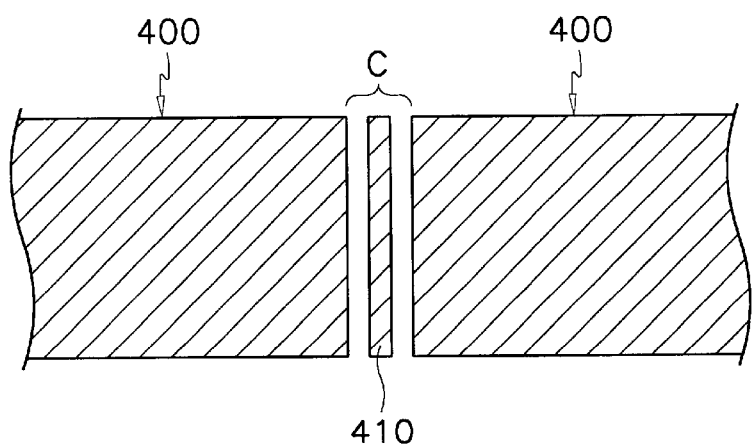

FIGS. 35A to 35C are layout views of the channel portion in the second photomask having the minute pattern used in manufacturing the thin film transistor array panel according to the embodiments of the present invention. Here, a source/drain mask pattern is formed at both sides of the slit patterns and the portion where the slit patterns are formed is referred to as a channel portion of the photomask.

Electron Beams or lasers are used to form a photomask. At this time, it is desirable that the pitches of the slit patterns are greater than 1 μm. Furthermore, the pitches of the slit patterns need to be smaller than the resolution of the light source in the exposing step, more preferably smaller than a half of the resolution. Accordingly, when the resolution of the light source is 3~4 μm, it is desirable that the pitch of the slit patterns is in the range of 1~2 μm.

At this time, many slit patterns may be formed in the channel portion C of the photomask 400 as shown in FIG. 35A. The channel portion C of the photomask 400 may be like the slit pattern as shown in FIG. 35B and the slit pattern may have to have a bar 410 in the channel portion C as shown in FIG. 35C.

However, when forming a photoresist pattern with a thickness of 2,000~4,000 Å by using the photomask of FIGS. 35A to 35C to expose photoresist, the photoresist pattern may not be formed with a uniform thickness.

Figure 36A:
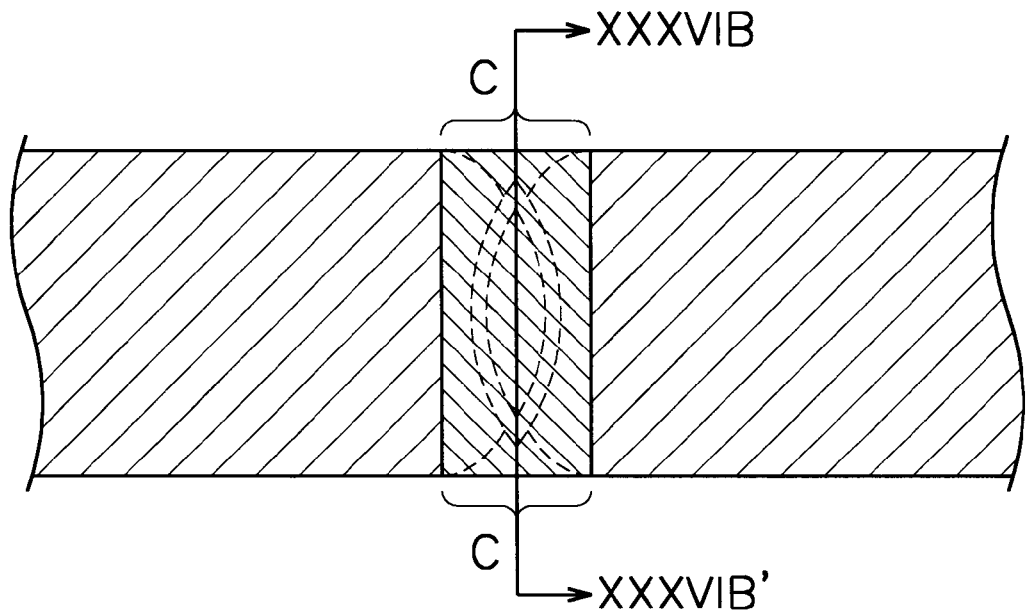
FIGS. 36A and 36B are views of photoresist pattern formed through the photomask of FIGS. 35A to 35C.
Figure 36B:
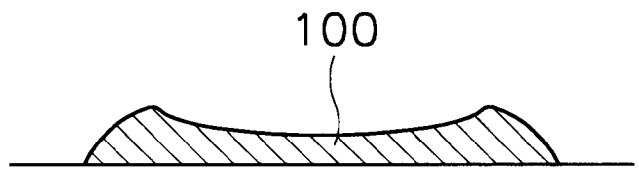

FIGS. 36A and 36B are views of photoresist pattern formed through the photomask of FIGS. 35A to 35C, and FIG. 36B is a cross-sectional view taken along the lines XXXVIB–XXXVIB' in FIG. 36A.

As shown in FIGS. 36A and 36B, the thickness of the photoresist pattern 100 in the center portion of the channel portion C is uniform, but the thickness of the photoresist pattern 100 is thicker than that of the boundary portion of channel portion C. This is because the photoresist pattern of the boundary portion of channel portion C is less exposed than the center portion of the channel portion C due to the boundary effect.

Accordingly, in order to eliminate the boundary effect and form a uniform thickness at all portions of the photoresist pattern having three different levels of thickness using the second photomask, or more particularly the middle level of the thickness in the photoresist pattern ("114" in the first embodiment or "100" in FIG. 36B), it is desirable that the second photomask has four regions having different levels of transmittance. The photomask includes a first region transmitting the grater part of light, a second region blocking the greater part of light, a third region partly controlling the transmittance of light, a fourth region interposed at the boundary portion between the first part and the third part, and having the transmittance value somewhere between the transmittance values of the first and third parts. At this time, to control the transmittance of the third and fourth regions, the openings of the patterns need to be made smaller than the resolution of the exposure device, and the semitransparent layer having a transmittance higher than that of the second part may be formed in the third and fourth regions. These methods may be mixed. This means that the pitches of slit patterns are less than 3~4 µm, when using the photomask having the same magnification as that of the liquid crystal display array panels and the exposure device of the resolution with 3~4 µm. Of course, the thickness of the photoresist pattern may be controlled by adjusting the pitches of slit patterns to regulate the transmittance of photomask. In order to form a semiconductor pattern having a uniform thickness in the channel portion C, a photoresist pattern with a uniform thickness needs to be achieved.

The former cases will be described through FIGS. 37A to 39C, and the latter cases will be described through FIGS. 40A to 40E.

Figure 37A:
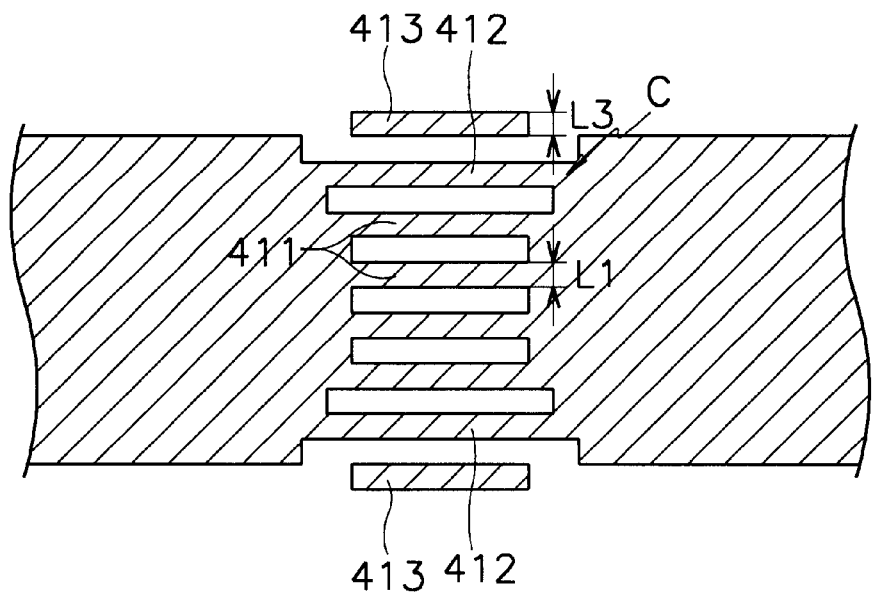
FIGS. 37A to 37C are layout views of the channel portion in the new second photomask used in the method for manufacturing the thin film transistor array panel according to the embodiments of the present invention.
Figure 37B:
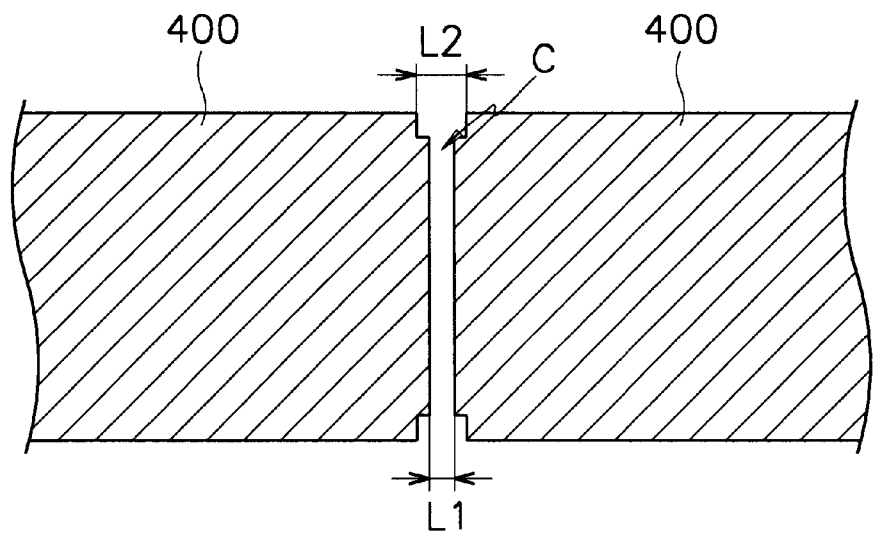
Figure 37C:
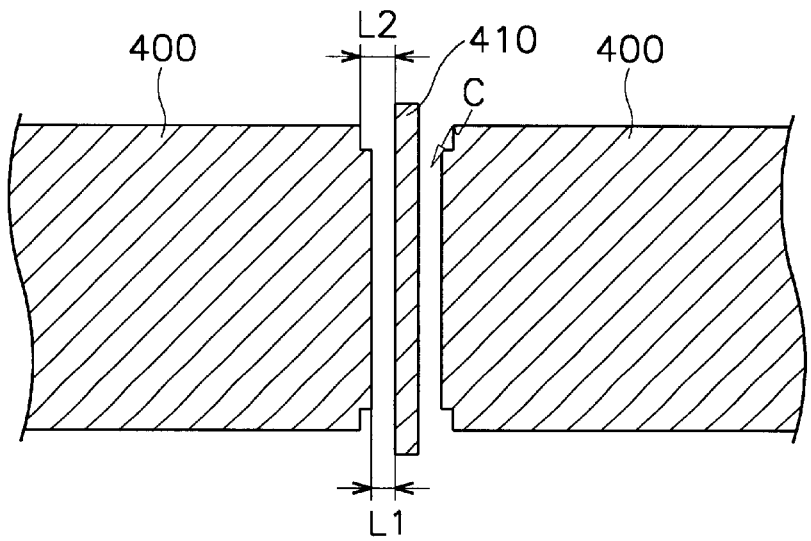

FIGS. 37A to 37C are layout views of the channel portion in a new second photomask used in manufacturing the thin film transistor array panel according to the embodiments of the present invention.

As shown in FIG. 37A, a large number of slit patterns 412 and 411 are formed in a channel portion C of a photomask 400. The slit patterns 412 of the edge part are longer than the slit patterns 412 of the center part, and slit patterns 413 with a bar shape are formed outside the slit patterns 412. Here, the slit patterns 412 and 413 are altered to increase the light transmittance of the edge portion of the boundary region of the channel portion C. At this time, it is preferable that the width L3 of slit patterns 413 are narrower than the width L1 of the slit patterns 411, more preferably by about 80% of L1.

The structure of FIGS. 37B and 37C is similar to that of FIGS. 35B and 35C, but the intervals L2 of the edge portion of the channel C are longer or wider than L1 of the center portion of the channel portion C.

Figure 38A:
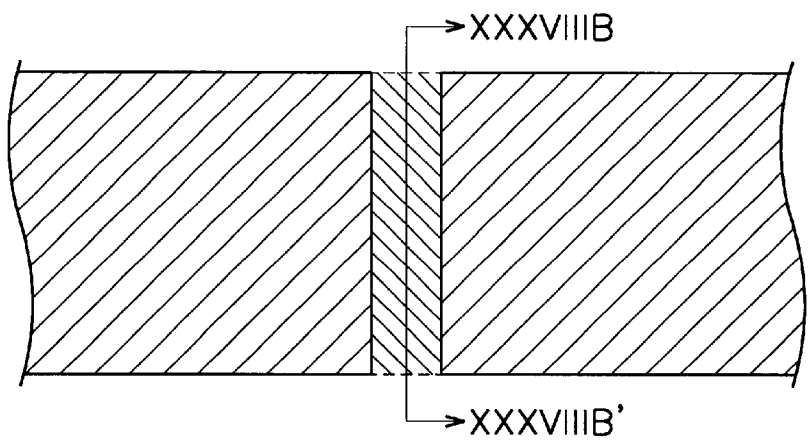
FIGS. 38A and 38B are views of a photoresist pattern formed through the photomask of FIGS. 37A to 37C.
Figure 38B:
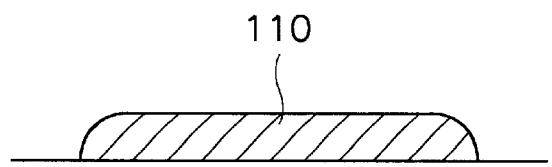

FIGS. 38A and 38B are views of a photoresist pattern formed by using the photomask of FIGS. 37A to 37C, and FIG. 38B is a cross-sectional view taken along the lines XXXVIIIB–XXXVIIIB' in FIG. 38A.

As shown in FIGS. 38A and 38B, a photoresist pattern 110 having a uniform thickness can be formed by using the photomasks of FIGS. 37A to 37C having a pattern with a longer or wider slit at the boundary of the channel portion C.

Next, the structure of masks having a channel portion with an open-ring structure will be described.

Figure 39A:
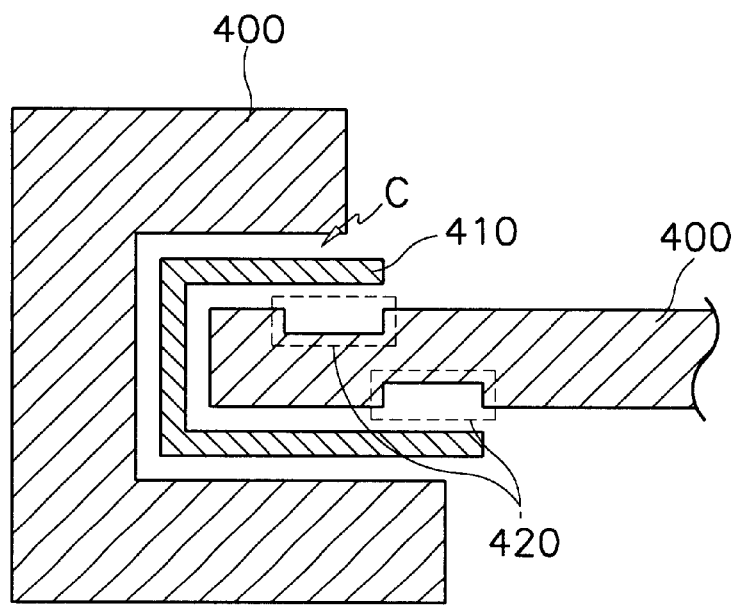
FIGS. 39A to 39C are layout views of the channel portion having an open-ring structure in the second photomask used in the method for manufacturing the thin film transistor array panel according to the fourth embodiments of the present invention.
Figure 39B:
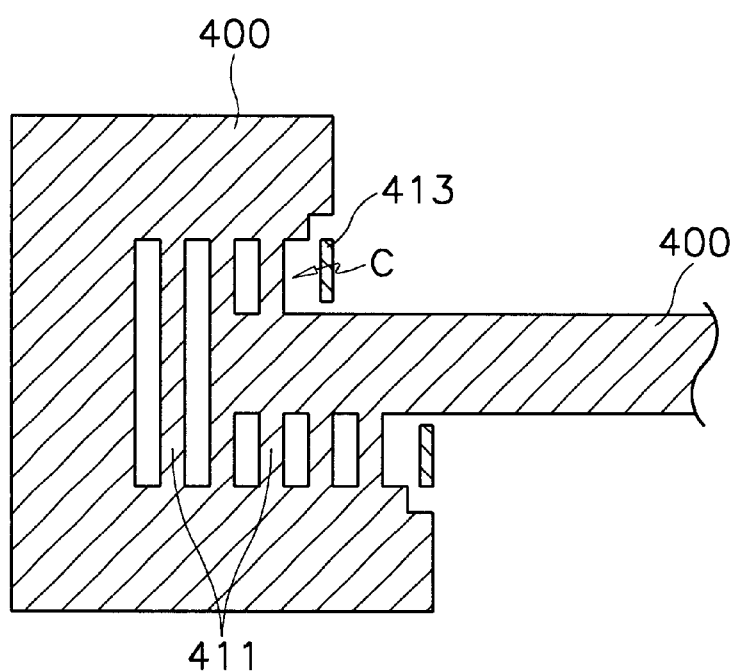
Figure 39C:
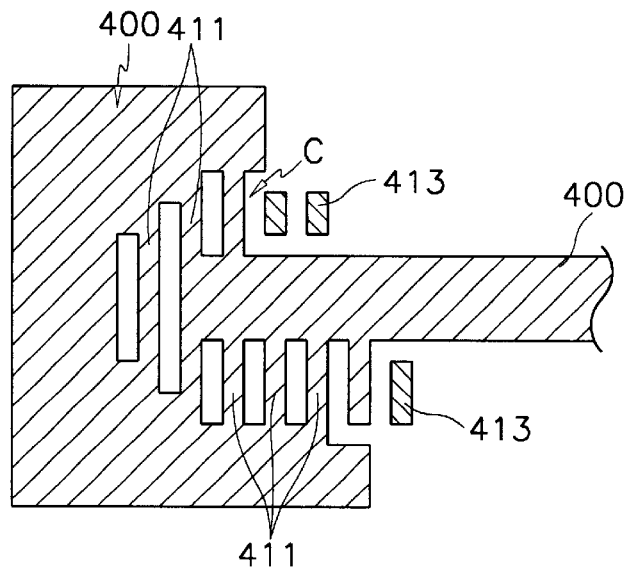

FIGS. 39A to 39C are layout views of the channel portion in the second photomask for a thin film transistor array panel having an open-ring structure according to the embodiments of the present invention. Here, the mask pattern for source and drain electrodes is formed at both sides of the channel portion C.

As shown in FIGS. 39A to 39C, channel portions C are formed with an open-ring or in a semicircular shape, and slit patterns with wide intervals or with a bar are formed to eliminate the boundary effects by increasing the light transmittance at the boundary region of the channel portion.

A slit pattern 410 with a bar shape as shown in FIG. 37C is formed within the channel portion C of FIG. 39A and the width of the concaved edge portions 420 of the mask 400 of the channel portion C are wider than its other portions to increase the light transmittance at the boundary region of the channel portion C.

A large number of slit patterns 411 in the channel portion C of FIG. 39B are formed like in FIG. 37A. Here, the edge portion of the channel portion C is wider or longer than the center portion of the channel portion C, and slit patterns 413 that is smaller than silt patterns 411 are formed with a bar shape at both ends of the channel portion C.

The structure of FIG. 39C is similar to that of FIG. 39B, but is proposed for forming a photoresist pattern having a uniform thickness for a channel portion C having a sloped-in edge.

Next, the latter cases will be described.

Figure 40A:
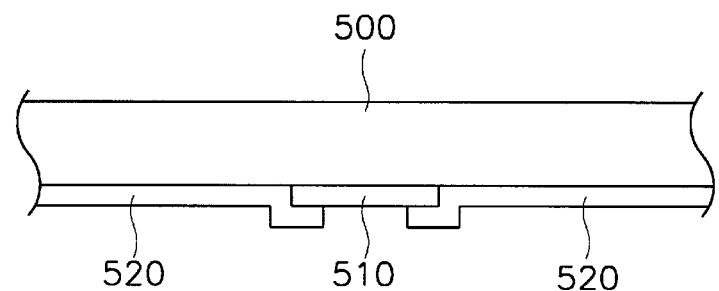
FIGS. 40A to 40E are layout views of the channel portion in the second photomask having transmittance control layer in the method for manufacturing the thin film transistor array panel according to the embodiments of the present invention.
Figure 40B:
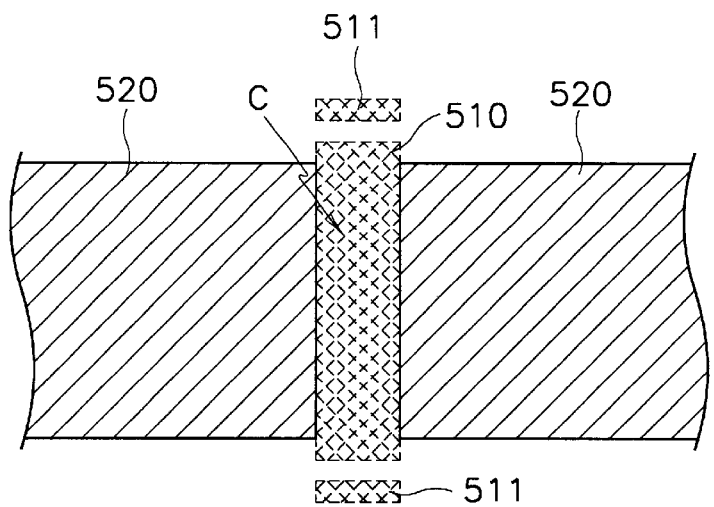

FIGS. 40A to 40E are views of the channel portion in the second photomask having a transmittance control layer used in manufacturing method the thin film transistor array panel according to the embodiments of the present invention. FIGS. 40A, 40C, 40D and 40E are layout views showing various structures of the second photomask, and FIG. 40B is a cross sectional view of FIG. 40A.

As shown in FIGS. 40A and 40B, a transmittance control layer 510 made of MgO, a-Si, or MoSi is formed on a mask substrate 500, and an opaque pattern 520 exposing the transmittance control layer 510 through a channel portion C and made of opaque material such as chromium is formed. Furthermore, transmittance control layers 511 are formed at both sides of the channel portion C neighboring the transmittance control layer 510 in order to remove boundary effects. Here, it is preferable that the width of the transmittance control layer 511 is narrower than a half of the resolution of the light used in the exposing step.

Figure 40C:
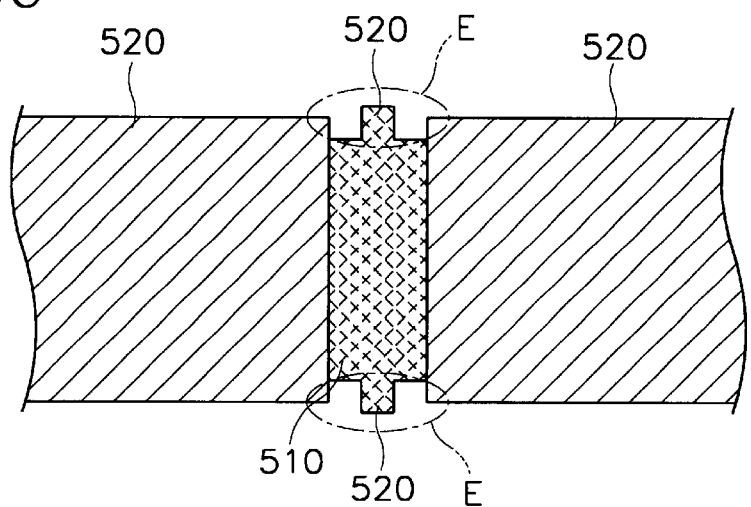
Figure 40D:
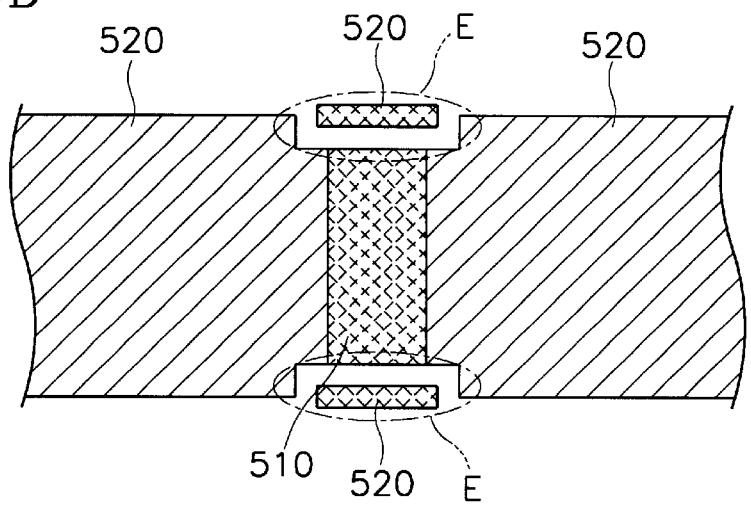
Figure 40E:
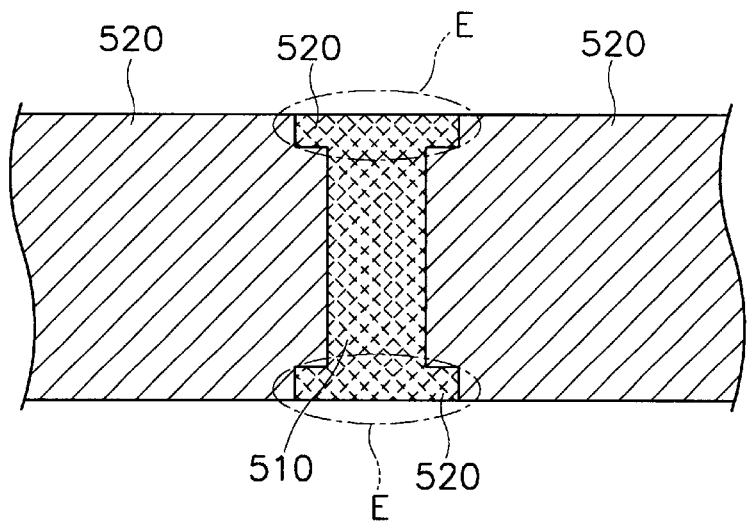

The structure of the transmittance control layers 510 and 520 or mask substrate 500 may vary to increase the light transmittance at the boundary region E of the channel portion C as shown in FIGS. 40C to 40E. The width of the transmittance control layer 520 of the boundary region E in FIG. 40C is narrower than that of other portions of transmittance layer 510. The intervals of the mask substrate 500 of the boundary region E are widened and the transmittance control layers 520 with the bar shape of the boundary region E in FIG. 40D are formed. The intervals of the mask substrate 500 of the boundary region E is widened and the width of the transmittance control layer 520 of the boundary region E in FIG. 40E is wider than that of other portions of the transmittance control layer 510. Of course, the structures of the channel portion C and the transmittance control layers 510 and 520 may vary.

As illustrated by these drawings, it is preferable that the photomask forming a photoresist pattern having three different levels of thickness may have four regions having different levels of transmittance. That is to say, the photomask includes a first region having a pattern more opaque than the resolution of the exposure device used in the exposing step, a second region having a pattern more open than the resolution, a third region with an intermediate level of light transmittance having a pattern more minute than the resolution and a fourth region having a pattern less minute than the resolution but a higher transmittance level than that of the third region.

When the photoresist layer is positive, the first region, the third region, and the fourth region are respectively aligned to the data wire portion, the channel portion, the boundary portion of the channel portion. On the other hand, when the photoresist layer is negative, the second region, the fourth region, and the third region are respectively aligned to the data wire portion, the channel portion, the boundary portion of the channel portion.

Here, when the resolution of equipment is 3 μm, the widths of the slit patterns and their intervals are designed to be about 1~1.5 μm.

The openings between the slit patterns 412 and 413 are widened to increase the transmittance of light in FIG. 37A. The size of slit patterns 400 of the boundary region are made smaller than the resolution of exposure device but bigger than that of the center portion to increase the light transmittance in FIGS. 37B and 37C. FIGS. 39A to 39C show the shapes of the channel portion C using variations of the above methods.

Design rules of the intervals and widths of slit patterns of the photomask to form a photoresist pattern for uniform thickness in forming a channel portion with an open-ring or semicircular shape having a sloped curve will now be explained.

Figure 41:
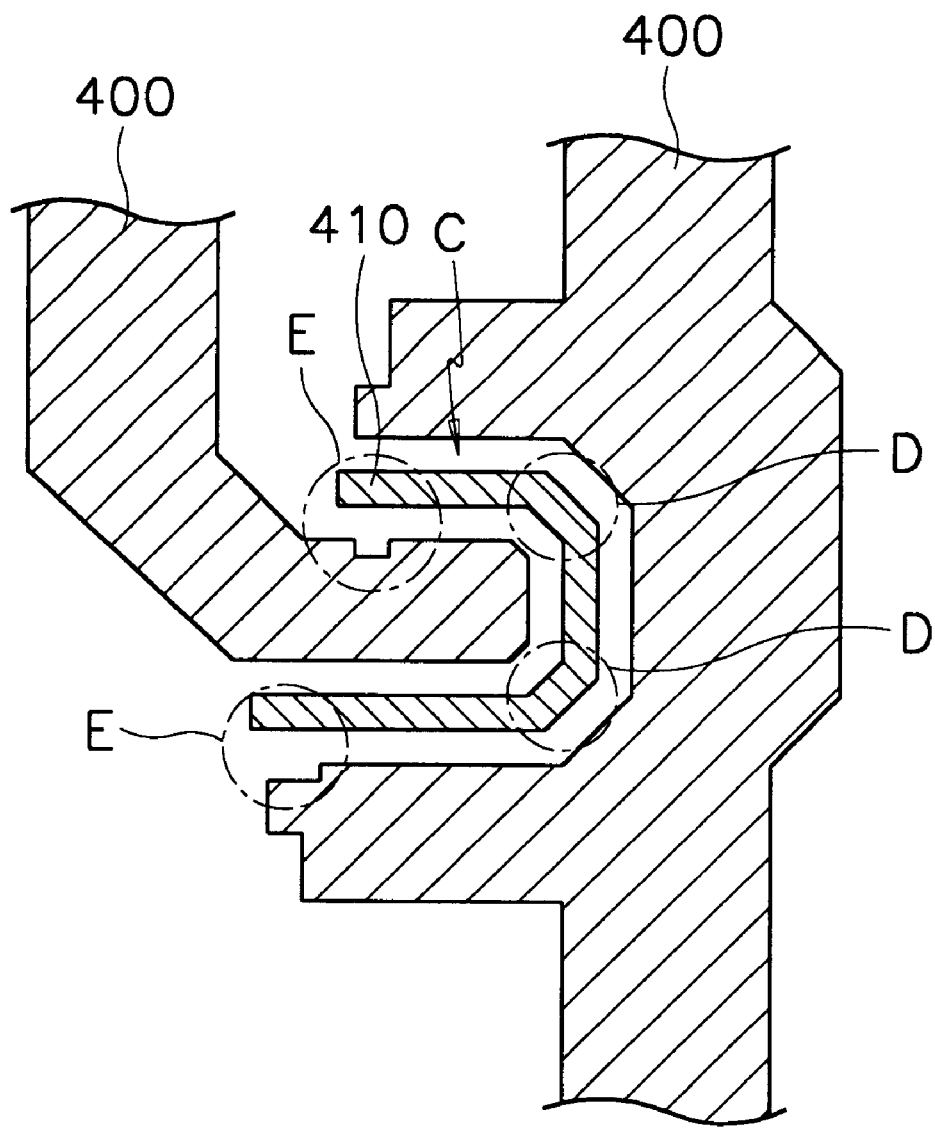
FIGS. 41 and 42 are layout views of the channel portion in the second photomask used in the method for manufacturing the thin film transistor array panel according to the fourth embodiments of the present invention.
Figure 42:
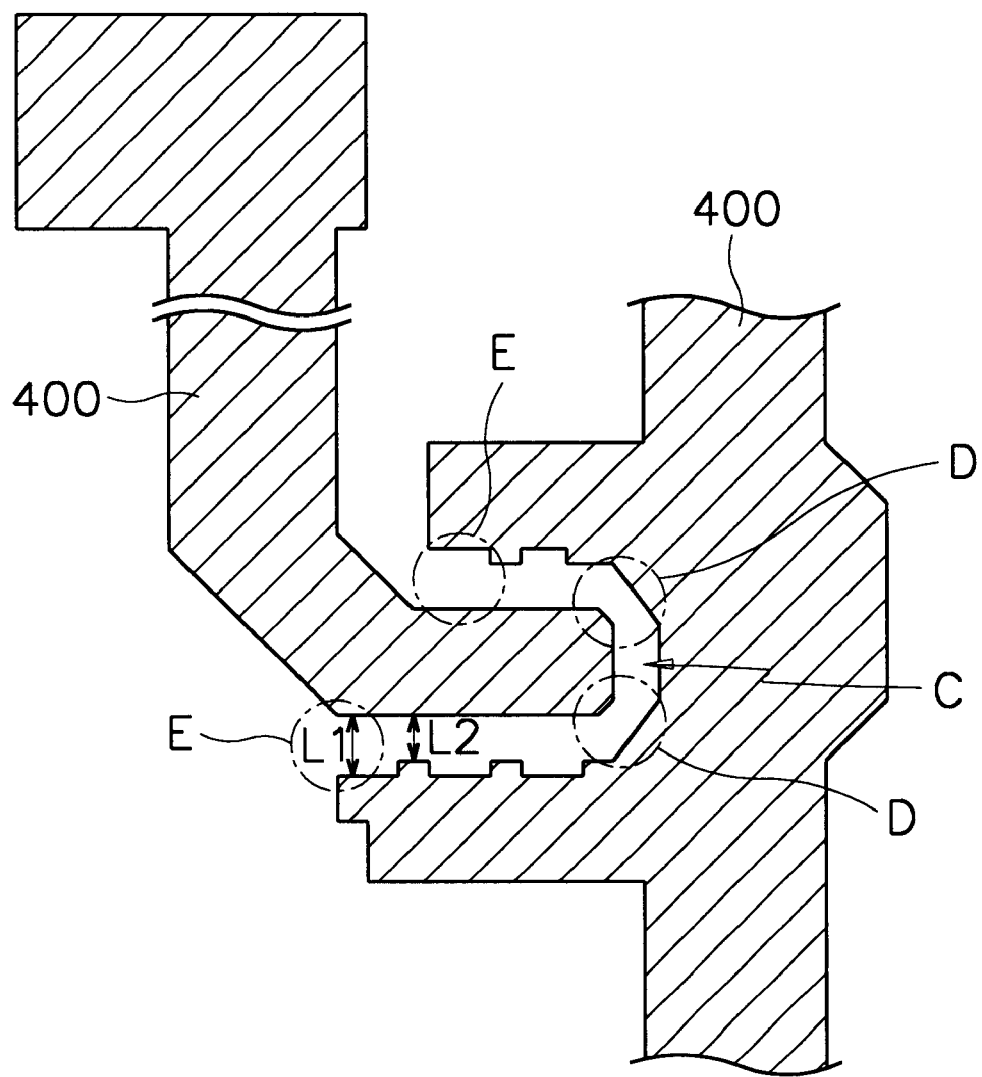

FIGS. 41 and 42 are layout views of the channel portion in a second photomask used in manufacturing the thin film transistor array panel according to the fourth embodiments of the present invention.

The structure of slit pattern having a bar formed with in a channel portion C of FIG. 41 is similar to that of FIG. 39, and a channel portion C is formed as a slit pattern.

However, the channel portion C with "U" or "J" shape has a slope curve of 45° in the bending portion D, not a sharp 90° turn such as FIG. 39A. Also, the channel portion C is larger than the other portions to form a photoresist pattern of a uniform thickness by increasing the light transmittance at end portions E.

As shown in FIG. 41, it is preferable that the width of slit patterns 410 in the bending portion D, and the intervals between slit patterns 410 or the mask patterns 400 for the source and drain electrodes are wider than other portions (except for the bending portion D) to increase the transmittance of light. Furthermore, it is preferable that the boundary portion E at the end of the channel portion C is wider than other portions. Here, it is desirable that the design rule of the width of the bending portion D be in the range of 1.41±0.05 to 1.24±0.05 μm, and other portions except for the bending portion D are in the range of 1.25±0.05 μm. A lens type exposure device with a resolution of about 3 μm is used for this embodiment.

Furthermore, as shown in FIG. 42, the intervals L1 of the mask pattern 400 of the boundary portion E is in the range of 1.5 to 2.5 μm, and wider than L2, more preferably 0.1 to 0.25 μm wider. Of course, as shown in drawings, other portions except for the boundary portion E may have a width of L2 in order to form a photoresist pattern having a uniform thickness by partially increasing the transmittance of light.

Even though the first to the third embodiments of the present invention are structures for a panel having pixel electrodes and no common electrodes, it can be applied to a structure that has pixel electrodes and common electrodes on the same panel. In this case, the common electrode may be formed along with the gate wire, and the pixel electrode may be formed along the data wire.

Such a thin film transistor panel may be manufactured in many other ways and involve many other alternative structures.

The present invention simplifies the manufacturing process of a thin film transistor panel for a liquid crystal display and protects the gate pads and the data pads at the same time. Furthermore, the quality of the thin film transistor is improved by removing a semiconductor pattern with a sharp bend at a channel portion, by forming the channel portion having a gentle bend, or by increasing the light transmittance at the boundary region of the channel portion while forming the semiconductor pattern of the channel portion.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A method for manufacturing a thin film transistor array panel, comprising the steps of:

forming a gate wire including a gate line and a gate electrode connected to the gate line on an insulating substrate;

forming a gate insulating layer covering the gate wire;

forming a semiconductor pattern on the gate insulating layer;

forming an ohmic contact layer pattern on the semiconductor pattern;

forming a data wire including a source electrode and a drain electrode that are made of the same layer on the ohmic contact layer and separated from each other, and a data line connected to the source electrode; and forming a passivation layer covering the data wire, wherein the source electrode and the drain electrode are separated by a photolithography process using a photoresist pattern, and the photoresist pattern has a first portion having a first thickness and located at least between the source electrode and the drain electrode, a second portion having a second thickness thicker than the first thickness, and a third portion having a third thickness thinner than the first thickness.

2. The method of claim 1, further comprising a step of forming a pixel electrode connected to the drain electrode.

3. The method of claim 2, wherein the thin film transistor array panel is used in a liquid crystal display.

4. The method of claim 1, wherein the third thickness is substantially zero.

5. The method of claim 1, wherein a mask used for forming the photoresist pattern has a first, a second, and a third part, the transmittance level of the third part is higher than the first and the second parts, the transmittance level of the first part is higher than the second part, the photoresist pattern is made of positive photoresist, and the mask is aligned such that the first, the second, and the third parts respectively face the first, the second, and the third portions of the photoresist pattern in an exposing step.

6. The method of claim 5, wherein the first part partially transmits light, the second part is substantially opaque, and the third part is substantially transparent.

7. The method of claim 5, wherein the mask further comprises a fourth part located between the first part and the third part and having a transmittance value between the transmittance value of the first part and the transmittance value of the third part.

8. The method of claim 7, wherein the first part and the fourth part of the mask include a partially transparent layer.

9. The method of claim 8, wherein the widths or the lengths of the partially transparent layers of the first part and the fourth part are different from each other.

10. The method of claim 7, wherein the first part and the fourth part of the mask include a plurality of slit patterns smaller than the resolution of the exposure device used in the photolithography process.

11. The method of claim 10, wherein the widths of the slit patterns of the fourth part is equal to or less than that of the slit patterns of the first part, and the interval between the slit patterns of the fourth part is equal to or larger than that between the slit patterns of the first part.

12. The method of claim 7, wherein the interval of the fourth part is wider than that of the first part.

13. The method of claim 7, wherein the first part and the fourth part are patterned to have slits, wherein the interval of the slits in the first part is smaller than that of the fourth part.

14. The method of claim 7, wherein the first part and the fourth part include a slit pattern having a bar shape.

15. The method of claim 7, wherein the first part and the fourth part include a fifth part having an interval wider than that of the remaining portion of the first part and the fourth part.

16. The method of claim 5, the first part of the mask has one shape selected from a group of shapes comprising a line, a square, an open-ring or an angled portion.

17. The method of claim 1, wherein the first portion is formed by reflow.

18. The method of claim 1, wherein the thickness of the first portion is less than a half of the thickness of the second portion.

19. The method of claim 18, wherein the thickness of the second portion is 1 $\mu$m to 2 $\mu$m.

20. The method of claim 19, wherein the thickness of the first portion is less than 6,000 Å.

21. The method of claim 1, wherein the data wire, the ohmic contact layer pattern, and the semiconductor pattern are formed in one photolithography process.

22. The method of claim 21, wherein the steps of forming the gate insulating layer, the semiconductor pattern, the ohmic contact layer pattern, and the data wire comprise:

depositing the gate insulating layer, a semiconductor layer, an ohmic contact layer, and a conductor layer:

coating a photoresist layer on the conductor layer;

exposing the photoresist layer to light through a mask;

forming the photoresist pattern such that the second portion lies on the data wire by developing the photoresist layer;

forming the data wire, the ohmic contact layer pattern, and the semiconductor pattern respectively made of the conductor layer, the ohmic contact layer and the semiconductor layer by removing a portion of the conductor layer under the third portion, the semiconductor layer and the ohmic contact layer thereunder, the first portion, the conductor layer and the ohmic contact layer under the first portion, and a partial thickness of the second portion; and removing the photoresist pattern.

23. The method of claim 21, wherein the step of forming the data wire, the ohmic contact layer pattern and the semiconductor pattern comprises;

removing the portion of the conductor layer under the third portion by dry etching or wet etching to expose the ohmic contact layer;

dry etching the ohmic contact layer under the third portion, the semiconductor layer thereunder and the first portion to obtain the completed semiconductor pattern along with exposing the gate insulating layer under the third portion and the conductor layer under the first portion; and removing the conductor layer under the first portion and the ohmic contact layer thereunder to obtain the completed data wire and the completed ohmic contact layer pattern.

24. The method of claim 21, further comprising the step of etching the gate insulating layer under the third portion in the step of forming the data wire, the ohmic contact layer pattern and the semiconductor pattern.

25. The method of claim 1, wherein the portion between the source electrode and the drain electrode has one shape selected from a group of shapes comprising a linear-shape, a semicircular-shape having a gentle curve and a hook-shape having an angled corner portion.

26. The method of claim 25, wherein the conductor layer of the angled corner portion, the semiconductor layer and the ohmic contact layer thereunder are removed with the third portion.

27. The method of claim 1, wherein the gate wire further includes a gate pad which is connected to and receives a signal from an external circuit, and the data wire further includes a data pad which is connected to and receives a signal from an external circuit, and the passivation layer pattern and the gate insulating layer have a first contact hole and a second contact hole respectively exposing the gate pad and the data pad, and wherein the method further comprises the step of:

forming a redundant gate pad and a redundant data pad that are made of the same layer as the pixel electrode and are respectively connected to the gate pad and the data pad through the first contact hole and the second contact hole.

28. The method of claim 1, wherein the passivation layer pattern is made of the photoresist pattern.

29. The method of claim 28, wherein the gate wire further includes a gate pad that is connected to and receives a signal from an external circuit and the data wire further includes a data pad that is connected to and receives a signal from an external circuit, and wherein the steps of forming the gate insulating layer, the semiconductor pattern, the ohmic contact layer pattern, the data wire, the passivation layer pattern and the pixel electrode further comprises:

depositing the gate insulating layer, a semiconductor layer, and an ohmic contact layer;

forming the data wire, a conductive bridge connecting the drain electrode to the source electrode, an ohmic contact bridge under the conductive bridge and the semiconductor pattern by patterning the conductor layer, the ohmic contact layer, and the semiconductor layer respectively;

coating a photoresist layer;

exposing the photoresist layer to light through a mask;

forming a photoresist pattern such that third portion is located on the gate pad, the data pad, and the drain electrode, and the second portion is located on the conductive bridge by developing the photoresist layer;

exposing the gate pad by removing the gate insulating layer on the gate pad;

forming the pixel electrode, a redundant gate pad and a redundant data pad that respectively cover the drain electrode, the gate pad and the data pad on the photoresist pattern;

removing the first portion to expose the conductive bridge; and removing the conductive bridge and the ohmic contact bridge to complete the data wire and the ohmic contact layer pattern.

30. The method of claim 1, wherein the gate wire further includes a gate pad that is connected to and receives a signal from an external circuit and the data wire further includes a data pad that is connected to and receives a signal from a external circuit, and wherein the steps of forming the gate insulating layer, the semiconductor pattern, the ohmic contact layer pattern, the data wire, the passivation layer pattern and the pixel electrode further comprises:

depositing the gate insulating layer, a semiconductor layer and an ohmic contact layer;

patterning the conductor layer, the ohmic contact layer and the semiconductor layer to form the data wire, a conductive bridge connecting the drain electrode to the source electrode, an ohmic contact bridge under the conductive bridge and the semiconductor pattern;

forming an insulating layer for the passivation layer;

coating a photoresist layer on the insulation layer;

exposing the photoresist layer to light through a mask;

developing the photoresist layer to form a photoresist pattern such that the third portion is located on the gate pad, the data pad, and the drain electrode, and the second portion is located on the conductive bridge;

removing the insulating layer and the gate insulating layer on the gate pad along with the first portion and the insulating layer thereunder to expose the gate pad and the conductive bridge along with forming the passivation layer pattern;

removing the photoresist pattern;

forming the pixel electrode, a redundant gate pad and a redundant data pad that respectively cover the drain electrode, the gate pad and the data pad on the passivation pattern; and removing the conductive bridge and the ohmic contact bridge to obtain the completed data wire and the completed ohmic contact layer pattern.

* * * * *